(12) United States Patent
Harada et al.

(10) Patent No.: US 9,029,842 B2
(45) Date of Patent: May 12, 2015

(54) ORGANIC ELECTROLUMINESCENCE ELEMENT AND METHOD OF MANUFACTURING THEREOF

(71) Applicant: Panasonic Corporation, Osaka (JP)

(72) Inventors: Kenji Harada, Hyogo (JP); Seiji Nishiyama, Osaka (JP); Takahiro Komatsu, Osaka (JP); Takayuki Takeuchi, Hyogo (JP); Shinya Fujimura, Osaka (JP); Satoru Ohuchi, Osaka (JP); Hirofumi Fujita, Osaka (JP); Yoshiaki Tsukamoto, Osaka (JP)

(73) Assignee: Joled Inc., Tokyo (JP)

( * ) Notice: Subject to any disclaimer, the term of this patent is extended or adjusted under 35 U.S.C. 154(b) by 0 days.

(21) Appl. No.: 13/742,600

(22) Filed: Jan. 16, 2013

(65) Prior Publication Data

US 2013/0126848 A1     May 23, 2013

Related U.S. Application Data

(63) Continuation of application No. PCT/JP2010/004992, filed on Aug. 6, 2010.

(51) Int. Cl.
    *H01L 51/50*      (2006.01)
    *H01L 51/56*      (2006.01)
    *H01L 27/32*      (2006.01)

(52) U.S. Cl.
CPC .............. *H01L 51/50* (2013.01); *H01L 27/3246* (2013.01); *H01L 51/5088* (2013.01); *H01L 2251/5369* (2013.01); *H01L 51/56* (2013.01)

(58) Field of Classification Search
CPC ............ H01L 51/0036; H01L 51/0545; H01L 51/5088
USPC .............................................. 257/40; 438/22
See application file for complete search history.

(56) References Cited

U.S. PATENT DOCUMENTS 5,294,869 A    3/1994   Tang et al.
5,443,922 A    8/1995   Nishizaki et al.
(Continued)

FOREIGN PATENT DOCUMENTS

CN       1426894       7/2003
EP        2175504       4/2010
(Continued)

OTHER PUBLICATIONS

Meyer et al., Charge generation layers comprising transition metal-oxide/organic interfaces: Electronic structure and charge generation mechanism, May 10, 2010, Applied Physics Lettters, 96, pp. 1-3.*
(Continued)

*Primary Examiner* — Matthew W Such
*Assistant Examiner* — Warren H Kilpatrick
(74) *Attorney, Agent, or Firm* — Greenblum & Bernstein, P.L.C.

(57) ABSTRACT

An organic light-emitting element comprising: an anode; a cathode; banks; a functional layer between the anode and the cathode; and a hole injection layer between the anode and the functional layer. The functional layer includes at least a light-emitting sublayer defined by the banks and that contains an organic material. The hole injection layer comprises tungsten oxide and includes a crystal of the tungsten oxide, whose particle diameter is on an order of nanometers. Tungsten atoms constituting the tungsten oxide include both tungsten atoms with a valence of six and tungsten atoms with a valence less than six. The hole injection layer has a surface facing the functional layer, and a portion of the surface overlapping with the light-emitting sublayer is located closer to the anode than other portions, thereby forming a recessed structure having a recessed portion whose inner surface is in contact with the functional layer.

29 Claims, 29 Drawing Sheets

(56) References Cited

U.S. PATENT DOCUMENTS

| | | | |
|---|---|---|---|
| 5,688,551 A | 11/1997 | Littman et al. | |
| 6,132,280 A | 10/2000 | Tanabe et al. | |
| 6,284,393 B1 | 9/2001 | Hosokawa et al. | |
| 6,309,801 B1 | 10/2001 | Meijer et al. | |
| 2002/0051894 A1 | 5/2002 | Yoshikawa | |
| 2002/0158835 A1 | 10/2002 | Kobayashi et al. | |
| 2003/0137242 A1 | 7/2003 | Seki | |
| 2004/0075385 A1 | 4/2004 | Tao | |
| 2004/0178414 A1 | 9/2004 | Frey et al. | |
| 2005/0064633 A1 | 3/2005 | Mikoshiba | |
| 2005/0073243 A1 | 4/2005 | Yamazaki et al. | |
| 2005/0170208 A1 | 8/2005 | Yatsunami et al. | |
| 2005/0208206 A1 | 9/2005 | Yoshikawa | |
| 2005/0266763 A1* | 12/2005 | Kimura et al. | 445/24 |
| 2006/0008931 A1 | 1/2006 | Lee et al. | |
| 2006/0181583 A1 | 8/2006 | Usuda | |
| 2006/0204788 A1 | 9/2006 | Yoshikawa | |
| 2006/0243377 A1 | 11/2006 | Matsuo et al. | |
| 2006/0284166 A1 | 12/2006 | Chua et al. | |
| 2007/0029929 A1 | 2/2007 | Nakamura et al. | |
| 2007/0092981 A1 | 4/2007 | Jung et al. | |
| 2007/0148333 A1 | 6/2007 | Morimoto | |
| 2007/0172978 A1 | 7/2007 | Chua et al. | |
| 2007/0241665 A1 | 10/2007 | Sakanoue et al. | |
| 2007/0290604 A1 | 12/2007 | Sakanoue et al. | |
| 2008/0063949 A1 | 3/2008 | Inoue | |
| 2008/0150422 A1 | 6/2008 | Ohara | |
| 2008/0231179 A1 | 9/2008 | Abe et al. | |
| 2009/0058268 A1 | 3/2009 | Yoshida et al. | |
| 2009/0115318 A1 | 5/2009 | Gregory et al. | |
| 2009/0160325 A1 | 6/2009 | Yatsunami et al. | |
| 2009/0224664 A1 | 9/2009 | Yoshida et al. | |
| 2009/0243478 A1 | 10/2009 | Shoda et al. | |
| 2009/0272999 A1 | 11/2009 | Yoshida et al. | |
| 2009/0284135 A1 | 11/2009 | Yoshida et al. | |
| 2009/0284141 A1 | 11/2009 | Sakanoue et al. | |
| 2009/0284144 A1 | 11/2009 | Fujioka et al. | |
| 2009/0284146 A1 | 11/2009 | Yoshida et al. | |
| 2010/0084672 A1 | 4/2010 | Ueno et al. | |
| 2010/0102310 A1 | 4/2010 | Komatsu et al. | |
| 2010/0181554 A1* | 7/2010 | Yoshida et al. | 257/40 |
| 2010/0213827 A1 | 8/2010 | Yoshida et al. | |
| 2010/0258833 A1 | 10/2010 | Okumoto et al. | |
| 2010/0302221 A1 | 12/2010 | Okumoto | |
| 2011/0037065 A1* | 2/2011 | Ueno et al. | 257/40 |
| 2011/0037068 A1* | 2/2011 | Yamazaki et al. | 257/43 |
| 2011/0042703 A1 | 2/2011 | Okumoto et al. | |
| 2011/0140596 A1 | 6/2011 | Yoshida et al. | |
| 2011/0180821 A1 | 7/2011 | Matsushima | |
| 2011/0198623 A1 | 8/2011 | Matsushima | |
| 2011/0198624 A1 | 8/2011 | Matsushima | |
| 2011/0204410 A1 | 8/2011 | Yada | |
| 2012/0061656 A1 | 3/2012 | Ohuchi et al. | |
| 2012/0178191 A1 | 7/2012 | Sakanoue et al. | |
| 2013/0126841 A1 | 5/2013 | Nishiyama et al. | |

FOREIGN PATENT DOCUMENTS

| | | | |
|---|---|---|---|
| JP | 05-163488 A | 6/1993 | |
| JP | 10-162959 A | 6/1998 | |
| JP | 2000-133446 A | 5/2000 | |
| JP | 2000-223276 A | 8/2000 | |
| JP | 2002-075661 A | 3/2002 | |
| JP | 2002-530881 A | 9/2002 | |
| JP | 2002-318556 A | 10/2002 | |
| JP | 3369615 B2 | 11/2002 | |
| JP | 2003-007460 A | 1/2003 | |
| JP | 2003-249375 A | 9/2003 | |
| JP | 2003-264083 A | 9/2003 | |
| JP | 2004-139746 A | 5/2004 | |
| JP | 2004-228355 A | 8/2004 | |
| JP | 2004-234901 A | 8/2004 | |
| JP | 2004-527093 A | 9/2004 | |
| JP | 2004-363170 A | 12/2004 | |
| JP | 2005-012173 A | 1/2005 | |
| JP | 2005-197189 A | 7/2005 | |
| JP | 2005-203339 A | 7/2005 | |
| JP | 2005-203340 A | 7/2005 | |
| JP | 2005-267926 A | 9/2005 | |
| JP | 2005-268099 A | 9/2005 | |
| JP | 2005-331665 A | 12/2005 | |
| JP | 2006-024573 A | 1/2006 | |
| JP | 2006-114928 A | 4/2006 | |
| JP | 3789991 B2 | 4/2006 | |
| JP | 2006-185869 A | 7/2006 | |
| JP | 2006-253443 A | 9/2006 | |
| JP | 2006-294261 A | 10/2006 | |
| JP | 2006-344459 A | 12/2006 | |
| JP | 2007-073499 A | 3/2007 | |
| JP | 2007-095606 A | 4/2007 | |
| JP | 2007-214066 A | 8/2007 | |
| JP | 2007-527542 A | 9/2007 | |
| JP | 2007-287353 A | 11/2007 | |
| JP | 2007-288071 A | 11/2007 | |
| JP | 2007-288074 A | 11/2007 | |
| JP | 2008-041747 A | 2/2008 | |
| JP | 2008-053556 A | 3/2008 | |
| JP | 2008-091072 A | 4/2008 | |
| JP | 2008-124268 A | 5/2008 | |
| JP | 2008-140724 A | 6/2008 | |
| JP | 2008-177557 A | 7/2008 | |
| JP | 2008-241238 A | 10/2008 | |
| JP | 2008-270731 A | 11/2008 | |
| JP | 2009-004347 A | 1/2009 | |
| JP | 2009-044103 A | 2/2009 | |
| JP | 2009-048960 A | 3/2009 | |
| JP | 2009-054582 A | 3/2009 | |
| JP | 2009-058897 A | 3/2009 | |
| JP | 2009-218156 A | 9/2009 | |
| JP | 2009-239180 A | 10/2009 | |
| JP | 2009-260306 A | 11/2009 | |
| JP | 2009-277590 A | 11/2009 | |
| JP | 2009-277788 A | 11/2009 | |
| JP | 2010-010670 A | 1/2010 | |
| JP | 2010-021138 A | 1/2010 | |
| JP | 2010-021162 A | 1/2010 | |
| JP | 2010-033972 A | 2/2010 | |
| JP | 2010-050107 A | 3/2010 | |
| JP | 2010-073700 A | 4/2010 | |
| JP | 2010-103374 A | 5/2010 | |
| JP | 2010-161070 A | 7/2010 | |
| JP | 2010-161185 A | 7/2010 | |
| JP | 2011-040167 A | 2/2011 | |
| JP | 2011-044445 | 3/2011 | |
| WO | 2004/036663 | 4/2004 | |
| WO | 2007/037358 | 4/2007 | |
| WO | 2008/120714 A1 | 10/2008 | |
| WO | 2008/149498 A1 | 12/2008 | |
| WO | 2008/149499 A1 | 12/2008 | |
| WO | WO 2009/107323 * | 3/2009 | 257/40 |
| WO | WO 2009/133903 * | 5/2009 | 257/40 |
| WO | 2009/107323 | 9/2009 | |
| WO | 2010/032443 A1 | 3/2010 | |
| WO | 2010/032444 A1 | 3/2010 | |
| WO | 2010/058716 A1 | 5/2010 | |
| WO | 2010/070798 A1 | 6/2010 | |
| WO | 2010/092795 A1 | 8/2010 | |
| WO | 2010/092796 A1 | 8/2010 | |
| WO | 2010/092797 A1 | 8/2010 | |
| WO | 2011/021343 A1 | 2/2011 | |
| WO | 2012/017495 A1 | 2/2012 | |
| WO | 2012/017502 A1 | 2/2012 | |
| WO | 2012/017503 A1 | 2/2012 | |

OTHER PUBLICATIONS

Ramana et al., Electron microscopy investion of structural transformation in tungsten oxide (WO3) thin films, Jul. 6, 2005, Physica Status Solidi (a) 202, No. 10, pp. R108-R110.*

Horsley et al., Structure of Surface Tungsten Oxide Species in the WO3/Al2O3 Supported Oxide System from X-Ray Aborption Nearedge Spectroscopy and Raman Spectroscopy, 1987, Journal of Physical Chemistry, 91, pp. 4014-4020.*

(56) References Cited

OTHER PUBLICATIONS

United States Office Action in U.S. Appl. No. 13/205,778, dated Nov. 13, 2013.

Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).

Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.

Jingze Li et al., "Enhanced performance of organic light emitting device by insertion of conducting/insulating WO3 anodic buffer layer", Syntetic Metals 151, pp. 141-146 (2005).

Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.

Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.

Min Jung Son et al., "Interface electronic structures of organic light-emitting diodes with WO3 interlayer: A study by photoelectron spectroscopy", Organic Electronics 10, pp. 637-642 (2009).

Kaname Kanai et al., "Electronic structure of anode interface with molybdenum oxide buffer layer", Organic Electronics 11, pp. 188-194 (2010).

F. Bussolotti et al, "Surface electronic properties of polycrystalline WO3 thin films: a study by core level and valence band photoemission", Surface Science 538, pp. 113-123 (2003).

Qin-Ye Bao et al., "Interfacial electronic structures of WO3-based intermediate connectors in tandem organic light-emitting diodes", Organic Electronics 11, pp. 1578-1583 (2010).

Th. Kugler et al., "Polymer band alignment at the interface with indium tin oxide: consequences for light emitting devices", Chemical Physics Letters 310, pp. 391-396 (1999).

I. N. Yakovkin et al., "Driving force for the WO3(001) surface relaxation", Surface Science 601, pp. 1481-1488 (2007).

J. B. Pedley et al., "Thermochemical Data for Gaseous Monoxides", Journal of Physical and Chemical Reference Data. vol. 12, No. 4, pp. 967-1032 (1983).

M. Stolze et al., "Nature of substoichiometry in reactively DC-sputtered tungsten oxide thin films and its effect on the maximum obtainable colouration by gases", Thin Solid Films 409, pp. 254-264 (2002).

V. Bulovic et al., "Transparent light-emitting devices", Nature, vol. 380, p. 29 (1996).

U.S. Appl. No. 13/205,778 to Kenji Harada et al., filed Aug. 9, 2011.
U.S. Appl. No. 13/736,419 to Shinya Fujimura, filed Jan. 8, 2013.
U.S. Appl. No. 13/740,348 to Seiji Nishiyama et al., filed Jan. 14, 2013.
U.S. Appl. No. 13/746,485 to Kenji Harada et al., filed Jan. 22, 2013.
U.S. Appl. No. 13/742,575 to Kenji Harada et al., filed Jan. 16, 2013.
U.S. Appl. No. 13/721,202 to Kenji Harada et al., filed Dec. 20, 2012.
U.S. Appl. No. 13/742,584 to Kenji Harada et al., filed Jan. 16, 2013.
U.S. Appl. No. 13/660,291 to Takahiro Komatsu et al., filed Oct. 25, 2011.

Extended European Search Report (EESR) in European Patent Application No. 10741077.1, dated Feb. 11, 2013.
International Search Report in PCT/JP2010/000783, dated Apr. 6, 2010.
International Search Report in PCT/JP2010/004833, dated Oct. 12, 2010.
International Search Report in PCT/JP2010/004985, dated Nov. 16, 2010.
International Search Report in PCT/JP2010/004993, dated Sep. 7, 2010.
International Search Report in PCT/JP2010/004954, dated Sep. 7, 2010.
International Search Report in PCT/JP2010/004992, dated Nov. 16, 2010.
International Search Report in PCT/JP2010/004956, dated Sep. 7, 2010.
International Search Report in PCT/JP2010/004991, dated Nov. 16, 2010.
International Search Report in PCT/JP2012/000963, dated May 15, 2012.

United States Office Action in U.S. Appl. No. 13/742,575, dated Mar. 14, 2014.
Elam et al., Nucleation and growth during tungsten atomic layer deposition on SiO2 surfaces, Thin Solid Films, 386, pp. 41-52 (2001).
United States Office Action in U.S. Appl. No. 13/742,584, dated Apr. 14, 2014.
United States Office Action in U.S. Appl. No. 13/746,485, dated Apr. 25, 2014.
United States Office Action in U.S. Appl. No. 13/740,348, dated Apr. 29, 2014.
China Office Action from State Intellectual Property Office (SIPO) in Chinese Patent Application No. 201080007063.X, dated Mar. 18, 2014, together with an English language Search Report.
United States Office Action in U.S. Appl. No. 13/205,778, dated Jun. 16, 2014.
China Office Action from State Intellectual Property Office (SIPO) in Chinese Patent Application No. 201080007063.X, dated Jul. 25, 2013, together with a partial English language translation.
European Office Action in European Patent Application No. 10741077.1, dated Dec. 2, 2013.
United States Office Action in U.S. Appl. No. 13/742,575, dated Jul. 17, 2014.
Tungsten Trioxide, Wikipedia, The Free Encyclopedia, available at http://en.wikipedia.org/wiki/Tungsten(VI)_oxide, accessed Jan. 10, 2014.
Tungsten Oxide, McGraw-Hill Dictionary of Scientific and Technical Terms, McGraw-Hill Book Company, Fourth Edition, p. 1979, left column, date stamped Feb. 28, 1989.
Tungsten Oxide, Iwanami Rikagaku Jiten, Iwanami Shoten, Publishers, Fifth Edition, p. 533, left column, line 42 to right column, line 19, dated Feb. 20, 1998, together with an English language translation thereof.

\* cited by examiner

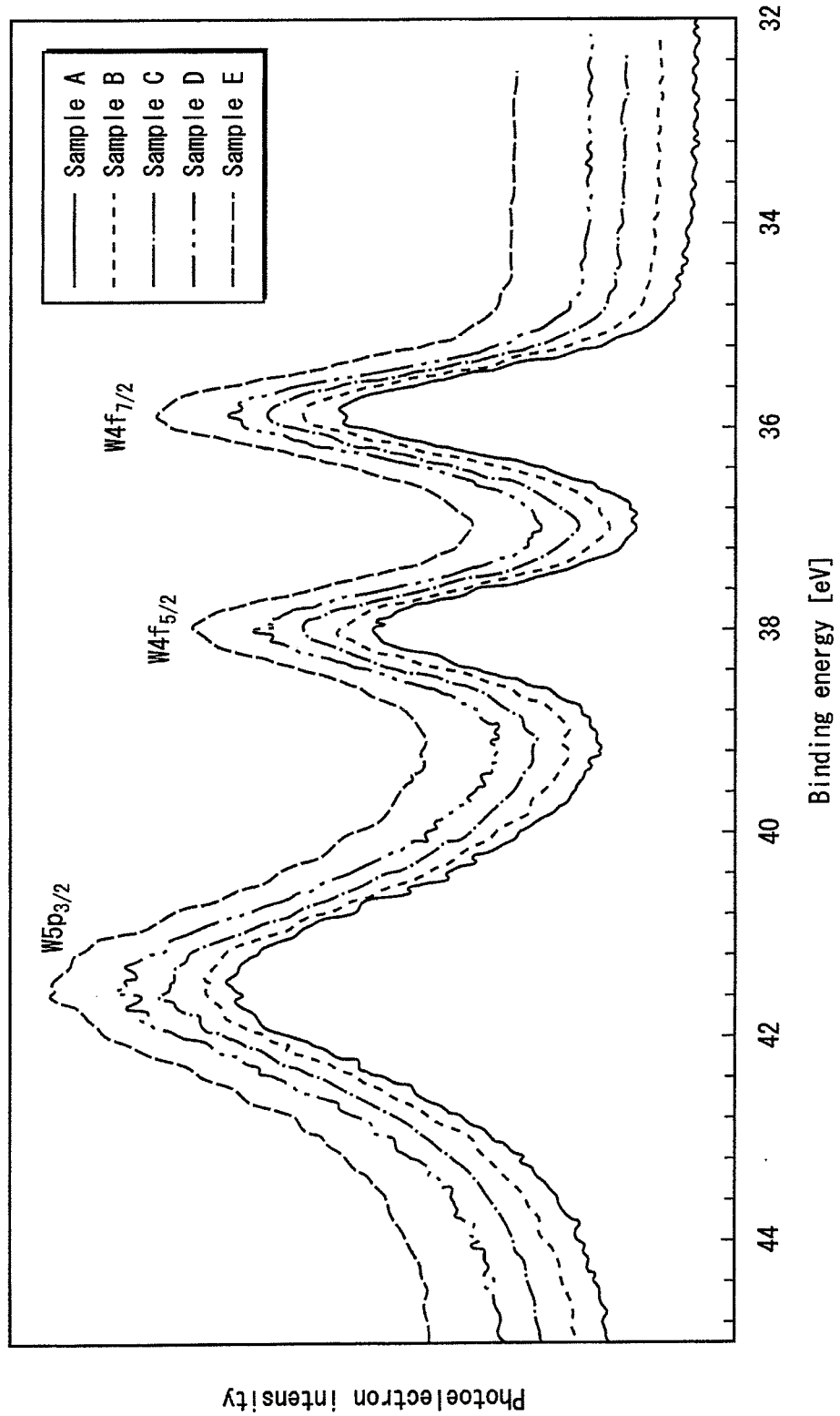

Sample A

Sample E

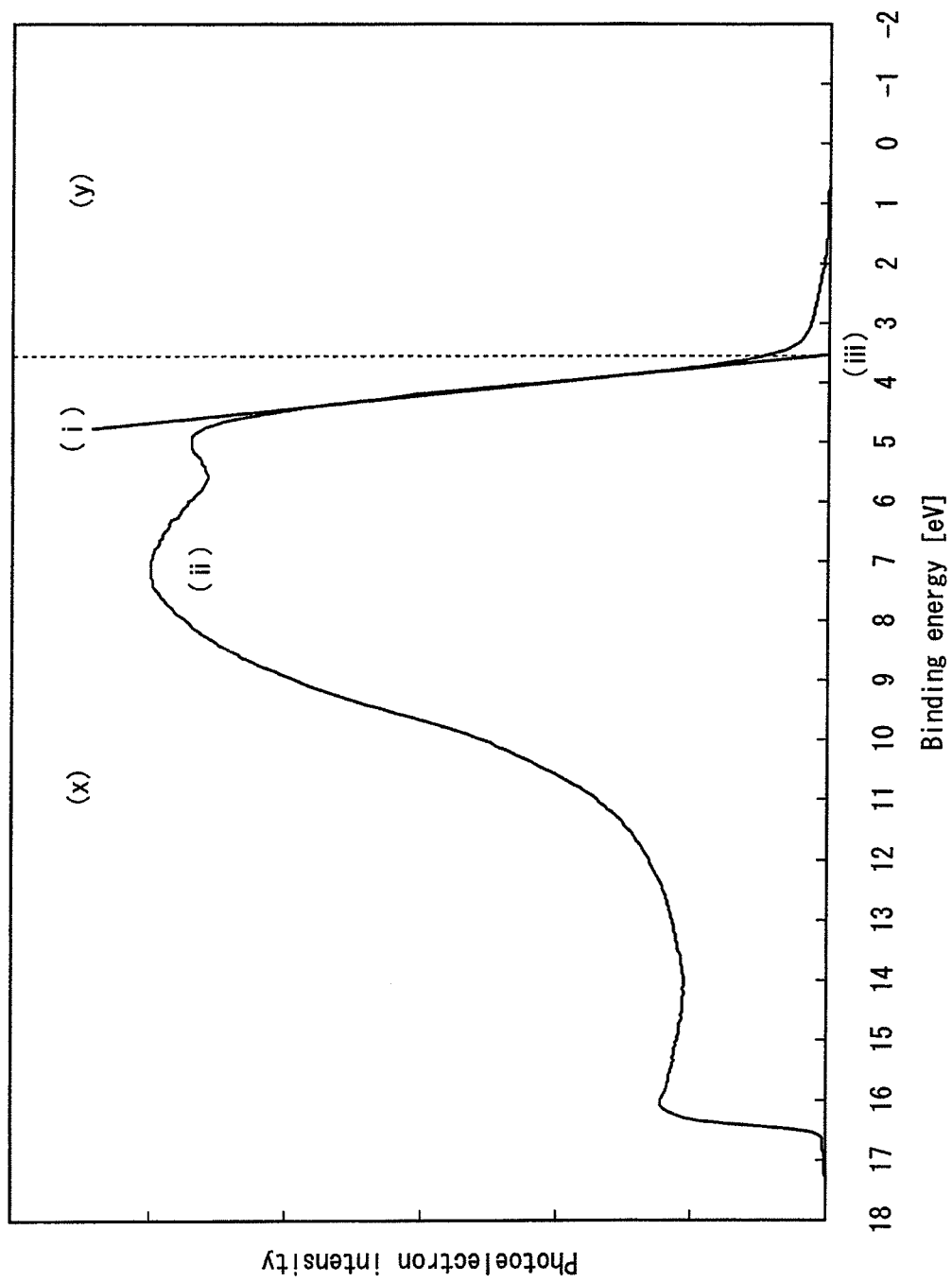

FIG. 12A
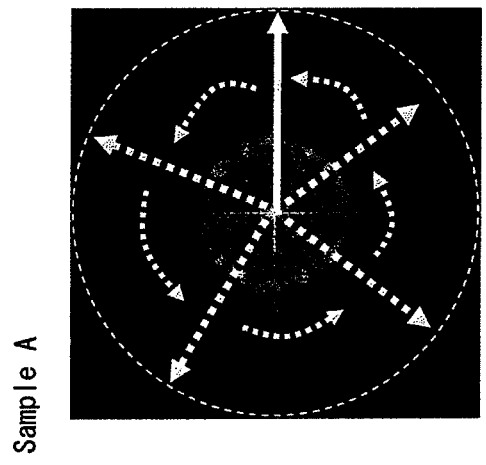
Sample A
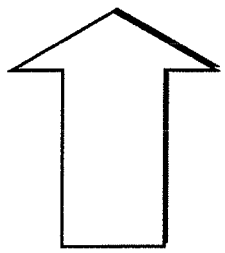
FIG. 12B
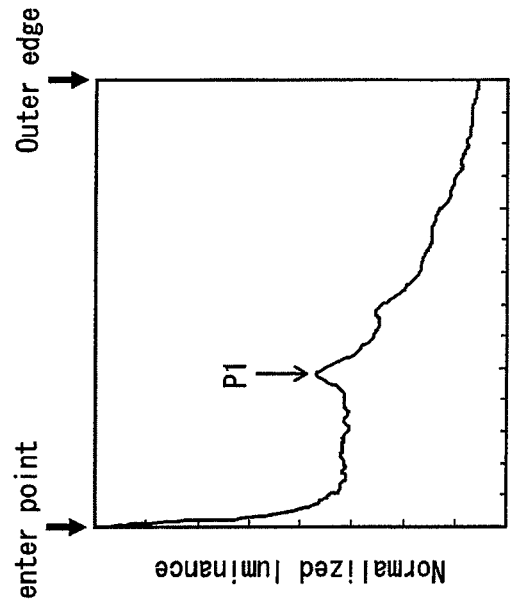

FIG. 13
Sample A
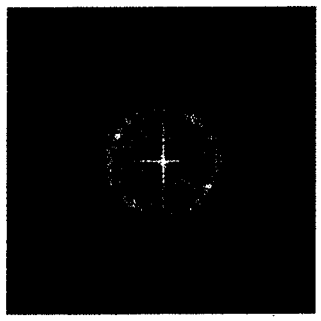 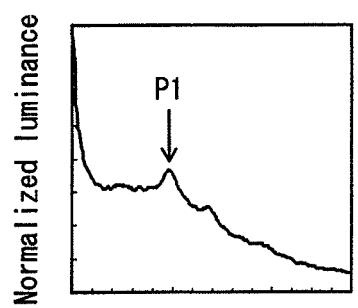
Sample B
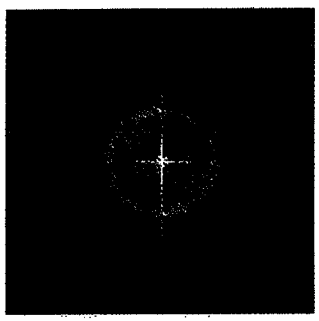 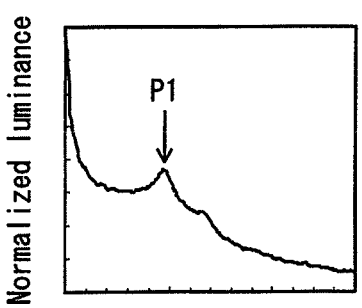
Sample C
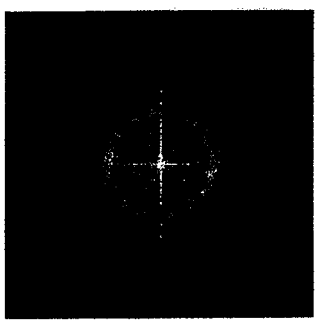 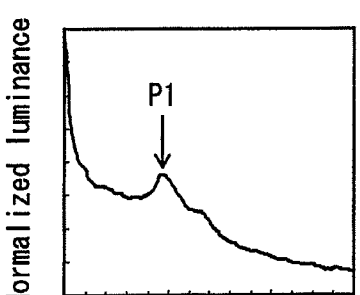

FIG. 14
Sample D
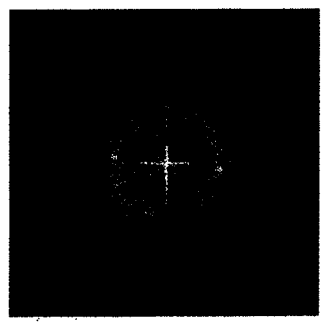 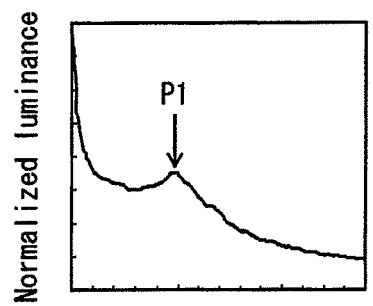
Sample E
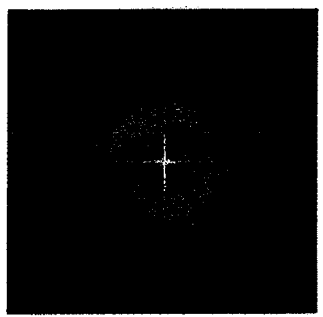 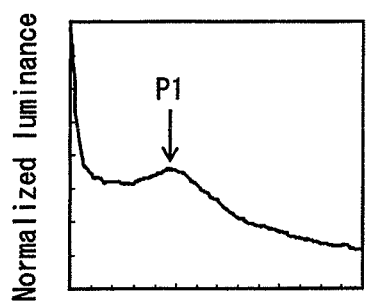

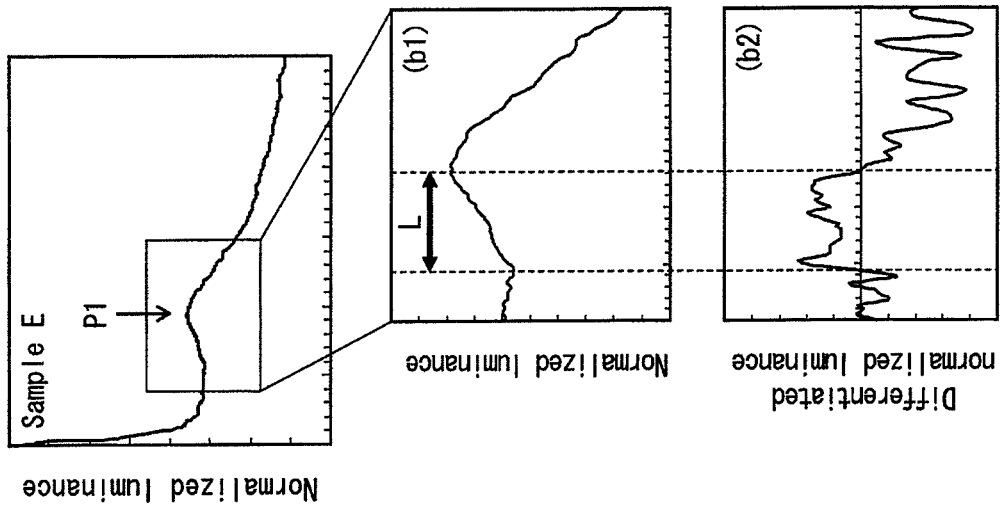
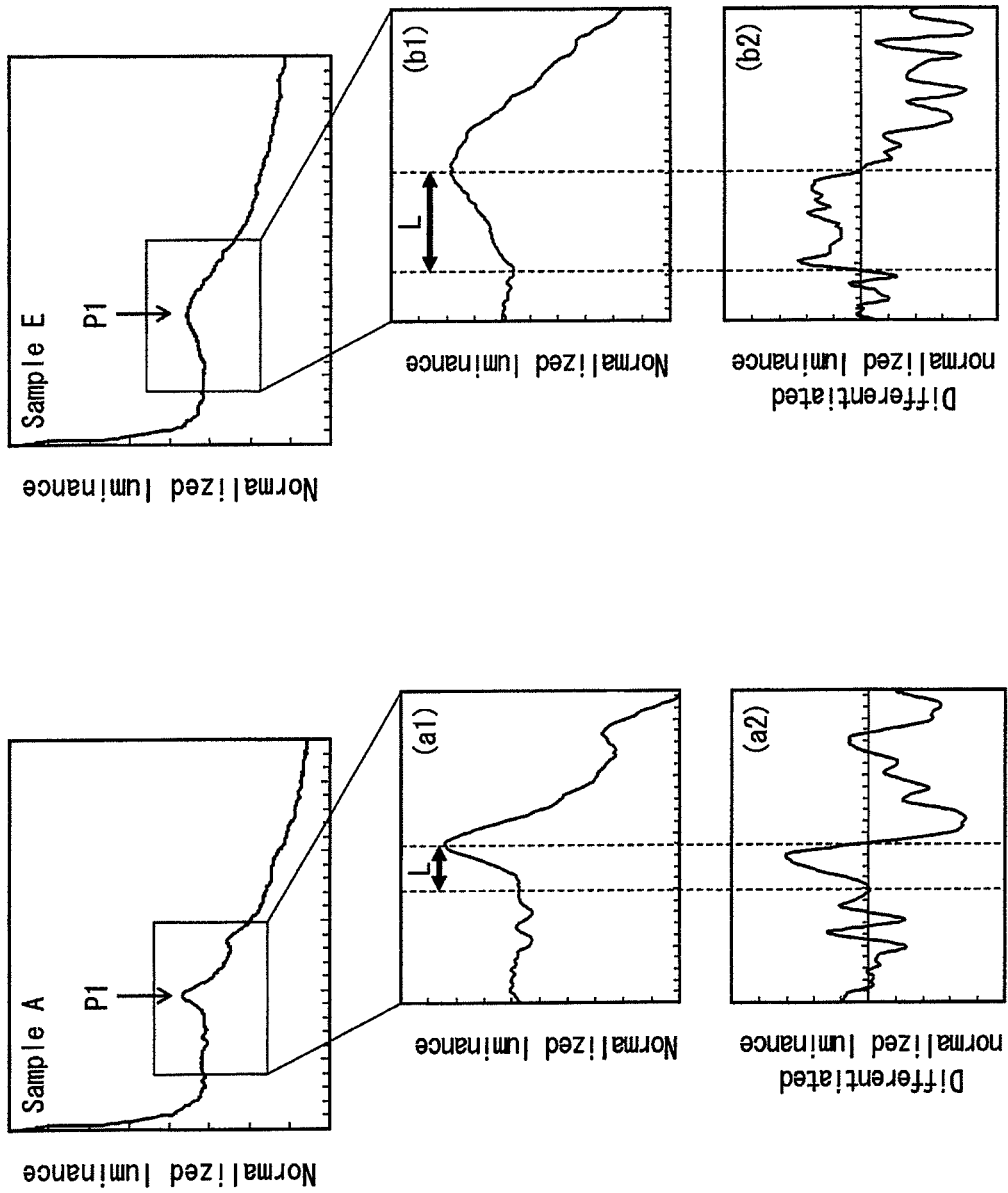
FIG. 15B
FIG. 15A

Hole injection layer

ITO layer

13

Hole injection layer

ITO layer 16
15

FIG. 27E
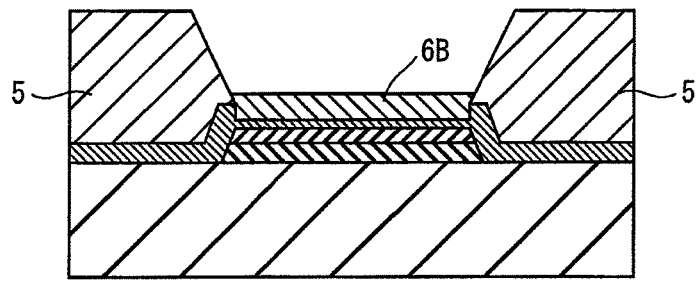
FIG. 27F
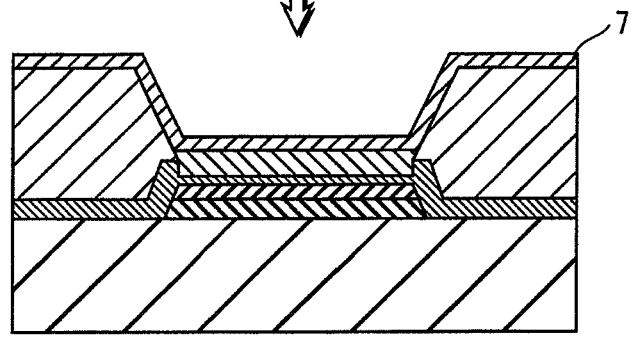
FIG. 27G
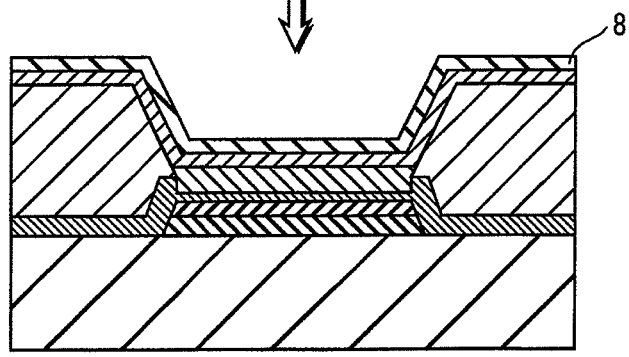
FIG. 27H
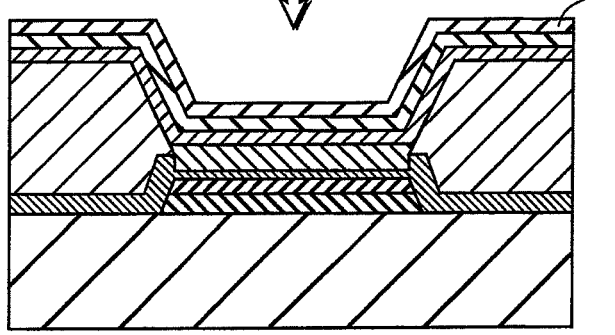

FIG. 29A
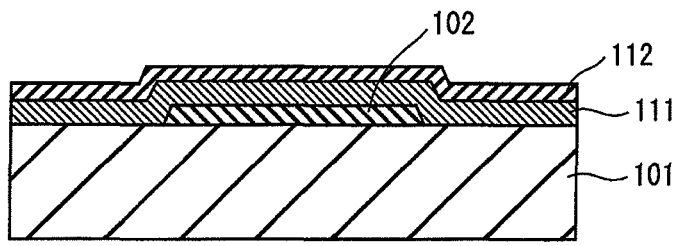
FIG. 29B
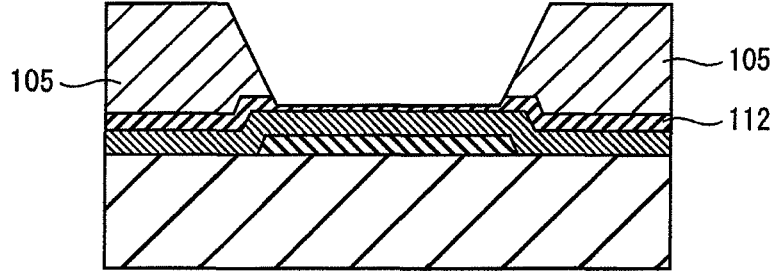
FIG. 29C
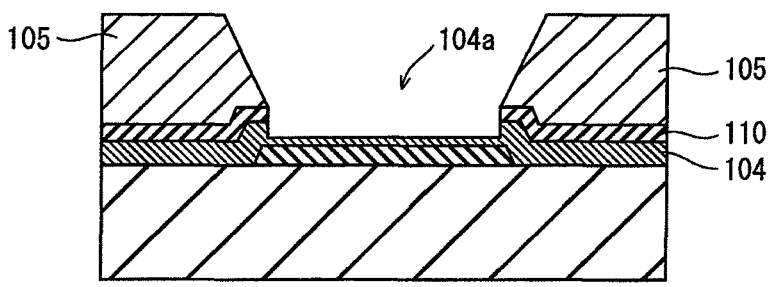
FIG. 29D
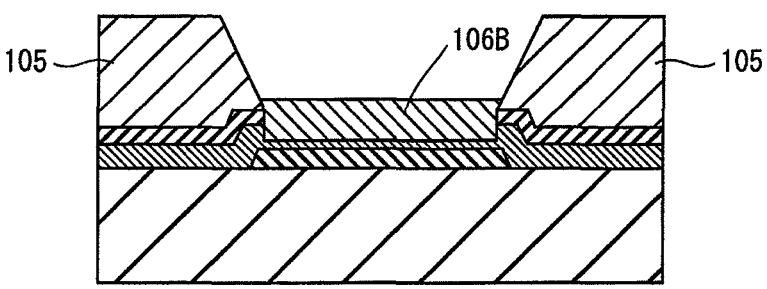

FIG. 31A
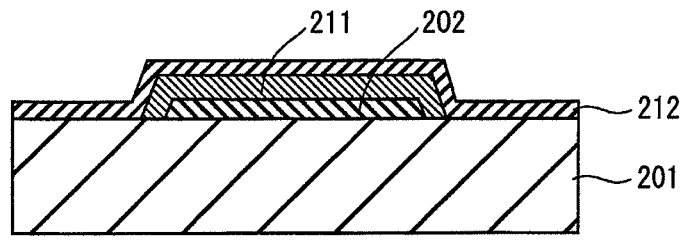
FIG. 31B
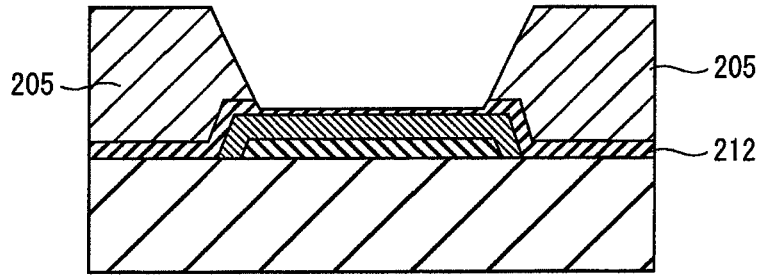
FIG. 31C
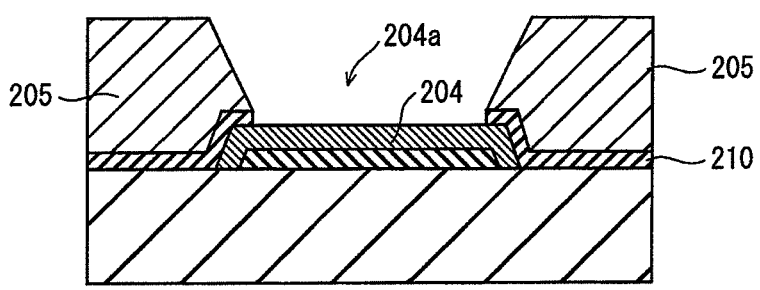
FIG. 31D
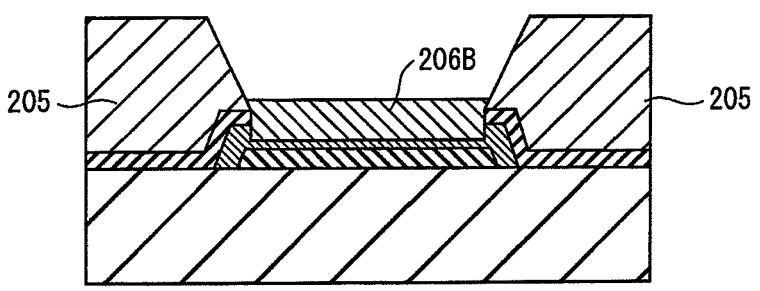

ORGANIC ELECTROLUMINESCENCE ELEMENT AND METHOD OF MANUFACTURING THEREOF

CROSS REFERENCE TO RELATED APPLICATION

This is a continuation application of PCT Application No. PCT/JP2010/004992 filed Aug. 6, 2010, designating the United States of America, the disclosure of which, including the specification, drawings and claims, is incorporated herein by reference in its entirety.

TECHNICAL FIELD

The present disclosure relates to an organic electric-field light-emitting element (hereinafter referred to as an "organic EL element") that is an electric light-emitting element and a manufacturing method of an organic EL element, and in particular to technology for improving hole conduction efficiency in a hole injection layer included in an organic EL element.

DESCRIPTION OF THE RELATED ART

In recent years, progress is being made in research and development of diverse functional elements which involve the use of an organic semiconductor. One typical example of a functional element is an organic EL element. An organic EL element is a current-driven light-emitting element, and commonly has a pair of electrodes, namely an anode and a cathode, and a functional layer layered between the pair of electrodes. The functional layer includes a light-emitting layer composed of an organic material. Upon application of voltage across the pair of electrodes, holes injected from the anode to the functional layer recombine with electrons injected from the cathode to the functional layer. The recombination causes the phenomenon of electroluminescence, which involves emission of light. Given the high visibility of organic EL elements resulting from their self-luminescence, as well as their excellent vibration resistance resulting from the solid-state structure thereof, more attention is now being given to the application of organic EL elements as a light-emitting element for various display devices or as a light source.

To cause an organic EL element to emit light at high intensity, efficient injection of carriers (i.e., holes and electrons) from the electrodes to the functional layer is beneficial. Generally, provision of an injection layer in between each of the electrodes and the functional layer is effective in realizing efficient injection of carriers to the functional layer, since an injection layer has the function of lowering the energy barrier during injection. An injection layer disposed between the functional layer and the anode is a hole-injection layer composed of an organic material, such as copper phthalocyanine or PEDOT (conductive polymer), or of a metal oxide, such as molybdenum oxide or tungsten oxide. An electron injection layer disposed between the functional layer and the cathode is composed of an organic material, such as a metal complex or oxadiazole, or of a metal, such as barium.

Among such injection layers, an improvement in hole conduction efficiency as well as longevity of the organic EL element has been reported for an organic EL element using a metal oxide film composed of a metal oxide, such as molybdenum oxide or tungsten oxide, as the hole injection layer (see Patent Literature 1, 2, and Non-Patent Literature 1).

CITATION LIST

Patent Literature

[Patent Literature 1]
Japanese Patent Application Publication No. 2005-203339
[Patent Literature 2]
Japanese Patent Application Publication No. 2007-288074

Non-Patent Literature

[Non-Patent Literature 1]
Jingze Li et al., Synthetic Metals 151, 141 (2005)
[Non-Patent Literature 2]
M. Stolze et al., Thin Solid Films 409, 254 (2002)
[Non-Patent Literature 3]
Kaname Kanai et al., Organic Electronics 11, 188 (2010)
[Non-Patent Literature 4]
I. N. Yakovkin et al., Surface Science 601, 1481 (2007)

SUMMARY

Vapor deposition or sputtering is typically used as the method for forming the above metal oxide film. Taking into consideration the heat resistance of the layers already formed on the substrate at the point of formation of the metal oxide film, the metal oxide film is typically formed at a low substrate temperature of 200° C. or lower.

Forming the metal oxide film at a low substrate temperature with the sputtering method easily leads to formation of a metal oxide film with a disorderly amorphous structure, since thermal energy produced when the film formation gas reaches the substrate is quickly absorbed by the substrate. Furthermore, the difficulty of maintaining the composition and thickness of the metal oxide film uniform when forming the film at a low substrate temperature has also been reported (Non-Patent Literature 2).

When the metal oxide film is amorphous, the locations that contribute to conduction of holes injected into the metal oxide film, such as locations corresponding to oxygen vacancies or similar structures, are isolated from each other throughout the film. Conduction of holes in the film is therefore achieved primarily by hopping conduction. During hopping conduction, holes hop between the isolated hole conduction locations. In order to use such a metal oxide film in which conduction of holes is achieved by hopping conduction, however, it is necessary to apply a high driving voltage to the organic EL element, thereby causing the problem of a decrease in hole conduction efficiency.

In view of such problems, one non-limiting and exemplary embodiment provides an organic EL element with a hole injection layer that yields excellent hole conduction efficiency.

In one general aspect, the techniques disclosed here feature an organic EL element comprising: an anode; a cathode; banks; a functional layer between the anode and the cathode, the functional layer including one or more sublayers, the one or more sublayers including a light-emitting sublayer, the light-emitting sublayer defined by the banks and containing an organic material; and a hole injection layer between the anode and the functional layer, wherein the hole injection layer comprises tungsten oxide, tungsten atoms constituting the tungsten oxide include both tungsten atoms with a valence of six and tungsten atoms with a valence less than six, the hole injection layer includes a crystal of the tungsten oxide, a particle diameter of the crystal being on an order of nanometers, the hole injection layer has a surface facing the functional layer and has a recessed structure such that a portion of the surface overlapping with the light-emitting sublayer is located closer to the anode than other portions of the surface, and the recessed structure has a recessed portion whose inner surface is in contact with the functional layer.

In the organic EL element pertaining to one aspect of the present invention, the hole injection layer comprises tungsten oxide, and tungsten atoms constituting the tungsten oxide include both tungsten atoms with a valence of six and tungsten atoms with a valence less than six. Therefore, the hole injection layer is provided with oxygen vacancies or similar structures, which serve as regions for the conduction of holes. In addition, setting the particle diameter of the tungsten oxide crystal to be on the order of nanometers allows for the formation, in the hole injection layer, of numerous crystal interfaces that include a great quantity of oxygen vacancies or similar structures. As a result, conduction paths for holes extend through the hole injection layer in the direction of thickness thereof, allowing for effective hole conduction at a low driving voltage.

Note that, when the hole injection layer is composed of tungsten oxide in which a large quantity of oxygen vacancies or similar structures exist, a problem hereinafter referred to as film thickness reduction, where the film thickness of the hole injection layer decreases during the manufacturing steps for manufacturing the organic EL element, arises. The occurrence of the film thickness reduction is problematic, giving rise to a risk of the light-emitting characteristics of the organic EL element being affected for reasons such as ununiform luminous intensity of a light-emitting portion within a region defined by banks and a shortened life-span of the organic EL element.

In view of such problems, in the organic EL element pertaining to one aspect of the present invention, the hole injection layer is formed so as to have a recessed structure such that a portion of a surface of the hole injection layer facing the functional layer is closer to the anode than other portions of the surface. In addition, in the organic EL element pertaining to one aspect of the present invention, an inner surface (an inner bottom surface and an inner side surface) of a recessed portion of the hole injection layer is in contact with the functional layer. Due to this, the wettability of the functional layer with respect to the hole injection layer is improved. As such, even when the film thickness reduction of the hole injection layer occurs, material for forming the functional layer is prevented from being applied ununiformly, and accordingly, an organic EL element having excellent characteristics is formed by patterning being performed with high precision. As a result, the risk of the light-emitting characteristics of the organic EL element being affected can be reduced preemptively by preventing problems such as ununiform luminous intensity and reduction in life-span from occurring.

These general and specific aspects may be implemented using an organic EL element, an organic EL panel, an organic light-emitting apparatus, an organic EL display apparatus, and a manufacturing method for an organic EL element.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

BRIEF DESCRIPTION OF DRAWINGS

FIG. 5 illustrates spectra belonging to $W5p_{3/2}$, $W4f_{5/2}$, and $W4f_{7/2}$, obtained by XPS measurement of a surface of a tungsten oxide layer.

FIG. 7 is a diagram illustrating UPS spectra of a surface of a tungsten oxide layer.

FIGS. 12A and 12B are diagrams illustrating creation of a plot of change in luminance from a 2D Fourier transform image shown in FIG. 11.

FIG. 13 shows Fourier transform images and plots of change in luminance for samples A, B, and C.

FIG. 14 shows Fourier transform images and plots of change in luminance for samples D and E.

FIGS. 15A and 15B are plots of change in luminance for samples A (a) and E (b), with (a1) and (b1) being enlarged diagrams of peaks in normalized luminance closest to center points in the plots of change in luminance, and (a2) and (b2) being first derivatives of the plots in (a1) and (b1).

FIGS. 27E through 27H each illustrate a step, following the steps in FIGS. 26A through 26D, in the manufacturing method of the organic EL element pertaining to embodiment 2.

FIGS. 29A through 29D each illustrate a step in a manufacturing method of the organic EL element pertaining to embodiment 3.

FIGS. 31A through 31D each illustrate a step in a manufacturing method of the organic EL element pertaining to embodiment 4.

FIG. 32 is a perspective view illustrating a display apparatus pertaining to embodiment 5 and the like.

DETAILED DESCRIPTION

Embodiments

Figure 1A:
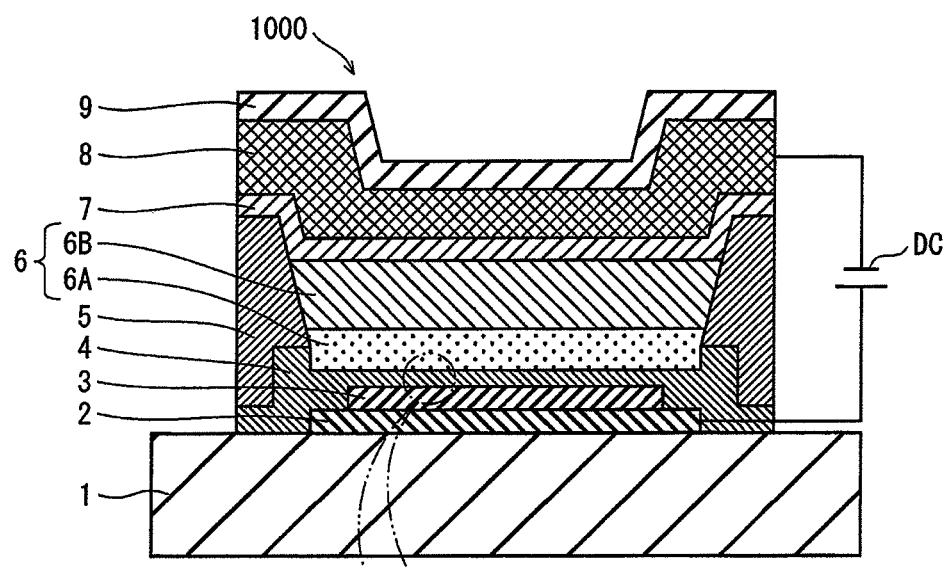
FIG. 1A is a schematic cross-sectional view illustrating a structure of an organic EL element 1000 according to embodiment 1.

One aspect of the present invention is an organic EL element comprising: an anode; a cathode; banks; a functional layer between the anode and the cathode, the functional layer including one or more sublayers, the one or more sublayers including a light-emitting sublayer, the light-emitting sublayer defined by the banks and containing an organic material; and a hole injection layer between the anode and the functional layer, wherein the hole injection layer comprises tungsten oxide, tungsten atoms constituting the tungsten oxide include both tungsten atoms with a valence of six and tungsten atoms with a valence less than six, the hole injection layer includes a crystal of the tungsten oxide, a particle diameter of the crystal being on an order of nanometers, the hole injection layer has a surface facing the functional layer and has a recessed structure such that a portion of the surface overlapping with the light-emitting sublayer is located closer to the anode than other portions of the surface, and the recessed structure has a recessed portion whose inner surface is in contact with the functional layer.

In the organic EL element pertaining to one aspect of the present invention, the hole injection layer comprises tungsten oxide, and tungsten atoms constituting the tungsten oxide include both tungsten atoms with a valence of six and tungsten atoms with a valence less than six. Therefore, the hole injection layer is provided with oxygen vacancies or similar structures, which serve as regions for the conduction of holes. In addition, setting the particle diameter of the tungsten oxide crystal to be on the order of nanometers allows for the formation, in the hole injection layer, of numerous crystal interfaces that include a great quantity of oxygen vacancies or similar structures. As a result, conduction paths for holes extend through the hole injection layer in the direction of thickness thereof, allowing for effective hole conduction at a low driving voltage. In this context, the "particle diameter on an order of nanometers" refers to a size that is approximately 3 nm to approximately 10 nm and that is smaller than the thickness of the hole injection layer.

Note that, when the hole injection layer is composed of tungsten oxide in which a large quantity of oxygen vacancies or similar structures exist, a problem hereinafter referred to as film thickness reduction, where the film thickness of the hole injection layer decreases during the manufacturing steps for manufacturing the organic EL element, arises. The occurrence of the film thickness reduction is problematic, giving rise to a risk of the light-emitting characteristics of the organic EL element being affected for reasons such as ununiform luminous intensity of a light-emitting portion within a region defined by banks and a shortened life-span of the organic EL element. In view of such problems, in the organic EL element pertaining to one aspect of the present invention, the hole injection layer is formed so as to have a recessed structure such that a portion of a surface of the hole injection layer facing the functional layer is closer to the anode than other portions of the surface. In addition, in the organic EL element pertaining to one aspect of the present invention, an inner surface (an inner bottom surface and an inner side surface) of a recessed portion of the hole injection layer is in contact with the functional layer. Due to this, the wettability of the functional layer with respect to the hole injection layer is improved. As such, even when the film thickness reduction of the hole injection layer occurs, material for forming the functional layer is prevented from being applied ununiformly, and accordingly, an organic EL element having excellent characteristics is formed by patterning being performed with high precision. As a result, the risk of the light-emitting characteristics of the organic EL element being affected can be reduced preemptively by preventing problems such as ununiform luminous intensity and reduction in life-span from occurring.

In the organic EL element, the tungsten atoms with a valence less than six may be tungsten atoms with a valence of five. In the organic EL element, a ratio $W^{5+}/W^{6+}$ of the number of the tungsten atoms with a valence of five to the number of the tungsten atoms with a valence of six may be at least 3.2%. Including tungsten atoms with a valence of five at a ratio of at least 3.2% with respect to tungsten atoms with a valence of six achieves even better hole conduction efficiency.

In the organic EL element, the ratio $W^{5+}/W^{6+}$ may be at least 3.2% and at most 7.4%. In such a case, even better hole conduction efficiency is achieved.

In the organic EL element, a hard X-ray photoelectron spectroscopy spectrum of a surface of the hole injection layer may exhibit a first peak and a second peak, the first peak corresponding to a $4f_{7/2}$ energy level of the tungsten atoms with a valence of six, and the second peak being in a region lower than the first peak in terms of binding energy, or that is, being in a relatively shallow energy level compared to the first peak. Specifically, in the organic EL element, the second peak may be in a region between 0.3 electron volts and 1.8 electron volts lower, in terms of binding energy, than the first peak. The first peak corresponds to the peak for tungsten atoms with a valence of six, whereas the second peak corresponds to the peak for tungsten atoms with a valence of five.

In the organic EL element, an area intensity of the second peak may be between 3.2% and 7.4% of an area intensity of the first peak. The ratio between the areas of the first peak and the second peak corresponds to the abundance ratio of tungsten atoms with a valence of five to tungsten atoms with a valence of six. The above range for the area intensity of the second peak therefore indicates that the ratio of the tungsten atoms with a valence of five to the tungsten atoms with a valence of six is between 3.2% and 7.4%.

In the organic EL element, the tungsten atoms with a valence less than six may cause a band structure of the hole injection layer to have an occupied energy level in a range between 1.8 electron volts and 3.6 electron volts lower than a lowest energy level of a valence band in terms of binding energy. By the hole injection layer having such an occupied energy level, the hole injection barrier between the hole injection layer and the functional layer is suppressed to a low level. This achieves even better hole injection efficiency. In this context, the "lowest energy level of a valence band in terms of binding energy" refers to the energy at a position at the upper end of the valence band from the vacuum level.

In the organic EL element, the hole injection layer may include a plurality of crystals of the tungsten oxide, each of the crystals having a particle diameter of between 3 nm and 10 nm. In the organic EL element, regular linear structures at intervals of between 1.85 angstroms and 5.55 angstroms may appear in a lattice image by transmission electron microscopy observation of the hole injection layer. In a TEM photograph of a tungsten oxide layer that includes crystals having a particle diameter of between 3 nm and 10 nm, regular linear structures appear as bright regions aligned in the same direction in portions of the TEM photograph. These regular linear structures suggest the existence of a crystal on the order of nanometers.

In the organic EL element, in a 2D Fourier transform image of the lattice image, a pattern of concentric circles centering on a center point of the 2D Fourier transform image may appear. The existence of a crystal on the order of nanometers results in the appearance of the above pattern of concentric circles.

In the organic EL element, in a plot of distance from the center point versus normalized luminance, the normalized luminance being a normalized value of the luminance of the 2D Fourier transform image at the corresponding distance, at least one peak of the normalized luminance may appear. One peak of the normalized luminance in the above plot corresponds to one of the concentric circles.

In the organic EL element, with a peak width being a difference between the distance corresponding to a position of a peak of the normalized luminance appearing closest to the center point in the plot and the distance corresponding to a position at which the peak of the normalized luminance begins to rise, the peak width may be less than 22 when a difference between the distance corresponding to the center point and the distance corresponding to the peak of the normalized luminance appearing closest to the center point is 100. The peak of the normalized luminance appearing closest to the center point corresponds to the concentric circle based on the existence of the crystal on the order of nanometers. As the number of crystals on the order of nanometers increases, the full width at half maximum of the peak of the normalized luminance decreases, i.e. the width of the normalized luminance decreases. Even better hole conduction efficiency can be achieved when the number of crystals on the order of nanometers is such that the peak width falls within a predetermined range.

In the organic EL element, the functional layer may include amine-containing material. In amine-containing organic molecules, the electron density of the HOMO is distributed centering on a lone pair of electrons of a nitrogen atom, which becomes a hole injection site. Including amine-containing material in the functional layer allows for formation of hole injection sites along the functional layer, thereby allowing holes that are conducted from the hole injection layer to be efficiently injected into the functional layer.

In the organic EL element, the functional layer may further include one of a hole transfer sublayer that transfers holes and a buffer sublayer that adjusts optical characteristics of the organic EL element and/or blocks electrons.

In the organic EL element, the banks may be liquid-repellent and the hole injection layer may be liquid-philic.

An organic EL panel pertaining to one aspect of the present invention, an organic EL light-emitting apparatus pertaining to one aspect of the present invention, and an organic EL display apparatus pertaining to one aspect of the present invention are each provided with the above organic EL element. This allows for the organic EL panel, the organic EL light-emitting apparatus, and the organic EL display apparatus that achieve the same advantageous effects as above.

One aspect of the present invention is a manufacturing method for an organic EL element, comprising: an anode preparation step of preparing an anode; a tungsten oxide layer forming step of forming a tungsten oxide layer on the anode by using a sputtering gas including argon gas and oxygen gas and by using tungsten as a sputtering target, under film forming conditions such that a total pressure of the sputtering gas is at least 2.3 Pa and at most 7.0 Pa, a partial pressure of the oxygen gas in the sputtering gas is at least 50% and at most 70%, an input power density per unit area of the sputtering target is at least 1.5 W/cm$^2$ and at most 6.0 W/cm$^2$, and a value yielded by dividing the total pressure of the sputtering gas by the input power density is larger than 0.7 Pa·cm$^2$/W; a bank forming step of forming banks above the tungsten oxide layer by forming a resist film including resist material above the tungsten oxide layer and etching the resist film with a developing solution; a hole injection layer forming step, subsequent to the bank forming step, of forming a hole injection layer by (i) cleaning, with a cleaning fluid, a surface of the tungsten oxide layer and thereby removing residuals of the resist film adhering to the surface of the tungsten oxide layer and (ii) dissolving a part of the tungsten oxide layer with the cleaning fluid, the hole injection layer formed such that a portion of an upper surface of the hole injection layer facing the functional layer is located closer to the anode than other portions of the upper surface, the portion forming a recessed portion composed of an inner bottom surface and an inner side surface that is continuous with the inner bottom surface; a functional layer forming step of forming a functional layer by depositing ink into a region of the hole injection layer defined by the banks, applying the ink with respect to the inner bottom surface and the inner side surface such that the ink is in contact with the inner bottom surface and the inner side surface, and drying the ink; and a cathode forming step of forming a cathode above the functional layer.

One aspect of the present invention is a manufacturing method for an organic EL element, comprising: an anode preparation step of preparing an anode; a tungsten oxide layer forming step of forming a tungsten oxide layer on the anode by using a sputtering gas including argon gas and oxygen gas and by using tungsten as a sputtering target, under film forming conditions such that a total pressure of the sputtering gas is at least 2.3 Pa and at most 7.0 Pa, a partial pressure of the oxygen gas in the sputtering gas is at least 50% and at most 70%, an input power density per unit area of the sputtering target is at least 1.5 W/cm$^2$ and at most 6.0 W/cm$^2$, and a value yielded by dividing the total pressure of the sputtering gas by the input power density is larger than 0.7 Pa·cm$^2$/W; a hole injection layer forming step of, while forming banks above the tungsten oxide layer by forming a resist film including resist material above the tungsten oxide layer and etching the resist film with a developing solution, forming a hole injection layer by (i) cleaning, with the developing solution, a surface of the tungsten oxide layer and thereby removing residuals of the resist film adhering to the surface of the tungsten oxide layer and (ii) dissolving a part of the tungsten oxide layer with the developing solution, the hole injection layer formed such that a portion of an upper surface of the hole injection layer facing the functional layer is located closer to the anode than other portions of the upper surface, the portion forming a recessed portion composed of an inner bottom surface and an inner side surface that is continuous with the inner bottom surface; a functional layer forming step of forming a functional layer by depositing ink into a region of the hole injection layer defined by the banks, applying the ink with respect to the inner bottom surface and the inner side surface such that the ink is in contact with the inner bottom surface and the inner side surface, and drying the ink; and a cathode forming step of forming a cathode above the functional layer.

In the manufacturing method, in the tungsten oxide layer forming step, the tungsten oxide layer may be formed such that tungsten atoms constituting the tungsten oxide layer include both tungsten atoms with a maximum valence thereof and tungsten atoms with a valence less than the maximum valence, and so as to include a tungsten oxide crystal having a particle diameter on an order of nanometers. In the manufacturing method, in the tungsten oxide layer forming step, the value yielded by dividing the total pressure of the sputtering gas by the input power density may be less than 3.2 Pa·cm$^2$/W. Performing the above steps allows for formation of an organic EL element that achieves the same advantageous effects as above.

Embodiment 1

Structure of Organic EL Element

Figure 1B:
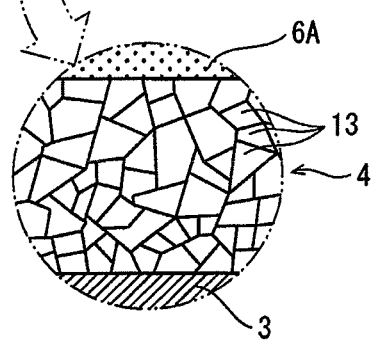
FIG. 1B is a partially expanded view centered on a hole injection layer 4.

FIG. 1A is a schematic cross-sectional view illustrating a structure of an organic EL element 1000 according to the present embodiment, and FIG. 1B is a partially expanded view centered on a hole injection layer 4.

The organic EL element 1000 is, for example, manufactured by applying a functional layer with a wet process. The hole injection layer 4 and a functional layer including a variety of layers that have predetermined functions and include organic material are layered together and placed between a pair of electrodes consisting of an anode 2 and a cathode 8.

Specifically, as illustrated in FIG. 1A, the organic EL element 1000 includes a substrate 1 having the following layered on the main side thereof in the following order: the anode 2, an ITO layer 3, the hole injection layer 4, a buffer layer 6A (one example of a layer included in the functional layer), a light-emitting layer 6B (another example of a layer included in the functional layer), an electron injection layer 7, the cathode 8, and a sealing layer 9.

(Substrate 1, Anode 2, ITO layer 3)

The substrate 1 is the base material for the organic EL element 1000 and may be formed with an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, or alumina.

While not shown in the figures, a TFT (thin film transistor) is provided on the surface of the substrate 1 for driving the organic EL element 1000, with the anode 2 layered thereabove. The anode 2 may be formed, for example, with APC (alloy of silver, palladium, and copper), ARA (alloy of silver, rubidium, and gold), MoCr (alloy of molybdenum and chromium), NiCr (alloy of nickel and chromium), etc.

The ITO (indium tin oxide) layer 3 is interposed between the anode 2 and the hole injection layer 4, and has the function of enhancing the bonding between the anode 2 and the hole injection layer 4.

(Hole Injection Layer 4)

The hole injection layer 4 is composed of a tungsten oxide layer (WOx) having a thickness of, for example, 30 nm. In the composition formula WOx denoting the composition of the tungsten oxide, x is a real number existing within a range of approximately 2<x<3. While it is desirable for the hole injection layer 4 to be formed only from tungsten oxide, the inclusion of a trace level of impurities is acceptable, provided that the amount does not exceed the amount of impurities that might normally be incorporated.

The tungsten oxide layer is formed under predetermined film forming conditions. Details on these predetermined film forming conditions are provided in the sections "Outline of Method of Manufacturing Organic EL Element 1000" and "Film Forming Conditions for Hole Injection Layer 4". By forming the tungsten oxide layer under these predetermined film forming conditions, the tungsten oxide layer includes an abundance of tungsten oxide crystals 13 as illustrated in FIG. 1B. The crystals 13 are formed so that the particle diameter of each crystal 13 is on the order of nanometers. For example, if the thickness of the hole injection layer 4 is approximately 30 nm, the particle diameter of the crystals 13 is approximately between 3 nm and 10 nm. Hereinafter, the crystals 13 whose particle diameter is on the order of nanometers are referred to as "nanocrystals 13", and a layered structure composed of nanocrystals 13 is referred to as a "nanocrystal structure". Note that in the hole injection layer 4, regions other than the regions with the nanocrystal structure include an amorphous structure.

In a hole injection layer 4 with the above nanocrystal structure, the tungsten atoms (W) constituting the tungsten oxide are distributed to include both atoms with the maximum valence possible for tungsten and atoms with a valence less than the maximum valence. Typically, the crystal structure of tungsten oxide is not uniform, but rather includes oxygen vacancies or similar structures. Within tungsten oxide having a crystal structure that does not include oxygen vacancies or similar structures, the maximum valence possible for tungsten is a valence of six. On the other hand, within tungsten oxide having a crystal structure that does include oxygen vacancies or similar structures, it is known that the valence of tungsten is a valence of five, which is lower than the maximum valence. A tungsten oxide film includes tungsten atoms with a variety of valences, including both the maximum valence and a valence lower than the maximum valence. The overall valence for the film is the average of these different valences.

It has been reported that forming oxygen vacancies or similar structures in tungsten oxide composing a hole injection layer improves the hole conduction efficiency of the hole injection layer due to an energy level that is based on oxygen vacancies or similar structures (Non-Patent Literature 3). Furthermore, it is known that oxygen vacancies or similar structures are abundant along the crystal surface, as described with reference to FIG. 9.

Therefore, distributing tungsten atoms with a valence of five and tungsten atoms with a valence of six in the tungsten oxide and providing the hole injection layer 4 with oxygen vacancies or similar structures offers the promise of increased hole conduction efficiency of the hole injection layer 4. Specifically, the holes provided from the anode 2 to the hole injection layer 4 are conducted along oxygen vacancies existing along a crystal interface. Therefore, providing the tungsten oxide layer with the nanocrystal structure allows for an increase in the number of paths by which holes are conducted, thus leading to an improvement in hole conduction efficiency. In turn, this allows for a decrease in the driving voltage of the organic EL element 1000.

Additionally, the tungsten oxide forming the hole injection layer 4 has high chemical resistance, i.e. the tungsten oxide does not easily undergo undesired chemical reactions. Therefore, even if the hole injection layer 4 comes into contact with dissolution liquids or the like used during processes performed after formation of the hole injection layer 4, damage to the hole injection layer 4 due to dissolution, degradation, or a change of properties is reduced. Forming the hole injection layer 4 from a material with high chemical resistance thus prevents a reduction in hole conduction properties of the hole injection layer 4.

The hole injection layer 4 in the present embodiment includes both the case of being formed only from tungsten oxide with a nanocrystal structure and the case of being formed from tungsten oxide with a nanocrystal structure and tungsten oxide with an amorphous structure. Furthermore, it is desirable that the nanocrystal structure be present throughout the hole injection layer 4. Holes can be efficiently conducted from the lower edge of the hole injection layer 4 to the upper edge of the hole injection layer 4, however, as long as grain boundaries are connected in at least one location between the interface where the anode 2 contacts with the hole injection layer 4 and the interface where the hole injection layer 4 contacts with the buffer layer 6A.

Note that examples have been reported in the past of using a tungsten oxide layer including crystallized tungsten oxide as the hole injection layer. For example, Non-Patent Literature 1 reports that crystallizing a tungsten oxide layer by annealing at 450° C. improves hole conduction properties. However, Non-Patent Literature 1 does not demonstrate the potential for practical mass-production of a large organic EL panel utilizing such a technology nor describe the effect on other layers, such as the substrate above which the hole injection layer is formed, due to formation of the hole injection layer by utilizing such a technology. Furthermore, Non-Patent Literature 1 does not disclose purposely forming tungsten oxide nanocrystals having oxygen vacancies in the hole injection layer. The hole injection layer according to one aspect of the present invention is formed from a tungsten oxide layer that is resistant to chemical reactions, is stable, and can withstand the mass production process of large organic EL panels. Furthermore, purposely incorporating oxygen vacancies in the tungsten oxide layer achieves excellent hole conduction properties and hole injection efficiency, another decisive difference from conventional technology.

(Banks 5)

On the surface of the hole injection layer 4, banks 5 composed of organic material having insulating property (e.g., acrylic resin, polyimide resins, and novolac type phenolic resin) are formed. The banks 5 are disposed such that each of the banks 5 has a uniform trapezoidal cross-section, and such that the banks 5 form either a line bank structure or a pixel bank structure on the surface of the hole injection layer 4. By the provision of the banks 5, the surface of the hole injection layer 4 is divided into a plurality of sections. At each of the sections on the surface of the hole injection layer 4, a functional layer is formed. The functional layer includes the buffer layer 6A, and the light-emitting layer 6B of a corresponding color among the colors R, G, and B. As is illustrated in FIG. 1A, when applying the organic EL element 1000 to an organic EL panel, a plurality of units (pixels) of organic EL elements 1000 are disposed in parallel on the surface of the substrate 1. More specifically, each unit, or pixel, is a series of three organic EL elements 1000, and each of the three organic EL elements 1000 in a pixel is allocated to a different one of the colors R, G, and B.

Here, it should be noted that the banks 5 are not indispensable in the present disclosure, and when the organic EL element 1000 is to be used alone, the banks 5 need not be formed.

(Functional Layer 6)

Other than the hole injection layer 4, the organic EL element 1000 includes a functional layer that fulfills certain exemplary functions for the organic EL element 1000. The functional layer of the present disclosure is either one, a combination of two or more, or every one of layers such as the following: a hole transport layer, a light-emitting layer, and a buffer layer. The hole transport layer transports holes. The light-emitting layer emits light as a result of recombination of holes and electrons which are injected therein. The buffer layer is used for the adjustment of optical characteristics and/or for blocking electrons. In the present embodiment, an example is described in which the functional layer 6 includes the buffer layer 6A and the light-emitting layer 6B.

The buffer layer 6A is, for example, a 20 nm-thick layer of TFB (poly(9,9-di-n-octylfluorene-alt-(1,4-phenylene-((4-sec-butylphenyl)imino)-1,4-phenylene)), which is an amine-containing organic polymer.

Forming the buffer layer 6A from amine-containing organic molecules allows for holes conducted from the hole injection layer 4 to be efficiently injected into layers included in the functional layer that are formed above the buffer layer 6A. This is because in amine-containing organic molecules, the electron density of the HOMO is distributed centering on a lone pair of electrons of a nitrogen atom, which becomes a hole injection site. Including amine-containing organic molecules in the buffer layer 6A allows for formation of hole injection sites in the buffer layer 6A.

The light-emitting layer 6B is a 70 nm-thick layer of F8BT (poly(9,9-di-n-octylfluorene-alt-benzothiadiazole)), which is an organic polymer. However, the material to be used in forming the light-emitting layer 6B is not limited to this, and the light-emitting layer 6B may include a commonly-known organic material. For example, the light-emitting layer 6B may be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group III metal, metal complex of oxine, rare earth metal complex, etc., as recited in Japanese Patent Application Publication No. H5-163488.

(Electron Injection Layer 7/Cathode 8/Sealing Layer 9)

The electron injection layer 7 has a function of transporting electrons injected from the cathode 8 to the light-emitting layer 6B. For example, the electron injection layer 7 may be formed as an approximately 5 nm-thick layer formed from, for example, barium, phthalocyanine, lithium fluoride or any mixture of such materials, etc.

The cathode 8 is composed of, for example, an approximately 100 nm-thick aluminum layer. A direct current power supply DC is connected to the above-described anode 2 and cathode 8 so as to supply power from an external source to the organic EL element 1000.

The sealing layer 9 inhibits the light-emitting layer 6B and the like from being exposed to moisture, air, etc., and is formed by using material such as SiN (silicon nitride) and SiON (silicon oxynitride). In the case of a top emission type organic EL element, it is desirable that the sealing layer 9 be formed from a light-transmissive material.

<Outline of Method of Manufacturing Organic EL Element 1000>

In the following, description is provided of an example of an overall method for manufacturing the organic EL element 1000 pertaining to the present embodiment, while referring to FIGS. 1A and 1B.

Firstly, the substrate 1 is mounted inside a chamber of a sputtering film-forming device. Then, a predetermined sputtering gas is introduced into the chamber, and the anode 2 is formed according to a reactive sputtering method. Note that the anode 2 may be formed by application of a vacuum deposition method or the like. Subsequently, the ITO layer 3 is formed on the anode 2 by performing sputtering in the chamber.

The forming of the hole injection layer 4 is performed subsequently. Here, for example, the hole injection layer 4 may be formed according to a reactive sputtering method. Specifically, metal tungsten is placed in the chamber as the sputtering target, with argon gas as the sputtering gas and oxygen gas as the reactive gas. Under this condition, the argon in the argon gas is ionized by the application of high voltage, and the ionized argon is caused to bombard the sputtering target. The metal tungsten ejected as a result of the sputtering phenomenon reacts with the oxygen gas to produce tungsten oxide, thus forming the tungsten oxide layer on the ITO layer 3.

While details on the film forming conditions for forming the hole injection layer 4 are provided in the following section, in brief, the following conditions are desirable: (1) the total pressure of the sputtering gas composed of argon gas and oxygen gas should be at least 2.3 Pa and at most 7.0 Pa, and (2) the partial pressure of the oxygen gas with respect to the total pressure of the sputtering gas should be at least 50% and at most 70%. Furthermore, (3) the input power per unit area of the target (input power density) should be at least 1.5 W/cm$^2$ and at most 6.0 W/cm$^2$, and (4) the value yielded by dividing the total pressure of the sputtering gas by the input power density should be larger than 0.7 Pa·cm$^2$/W. A tungsten oxide film having a nanocrystal structure is formed under these film forming conditions.

As described above, the tungsten oxide forming the hole injection layer 4 has high chemical resistance. Therefore, even if the hole injection layer 4 comes into contact with dissolution liquids or the like used during subsequent processes, damage to the hole injection layer 4 due to dissolution, degradation, or a change of properties is reduced.

Subsequently, as the material for forming the banks 5, photosensitive resin material or, for example, photoresist material containing fluorine material is prepared. In order to form the banks 5, first, the bank material so prepared is uniformly applied on the hole injection layer 4. After performing prebaking, a mask having an aperture of a predetermined shape (a pattern of the banks 5 to be formed) is placed over the prebaked bank material. After exposing the bank material to light from over the mask, unhardened, redundant bank material is removed by using a developing solution. Finally, by performing rinsing with pure water, the banks 5 are yielded.

Next, an ink composition containing an organic amine-containing molecular material is deposited onto the surface of the hole injection layer 4 by a wet process, such as a spin coat method or an inkjet method, followed by removal of the solvent of the ink composition by volatilization. As such, the buffer layer 6A is formed.

Next, drops of ink composition containing organic light-emitting material are deposited by the same method onto the surface of the buffer layer 6A, and the solvent is removed by volatilization. Thus, the light-emitting layer 6B is formed.

Here, it should be noted that the method for forming the buffer layer 6A and the light-emitting layer 6B is not limited to the above method. Other than the spin coat method and the inkjet method, ink may be deposited/applied by another commonly-known method such as the gravure printing method, the dispenser method, the nozzle coating method, the intaglio printing method, or the relief printing method.

Next, the electron injection layer 7 and the cathode 8 are formed on the surface of the light-emitting layer 6B by vacuum deposition.

Finally, the sealing layer 9 is formed. It is to be notes that, when using a sealing cap instead of providing the sealing layer 9, the sealing cap may be formed by using, for example, the same material as the substrate 1, and a getter which absorbs moisture and the like may be provided within the sealed space.

Performance of the above steps completes the organic EL element 1000.

<Experiments on Film Forming Conditions for Hole Injection Layer 4 and Analysis of Results>

(Film Forming Conditions for Hole Injection Layer 4)

In the present embodiment, the tungsten oxide layer constituting the hole injection layer 4 is formed under predetermined film forming conditions, thus intentionally providing the hole injection layer 4 with a nanocrystal structure to improve hole conduction properties of the hole injection layer 4 and allows for a low driving voltage for the organic EL element 1000. These predetermined film forming conditions are now described in detail.

A DC magnetron sputtering device was used as the sputtering device, with metal tungsten as the sputtering target. The substrate temperature was not controlled. It is considered desirable to form the tungsten oxide film using the reactive sputtering method, with argon gas as the sputtering gas, oxygen gas as the reactive gas, and an equivalent amount of each gas released. Note that the method of forming the hole injection layer 4 is not limited to these conditions. Well-known methods other than sputtering may be used for film formation, such as the vapor deposition method or CVD.

In order to form a tungsten oxide layer with high crystallinity, it is exemplary for atoms to form a regular film on the substrate, and it is desirable to form the film at as low a deposition rate as possible.

The film forming rate during film formation by sputtering is considered to depend on the above conditions (1) through (4). As a result of the experiments described below, it was confirmed that with the above numerical ranges for conditions (1) through (4), the driving voltage lowers, and a tungsten oxide layer with high crystallinity is obtained.

With respect to condition (1), note that while the upper limit of the total pressure in the experiment conditions described below is 4.7 Pa, it was confirmed separately that a similar trend is exhibited at least up to 7.0 Pa.

Furthermore, with respect to condition (2), while the partial pressure of the oxygen gas with respect to the total pressure is set to 50%, the reduction in driving voltage was confirmed at least in the range between 50% and 70%.

A further explanation of condition (4) is now provided. When the amounts of argon gas and oxygen gas that are released are equivalent, it is assumed that film properties are determined by the input power density and the pressure at the time of film formation (total pressure). The input power density in condition (3) changes both the number and energy of sputtered tungsten atoms and tungsten atom clusters. In other words, by reducing the input power density, the number of sputtered tungsten atoms decreases, so that the tungsten film formed on the substrate can be formed at a low energy, thus offering the promise of film formation at a low film formation rate. The total pressure at the time of film formation in condition (1) changes the mean free path to the film formation substrate of the tungsten atoms and tungsten atom clusters that are sputtered and released in the gas phase. In other words, when the total pressure is high, the probability that the tungsten atoms and tungsten atom clusters will repeatedly collide with gas components in the film formation chamber before reaching the substrate increases. It is considered that an increase in the randomness of the flying tungsten atoms and tungsten atom clusters reduces the number of tungsten atoms that form a film on the substrate and causes the tungsten to form the film at a low energy. As a result, film formation at a low film formation rate can be expected.

It is considered, however, that there are limits to the extent to which device characteristics can be improved by independently controlling the input power density and the total pressure at the time of film formation in order to change the film forming rate during sputtering. Accordingly, the value yielded by dividing the total pressure at the time of film formation (Pa) by the input power density (W/cm$^2$) was established as a new film forming condition (4) serving as an index to determine the film forming rate of the tungsten atoms.

Through experimentation, the following tendencies were confirmed: as the value of the film forming condition (4) increases, the driving voltage decreases, and the film forming rate decreases; conversely, as the value of the film forming condition (4) decreases, the driving voltage increases, and the film forming rate increases.

Specifically, in the experiment conditions described below, the total pressure/power density was at least 0.78 Pa·cm$^2$/W. A value larger than 0.7 Pa·cm$^2$/W is considered exemplary, and for even more reliable film formation, a value of 0.8 Pa·cm$^2$/W or greater is considered desirable. On the other hand, the upper limit on the total pressure/power density was 3.13 Pa·cm$^2$/W in the experiment conditions. A value less than 3.2 Pa·cm$^2$/W is considered necessary, and for even more reliable film formation, a value of 3.1 Pa·cm$^2$/W or less is considered desirable. As described above, however, out of consideration for the film formation rate, restrictions are not necessarily placed on the upper limit.

Next, the inventors confirmed the validity of the above film forming conditions through experiments.

Figure 2:
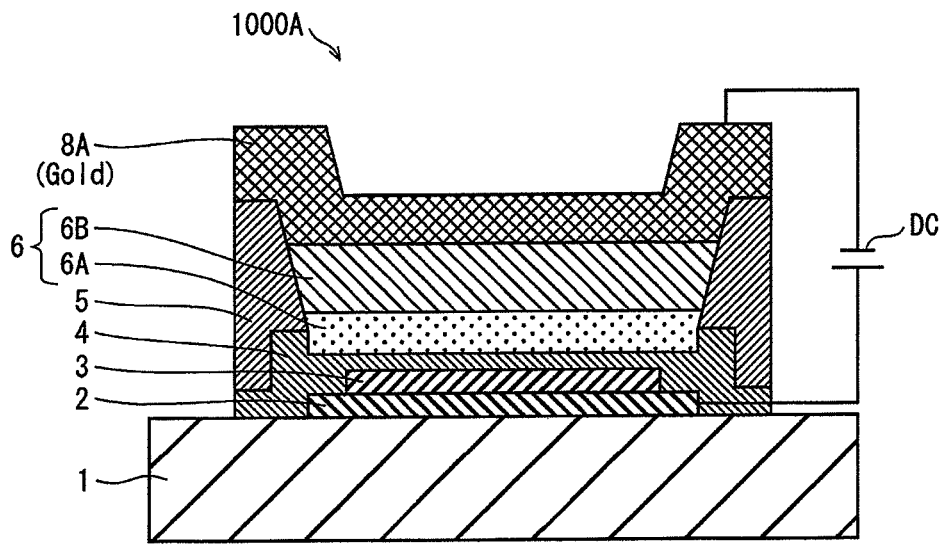
FIG. 2 is a schematic cross-sectional view illustrating a structure of a hole-only device 1000A.

First, hole-only devices 1000A as illustrated in FIG. 2 were manufactured as assessment devices in order to assess the degree to which the hole conduction efficiency from the hole injection layer 4 to the buffer layer 6A depends on film forming conditions.

In an actual operating organic EL element, the carriers constituting electric current consist of both holes and electrons. As such, the electrical characteristics of an organic EL element reflect not only hole current, but also electron current. In a hole-only device, however, the injection of electrons from the cathode is blocked, and there is almost no flow of electron current. Therefore, the current consists almost entirely of hole current. The carriers can thus be considered almost entirely to be holes, making the hole-only device appropriate for assessment of hole conduction efficiency.

As illustrated in FIG. 2, the hole-only device 1000A is the organic EL element 1 in FIG. 1000A, with the cathode 8 replaced by a cathode 8A made from gold. In specific, the hole-only device 1000A was prepared according to the above-described manufacturing method, and the layers of the hole-only device 1000A were formed to have the respective thicknesses as follows. The hole injection layer 4 composed of tungsten oxide was formed to have a thickness of 30 nm, the buffer layer 6A composed of TFB was formed to have a thickness of 20 nm. The light-emitting layer 6B composed of F8BT was formed to have a thickness of 70 nm. The cathode 8A composed of gold was formed to have a thickness of 100 nm.

In the manufacturing of the hole-only devices, the hole injection layer 4 was formed by applying the reactive sputtering method with a DC magnetron sputtering device. The gas introduced into the chamber was composed of at least one of argon gas and oxygen gas, and the sputtering target used was metal tungsten. The substrate temperature was not controlled, whereas the total pressure was adjusted by varying the flow amount of each gas. As shown in Table 1, the hole-only device 1000A was manufactured under each of five film forming conditions, A through E. The total pressure and the input power density differed between the film forming conditions, as can be seen in Table 1. The partial pressure of the argon gas and the oxygen gas in the chamber were each 50%.

Hereinafter, the hole-only device 1000A formed under film forming conditions A is referred to as HOD-A, the hole-only device 1000A formed under film forming conditions B is referred to as HOD-B, the hole-only device 1000A formed under film forming conditions C is referred to as HOD-C, the hole-only device 1000A formed under film forming conditions D is referred to as HOD-D, and the hole-only device 1000A formed under film forming conditions E is referred to as HOD-E.

TABLE 1

| Film Forming Conditions | Total Pressure (Pa) | Oxygen Partial Pressure (%) | Input Power Density (W/cm$^2$) | Total Pressure/ Power Density (Pa · cm$^2$/W) |
|---|---|---|---|---|
| A | 4.70 | 50 | 1.50 | 3.13 |
| B | 4.70 | 50 | 3.00 | 1.57 |
| C | 4.70 | 50 | 6.00 | 0.78 |
| D | 2.35 | 50 | 1.50 | 1.57 |
| E | 2.35 | 50 | 6.00 | 0.39 |

The completed hole-only devices 1000A were then connected to the direct current power supply DC, and voltage was applied thereto. Furthermore, by changing the applied voltage, an electric current value per unit surface area (current density) was calculated for different voltages.

Figure 3:
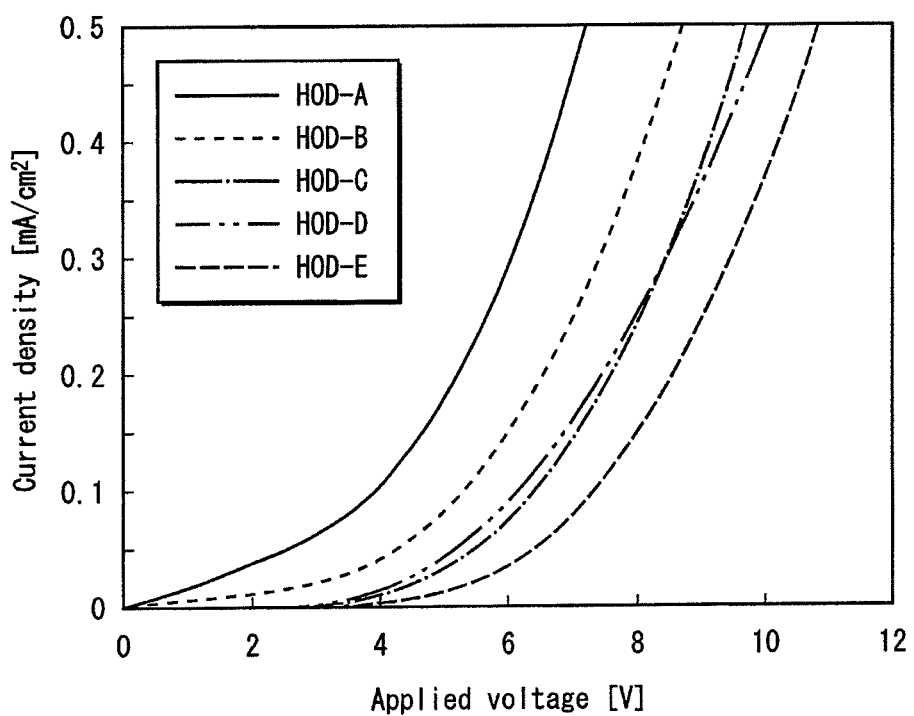
FIG. 3 is a device characteristics diagram of relation curves each illustrating a relation between applied voltage and current density of a hole-only device.

FIG. 3 is a device characteristics diagram showing relation curves each illustrating a relation between applied voltage and current density of a hole-only device. In FIG. 3, the vertical axis indicates current density (mA/cm$^2$), whereas the horizontal axis indicates applied voltage (V).

Table 2 shows the driving voltage for each sample HOD-A through HOD-E yielded by the experiment. Note that the expression "driving voltage" in Table 2 is the voltage applied when the current density value is a specific, practical value of 0.3 mA/cm$^2$.

TABLE 2

| Name of Sample | Driving Voltage (V) |
|---|---|
| HOD-A | 6.25 |
| HOD-B | 7.50 |
| HOD-C | 8.50 |
| HOD-D | 8.50 |
| HOD-E | 9.49 |

It can said that as the driving voltage grows smaller, the hole conduction efficiency of the hole injection layer 4 is higher. This is because the components of each hole-only device other than the hole injection layer 4 are prepared according to the same manufacturing method. Therefore, other than the hole injection layer 4, the hole injection barrier between two adjacent layers can be assumed to be constant. Furthermore, it was confirmed through another experiment that the ITO layer 3 and the hole injection layer 4 in this experiment are in ohmic contact. Accordingly, the differences in driving voltage depending on the film forming conditions for the hole injection layer 4 can be considered to strongly reflect the hole conduction efficiency from the hole injection layer 4 to the buffer layer 6A.

As illustrated in Table 2 and FIG. 3, it is clear that as compared to HOD-E, which is manufactured under the film forming conditions with a low total pressure and the maximum input power density, HOD-A through HOD-D have superior hole conduction efficiency.

Thus far, tests on the hole conduction efficiency of the hole injection layer 4 in the hole-only devices 1000A have been described. Except for the cathode 8A, the hole-only device 1000A has the same structure as the organic EL element 1000, which actually operates (FIGS. 1A and 1B). Accordingly, in the organic EL element 1000 as well, the dependence of the hole conduction efficiency from the hole injection layer 4 to the buffer layer 6A on film forming conditions is essentially the same as the hole-only device 1000A. In order to confirm this point, organic EL elements 1000 were prepared using a hole injection layer 4 formed under film forming conditions A through E. Hereinafter, the organic EL element 1000 formed under film forming conditions A is referred to as BPD-A, the organic EL element 1000 formed under film forming conditions B is referred to as BPD-B, the organic EL element 1000 formed under film forming conditions C is referred to as BPD-C, the organic EL element 1000 formed under film forming conditions D is referred to as BPD-D, and the organic EL element 1000 formed under film forming conditions E is referred to as BPD-E.

In specific, each organic EL element 1000 was prepared according to the above-described manufacturing method. The layers of each of the organic EL element 1000 were formed to have the respective thicknesses as follows. The hole injection layer 4 composed of tungsten oxide was formed to have a thickness of 30 nm, the buffer layer 6A composed of TFB was formed to have a thickness of 20 nm. The light-emitting layer 6B composed of F8BT was formed to have a thickness of 70 nm. The electron injection layer 7 composed of a barium layer was formed to have a thickness of 5 nm. The cathode 8 composed of an aluminum layer was formed to have a thickness of 100 nm. The organic EL elements 1000 prepared under film formation conditions A through E were then connected to the direct current power supply DC, and voltage was applied thereto. Furthermore, by changing the applied voltage, an electric current value per unit surface area (current density) was calculated for different voltages.

Figure 4:
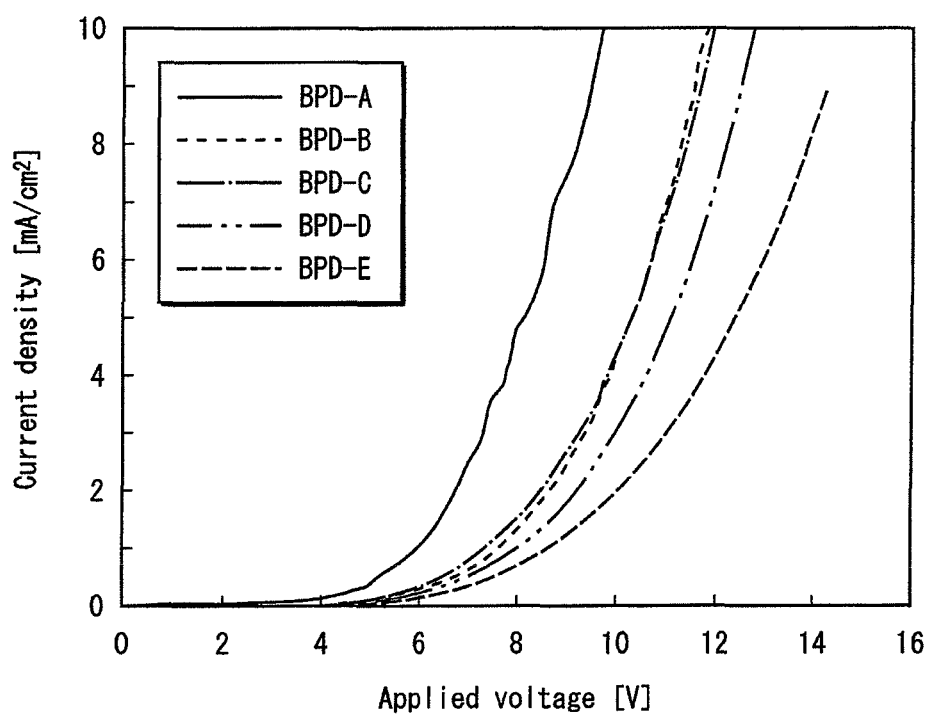
FIG. 4 is a device characteristics diagram of relation curves each illustrating a relation between applied voltage and current density of an organic EL element.

FIG. 4 is a device characteristics diagram showing relation curves each illustrating a relation between applied voltage and current density of an organic EL element. In FIG. 4, the vertical axis indicates current density (mA/cm$^2$), whereas the horizontal axis indicates applied voltage (V). Table 3 shows the driving voltage for each sample BOD-A through BOD-E yielded by the experiment. Note that the expression "driving voltage" in Table 3 is the voltage applied when the current density value is a specific, practical value of 8 mA/cm$^2$.

TABLE 3

| Name of Sample | Driving Voltage (V) |
|---|---|
| BPD-A | 9.25 |
| BPD-B | 11.25 |
| BPD-C | 11.50 |
| BPD-D | 12.25 |
| BPD-E | 14.00 |

As illustrated in Table 3 and FIG. 4, compared to the other organic EL elements, the current density-applied voltage curve rises the slowest for BPD-E, which requires the highest applied voltage in order to achieve a high current density. This trend is similar to the trend observed in the hole-only devices HOD-A through HOD-E, which were prepared under the same respective film forming conditions.

From the above results, it was confirmed that in the organic EL elements 1000 as well, the hole conduction efficiency of the hole injection layer 4 depends on the film forming conditions, similar to the case of the hole-only devices 1000A. Specifically, it was confirmed that forming the film under the conditions provided by the ranges in film forming conditions A, B, C, and D increases the hole conduction efficiency from the hole injection layer 4 to the buffer layer 6A, thereby achieving a low driving voltage.

Note that among the above conditions, the condition concerning input power is represented in terms of input power density, as indicated in Table 1. When using a DC magnetron sputtering device that is different from the DC magnetron sputtering device used in the present experiment, a hole injection layer 4 composed of a tungsten oxide layer with excellent hole conduction efficiency, as in the present experiment, can be yielded by adjusting the input power according to the size of the magnet at the back surface of the sputtering target so that the input power density fulfills the above condition. Conditions on total pressure and oxygen partial pressure, on the other hand, are independent of the device, the size of the target, and the magnet size of the target.

Additionally, as already explained in the above, no intentional adjustment of the substrate temperature was performed while forming the hole injection layer 4 by applying a reactive sputtering method. And during the experiment, the sputtering device was placed under room temperature. Therefore, the substrate was at room temperature at least before the forming of the hole injection layer 4. However, while the hole injection layer 4 was being formed, there is a possibility that the substrate temperature may have risen by several tens of degrees Celsius.

Note that through a separate experiment, the inventors confirmed that when the oxygen partial pressure is raised too high, the driving voltage conversely ends up rising. Accordingly, it is desirable for the oxygen partial pressure to be between 50% and 70%.

The above experiment results indicate that for a low driving voltage, an organic EL element provided with a hole injection layer manufactured under film forming conditions A, B, C, and D is desirable, and that an organic EL element manufactured under film forming conditions A and B is even more desirable. Hereinafter, an organic EL element provided with a hole injection layer manufactured under film forming conditions A, B, C, or D is the target of the present disclosure.

(Chemical State of Tungsten in Hole Injection Layer 4)

The above-described nanocrystal structure exists in the tungsten oxide constituting the hole injection layer 4 in the organic EL element 1000 of the present embodiment. This nanocrystal structure is formed by adjusting the film forming conditions described in the experiments above. Details concerning this point are provided in the following.

In order to confirm whether or not a nanocrystal structure is found in the tungsten oxide formed under the above film forming conditions A through E, a hard X-ray photoelectron spectroscopy (HAXPES) measurement (hereinafter simply referred to as "XPS measurement") experiment was performed. Typically, the information depth of an optical spectrum yielded by hard X-ray photoelectron spectroscopy (hereinafter simply referred to as "XPS spectrum") reflecting the average valence of the film is determined by the angle between the surface of the target of measurement and the direction in which the photoelectron is detected by the detector that detects photoelectrons. In the present experiment, the angle between the direction in which photoelectrons are detected and the surface of the tungsten oxide layer during the XPS measurement was 40° in order to observe the average valence of the tungsten oxide layer in the direction of thickness of the tungsten oxide layer.

The conditions under which the XPS measurement was conducted are as follows. Note that no charge-up occurred during measurement.

(XPS Measurement Conditions)
Device used: R-4000 (manufactured by VG-SCIENTA)
Light source: synchrotron radiation (7856 eV)
Bias: None
Electron emission angle: angle of 40° with substrate surface
Interval between measurement points: 0.05 eV Samples for XPS measurement were manufactured under the film forming conditions A through E shown in Table 1. The hole injection layer 4 was formed to a thickness of 30 nm by the above reactive sputtering method on an ITO conductive substrate formed on glass. The result was taken as the sample for XPS measurement. The samples for XPS measurement manufactured under the film forming conditions A, B, C, D, and E are hereinafter respectively referred to as sample A, sample B, sample C, sample D, and sample E. XPS measurement was then performed on the surface of the hole injection layer 4 in each of the samples A through E. FIG. 5 is a diagram illustrating the resulting spectra.

In FIG. 5, the horizontal axis represents binding energy, corresponding to the energy level of the photoelectrons at each energy level with the X-ray as a reference. The left direction with respect to the origin is positive. The vertical axis represents photoelectron intensity and corresponds to the number of individually measured photoelectrons. As illustrated in FIG. 5, three peaks were observed. From the left side of the figure to the right, the peaks belong to the following energy levels of tungsten: $5p_{3/2}$ ($W5p_{3/2}$), $4f_{5/2}$ ($W4f_{5/2}$), and $4f_{7/2}$ ($W4f_{7/2}$).

Next, peak fitting analysis was performed on the peaks belonging to the energy levels $W5p_{3/2}$, $W4f_{5/2}$, and $W4f_{7/2}$ of the spectra for sample A and, as a comparative example, for sample E. The peak fitting analysis was performed as follows.

The peak fitting analysis was performed using XPSPEAK Version 4.1, which is software for photoelectron spectroscopy analysis. First, based on the photoionization cross-section for the hard X-ray energy of 7940 eV, the peak area intensity ratio for the energy levels $W4f_{7/2}$, $W4f_{5/2}$, and $W5p_{3/2}$ was fixed as follows: $W4f_{7/2}:W4f_{5/2}:W5p_{3/2}=4:3:10.5$. Further, as shown in Table 4, the peak top belonging to a valence of six at the surface discontinuity energy level of $W4f_{7/2}$ ($W^{6+}4f_{7/2}$) was aligned with an energy of 35.7 eV. Next, the peak energy and the peak full width at half maximum for each of the peaks belonging to the surface photoelectron peak ($W^{sur}5p_{3/2}$), a valence of six at the surface discontinuity energy level ($W^{6+}5p_{3/2}$), and a valence of five at the surface discontinuity energy level ($W^{5+}5p_{3/2}$) of $W5p_{3/2}$ were set to the values listed in Table 4. Similarly, for $W4f_{5/2}$ and $W4f_{7/2}$, the peak energy and the peak full width at half maximum for each of the peaks belonging to the surface photoelectron peak ($W^{sur}4f_{5/2}$, $W^{sur}4f_{7/2}$), a valence of six at the surface discontinuity energy level ($W^{6+}4f_{5/2}$), and a valence of five at the surface discontinuity energy level ($W^{5+}4f_{5/2}$, $W^{5+}4f_{7/2}$) were set to the values listed in Table 4. After setting the peak intensities to a desired value, calculations were performed a maximum of 100 times using a Gaussian-Lorentzian mixed function to obtain the final peak fitting analysis results. In the mixed function, the ratio in the Lorentzian function was set as indicated in Table 4.

TABLE 4

| Corresponding peak | $W5p_{3/2}$ | | | $W4f_{5/2}$ | | | $W4f_{7/2}$ | | |
| --- | --- | --- | --- | --- | --- | --- | --- | --- | --- |
| | $W^{sur}5p_{3/2}$ | $W^{6+}5p_{3/2}$ | $W^{5+}5p_{3/2}$ | $W^{sur}4f_{5/2}$ | $W^{6+}4f_{5/2}$ | $W^{5+}4f_{5/2}$ | $W^{sur}4f_{7/2}$ | $W^{6+}4f_{7/2}$ | $W^{5+}4f_{7/2}$ |
| Peak Energy (eV) | 42.30 to 43.07 | 41.20 to 41.30 | 39.70 to 38.65 | 38.75 to 39.13 | 37.80 to 37.85 | 36.72 to 36.95 | 36.60 to 36.90 | 35.70 (reference) | 34.60 to 34.80 |
| Value of full width at half maximum (eV) | 1.73 to 2.40 | 1.93 to 2.24 | 1.8 to 2.86 | 1.40 to 1.60 | 0.87 to 0.98 | 0.90 to 1.50 | 1.40 to 1.60 | 0.87 to 0.98 | 0.90 to 1.50 |
| Lorentzian function ratio (%) | 0 | 13 to 40 | 0 to 25 | 0 to 57 | 0 to 6 | 0 to 20 | 0 to 57 | 0 to 6 | 0 to 20 |

Figure 6A:
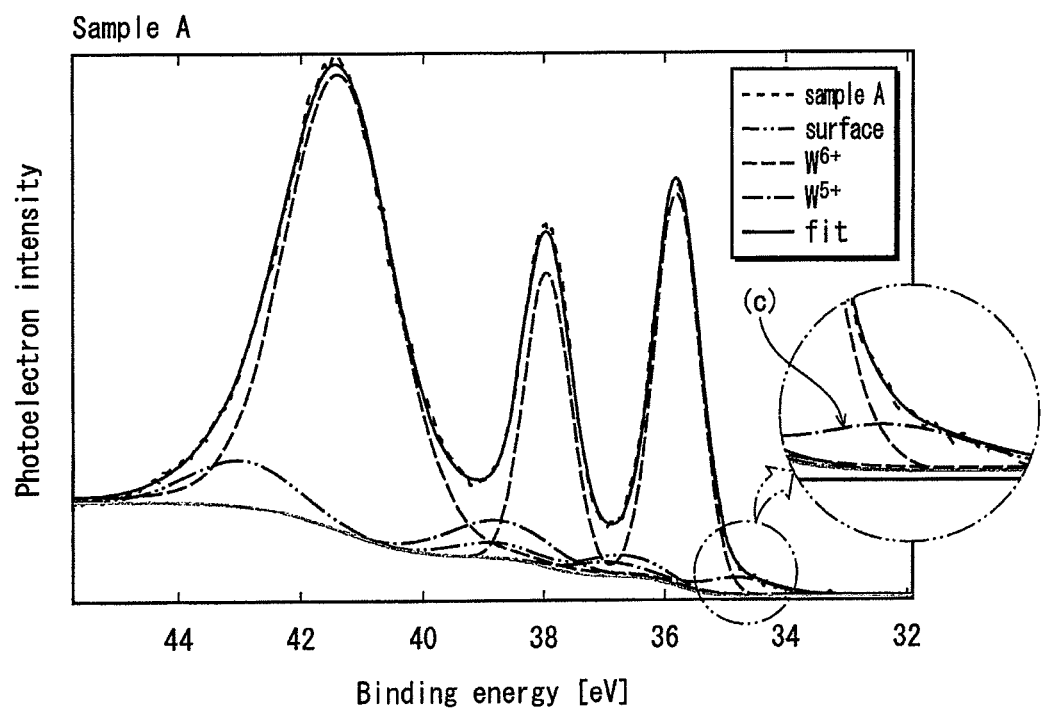
FIG. 6A shows peak fitting analysis results for sample A in FIG. 5.
Figure 6B:
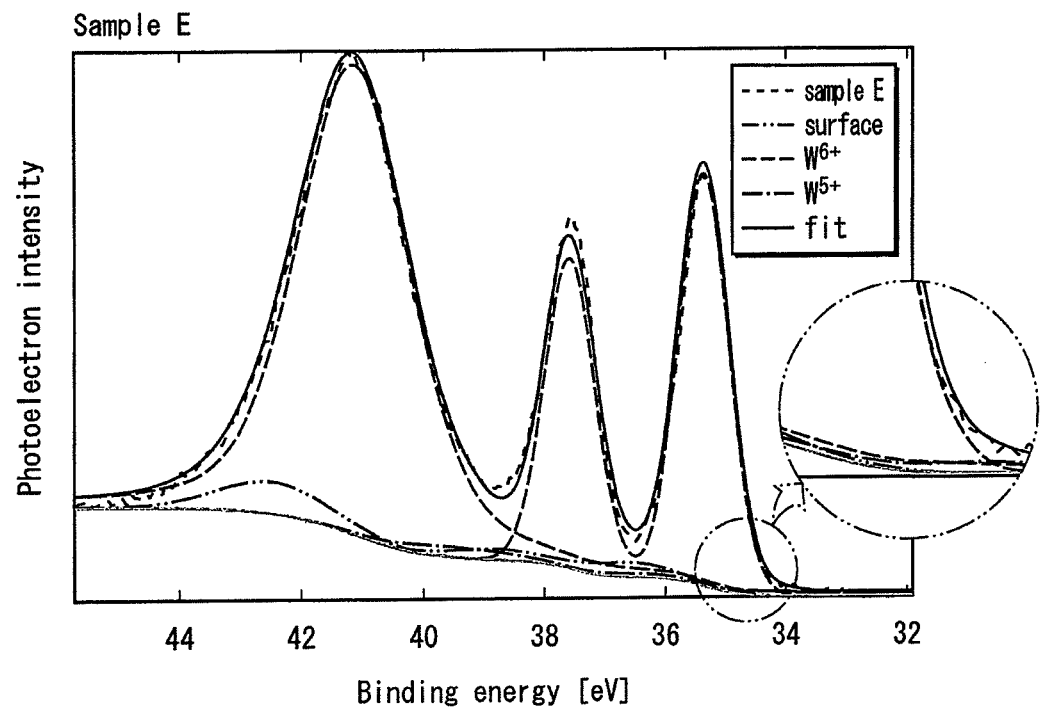
FIG. 6B shows peak fitting analysis results for sample E in FIG. 5.

FIGS. 6A and 6B show the final peak fitting analysis results. FIG. 6A shows the analysis results for sample A, and FIG. 6B shows the analysis results for sample E.

In both FIGS. 6A and 6B, the dashed lines (sample A, sample E) are actual measured spectra (corresponding to the spectra in FIG. 5), the lines with alternate long and two short dashes (surface) are the spectra belonging to the surface photoelectron peaks of $W^{sur}5p_{3/2}$, $W^{sur}4f_{5/2}$, and $W^{sur}4f_{7/2}$, the dotted lines ($W^{6+}$) are the spectra belonging to a valence of six at the surface discontinuity energy level of $W^{6+}5p_{3/2}$, $W^{6+}4f_{7/2}$, and $W^{6+}4f_{5/2}$, and the alternating long and short dashed lines ($W^{5+}$) are the spectra belonging to a valence of five at the surface discontinuity energy level of $W^{5+}5p_{3/2}$, $W^{5+}4f_{5/2}$, and $W^{5+}4f_{7/2}$. The solid lines (fit) are the spectra yielded by summing the spectra indicated by the lines with alternate long and two short dashes and the alternating long and short dashed lines. Note that in FIGS. 6A and 6B, the peak belonging to the tungsten with a valence of five indicated by the alternating long and short dashed line is considered to derive only from tungsten with a valence of five.

As illustrated in FIGS. 6A and 6B, the spectra belonging to the energy levels $5p_{3/2}$, $4f_{5/2}$, and $4f_{7/2}$ are constituted by a sum of the peak due to photoelectrons from the surface of the hole injection layer 4 (surface), the peak of tungsten atoms with a valence of six included at the depth at which photoelectrons are detected within the hole injection layer 4 ($W^{6+}$), and the peak of tungsten atoms with a valence of five included at the same depth ($W^{5+}$).

Furthermore, FIG. 6A shows that for sample A, a peak for $W^{5+}$ corresponding to each energy level occurs in a binding energy region that is 0.3 eV to 1.8 eV lower than each of the peaks belonging to the energy levels $5p_{3/2}$, $4f_{5/2}$, and $4f_{7/2}$ in the $W^{6+}$ spectrum. On the other hand, in FIG. 6B, no such peak for $W^{5+}$ is evident for sample E. For the purposes of illustration, the peak belonging to $4f_{7/2}$ in the $W^{5+}$ spectrum for sample A and for sample E is shown enlarged to the right of FIGS. 6A and 6B. As shown in (c) of FIG. 6A, the peak in $W^{5+}$ is clearly observable for sample A, whereas no such peak in $W^{5+}$ is observable for sample E.

Furthermore, looking more closely at the enlarged diagrams in FIGS. 6A and 6B, the solid line (fit), which is the summed spectrum resulting from peak fitting, exhibits a large "shift" in sample A with respect to the spectrum for $W^{6+}$ indicated by the dotted line ($W^{6+}$). In sample E, however, the "shift" is not as large as in sample A. In other words, the "shift" in sample A can be inferred as suggestive of the existence of tungsten atoms with a valence of five.

Next, for samples A through E, the abundance ratio $W^{5+}/W^{6+}$ of the number of tungsten atoms with a valence of five versus the number of tungsten atoms with a valence of six was calculated. The abundance ratio was calculated, in the spectrum obtained through peak fitting analysis on each sample, by dividing the area intensity of the peak for $W^{5+}$ (alternating long and short dashed line) by the area intensity of the peak for $W^{6+}$ (dotted line).

Note that in principle, representing the abundance ratio of the number of tungsten atoms with a valence of six to the number of tungsten atoms with a valence of five as the ratio of the area intensity of the peak for $W^{6+}$ to the area intensity of the peak for $W^{5+}$ in $W4f_{7/2}$ is equivalent to representing the abundance ratio based on the peaks belonging to $W5p_{3/2}$ and $W4f_{5/2}$. In the present experiment, it was confirmed that the ratio of the area intensity of $W^{5+}4f_{7/2}$ to the area intensity of $W^{6+}4f_{7/2}$ in $W4f_{7/2}$ was indeed the same value for W5p and for $W4f_{5/2}$ as well. Accordingly, in the following analysis, only the peak belonging to $W4f_{7/2}$ is considered.

Table 5 shows the ratio $W^{5+}/W^{6+}$ for samples A through E.

TABLE 5

| Name of Sample | $W^{5+}/W^{6+}$ |
|---|---|
| Sample A | 7.4% |
| Sample B | 6.1% |
| Sample C | 3.2% |
| Sample D | 3.2% |
| Sample E | 1.8% |

Based on the values of $W^{5+}/W^{6+}$ in Table 5, it was confirmed that the sample including the most tungsten atoms with a valence of five was sample A, followed by samples B, C, and D in decreasing order. Furthermore, based on the results in Table 3 and Table 5, it became clear that as the value of $W^{5+}/W^{6+}$ increases, the driving voltage of the organic EL element decreases.

(Electronic State of Tungsten in Hole Injection Layer 4)

The tungsten oxide film formed under the above film forming conditions A through D has, in an electronic state thereof, an occupied energy level in a binding energy region that is between 1.8 eV and 3.6 eV lower than the upper end of the valence band, i.e. the lowest binding energy of the valence band. This occupied energy level of the hole injection layer 4 corresponds to the energy level of the highest occupied molecular orbital (HOMO) of the hole injection layer 4. That is, in the electronic state of the hole injection layer 4, the occupied energy level is closest to the Fermi surface of the hole injection layer 4, in terms of binding energy. The occupied energy level is hereinafter referred to as "the occupied energy level near the Fermi surface".

Due to the existence of this occupied energy level near the Fermi surface, a so-called interface energy level alignment is formed at the layer interface between the hole injection layer 4 and the buffer layer 6A, so that the binding energy of the highest occupied molecular orbital of the buffer layer 6A and the binding energy of the occupied energy level near the Fermi surface of the hole injection layer 4 become approximately equal. In other words, due to the existence of the occupied energy level, the hole injection barrier between the hole injection layer 4 and the buffer layer 6A is reduced. This allows for even better hole conduction efficiency as well as driving at a lower voltage.

Note that the expressions "approximately equal to" and "interface energy level alignment is formed" as referred to herein indicate that at the interface between the hole injection layer 4 and the buffer layer 6A, the difference between the lowest binding energy at the occupied energy level near the Fermi surface and the lowest binding energy at the highest occupied molecular orbital is ±0.3 eV.

Furthermore, the expression "interface" as referred to here denotes an area that includes a surface of the hole injection layer 4 and a portion of the buffer layer 6A within a distance of 0.3 nm from the surface of the hole injection layer 4.

While it is desirable that the occupied energy level near the Fermi surface exist throughout the hole injection layer 4, it suffices for this occupied energy level to exist at the interface with the buffer layer 6A.

Next, experiments to confirm the existence of the occupied energy level near the Fermi surface in the hole injection layer 4 of sample A and sample E were performed using ultraviolet photoelectron spectroscopy (UPS) measurement.

The forming of the hole injection layer 4 in sample A and sample E was performed inside a sputtering device. Then, to prevent atmospheric exposure, samples A and E were transported to a glovebox which was connected to the sputtering device and which was filled with nitrogen gas. Subsequently, the sample devices were sealed inside transfer vessels in the glovebox, and were mounted on a photoelectron spectroscopy device. After formation, the hole injection layer 4 was therefore not exposed to the atmosphere before UPS measurement was performed.

In general, a UPS spectrum obtained as a result of the UPS measurement reflects a state of occupied energy levels, such as a valence band and the like, within several nanometers in distance from the surface of the target of measurement. As such, the present experiment was conducted in order to observe the state of occupied energy levels at a surface portion of the hole injection layer 4 by utilizing UPS measurement.

The conditions under which the UPS measurement was conducted are as follows. Note that charge-up did not occur during measurement.

(UPS Measurement Conditions)
Device used: PHI 5000 VersaProbe Scanning X-ray Photoelectron Spectroscopy Device (manufactured by ULVAC-PHI, Inc.)
Light source: He I line
Bias: None
Electron emission angle: Direction of normal line to the substrate
Interval between measurement points: 0.05 eV FIG. 7 is a diagram illustrating a UPS spectrum of the hole injection layer 4 of sample A. The origin of the horizontal axis, which represents binding energy, corresponds to the Fermi surface of the substrate 1, and the left direction with respect to the origin is positive. Each of the occupied energy levels of the hole injection layer 4 is now described with reference to FIG. 7.

Commonly, a UPS spectrum of tungsten oxide indicates a distinct, rapid rise which can be uniquely distinguished from other areas thereof. Here, a tangential line passing through an inflection point of the above rise is referred to as line (i), and the point at which line (i) intersects the horizontal axis is referred to as point (iii). The UPS spectrum of tungsten oxide can be divided into two areas: area x that extends in the high binding energy direction from point (iii), and area y that extends in the low binding energy direction (i.e. towards the Fermi surface) from point (iii).

Using the same XPS measurement as described above, it was confirmed that the ratio of the number of tungsten atoms to the number of oxygen atoms was nearly 1:3 in both of the samples A and E. Specifically, the composition ratio of tungsten to oxygen within several nanometers in distance from the surface of the hole injection layer 4 was estimated.

Based on this ratio, it can be concluded that in both samples A and E, the hole injection layer 4 has a basic structure with atomic coordinates based on tungsten trioxide (details are provided in the following section), at least to a depth of several nanometers from the surface. Accordingly, area x in FIG. 7 corresponds to an occupied energy level deriving from the above basic structure, i.e. an area corresponding to a so-called valence band. Note that the inventors performed X-ray absorption fine structure (XAFS) measurement with respect to the hole injection layer 4 of both samples A and E and confirmed that the above basic structure is formed therein.

Accordingly, the area y illustrated in FIG. 7 corresponds to a band gap between the valence band and the conduction band. It is commonly known, however, that an occupied energy level that differs from the occupied energy level of the valence band may exist in this area of the tungsten oxide, as is suggested by the UPS spectrum in FIG. 7. This occupied energy level in area y derives from another structure that is different from the above-mentioned basic structure, and is referred to as a band gap energy level (in-gap state or gap state).

Figure 8:
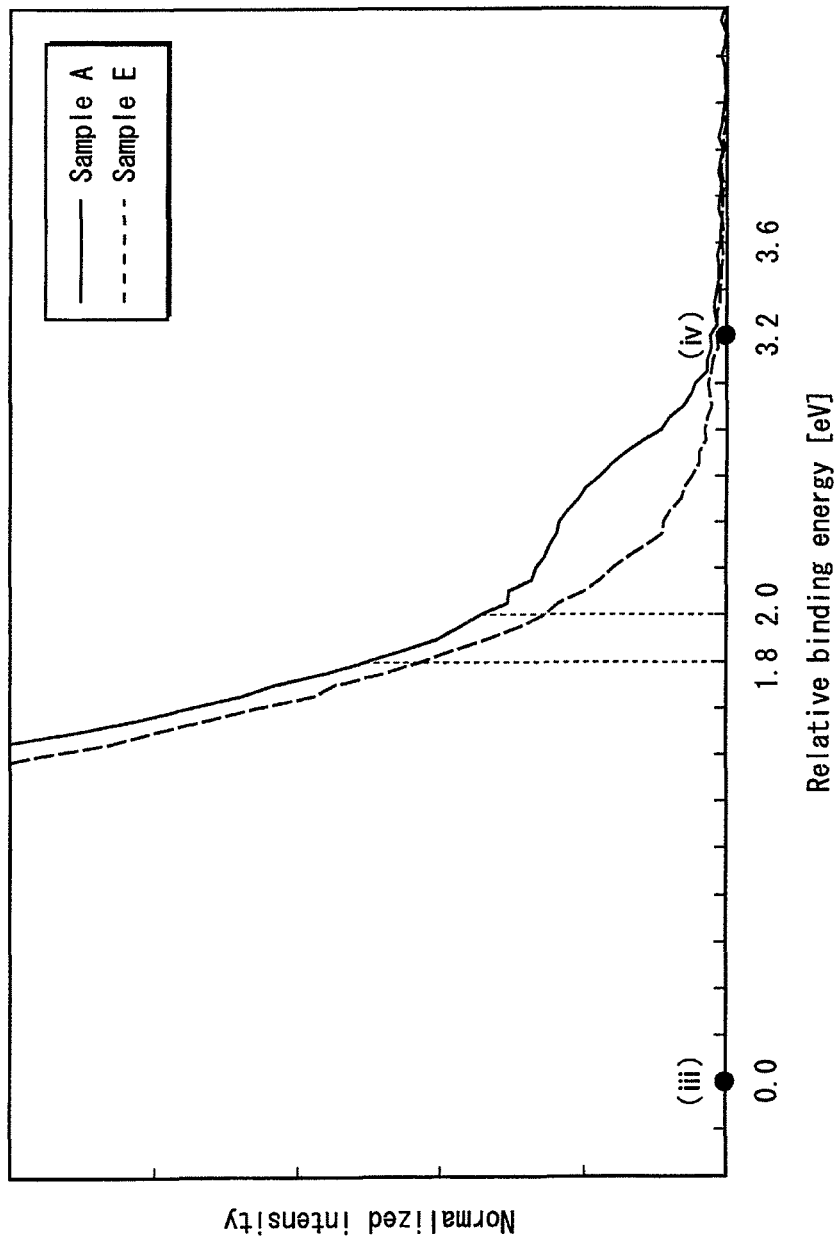
FIG. 8 is a diagram illustrating UPS spectra of a surface of a tungsten oxide layer.

Next, FIG. 8 is a diagram illustrating a UPS spectrum of the hole injection layer 4 in samples A and E within area y. The spectrum intensity indicated by the vertical axis in FIG. 8 has been normalized using the peak-top intensity value of a peak (ii) in FIG. 7, which is located approximately between 3 eV and 4 eV in the high binding energy direction from point (iii). In addition, note that point (iii) in FIG. 8 is illustrated at the same point on the horizontal axis as in FIG. 7. In FIG. 8, the horizontal axis indicates a relative value (relative binding energy) with respect to point (iii), and the binding energy decreases from left to right (towards the Fermi surface).

As illustrated in FIG. 8, the spectrum indicating the hole injection layer 4 of sample A exhibits a peak in an area between a point which is 3.6 eV lower in terms of binding energy than point (iii) and a point which is 1.8 eV lower in terms of binding energy than point (iii). The point at which this peak clearly begins is labeled as point (iv) in FIG. 8. The existence of such a peak is not observed in the spectrum for sample E.

Forming the hole injection layer from tungsten oxide having a structure such that the UPS spectrum thereof indicates an upward protrusion (not necessarily in the form of a peak) in an area which is between 1.8 eV and 3.6 eV lower in terms of binding energy than point (iii) provides the organic EL element with excellent hole conduction efficiency.

Furthermore, it has been found that hole injection efficiency increases when this upward protrusion has a higher degree of sharpness. Therefore, as illustrated in FIG. 8, it can be said that the area that is between 2.0 eV and 3.2 eV lower than point (iii) in terms of binding energy is particularly beneficial, since the upward protrusion is relatively easier to confirm in this area and has a relatively sharper inclination.

(Relationship Between Value of $W^{5+}/W^{6+}$ and Driving Voltage)

Figure 9:
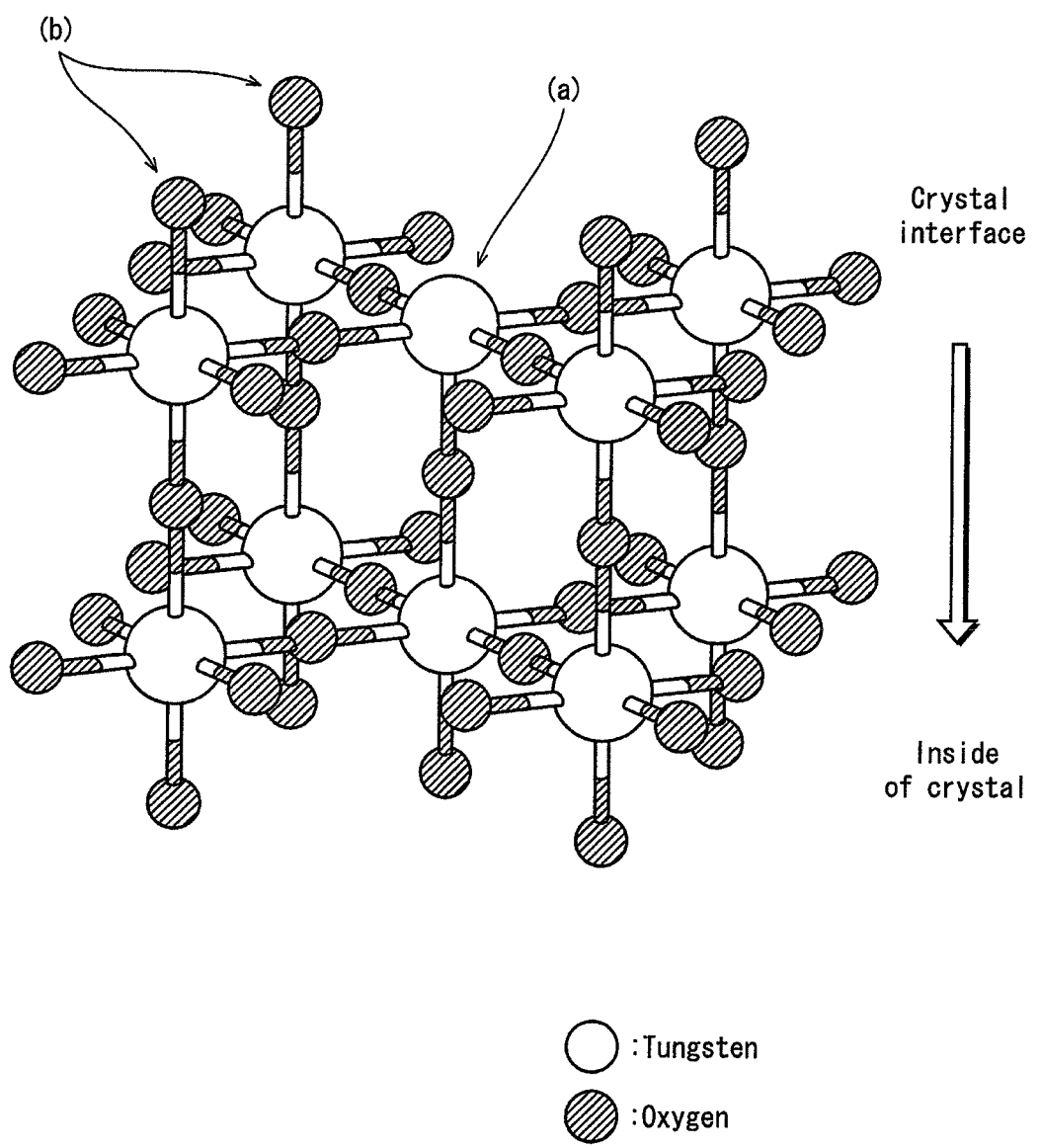
FIG. 9 illustrates a surface structure of a tungsten oxide layer.

FIG. 9 is a diagram illustrating the structure along the surface of the tungsten oxide layer. In this figure, tungsten trioxide ($WO_3$) is used as an example of tungsten oxide. As illustrated in FIG. 9, tungsten atoms are surrounded by six oxygen atoms to form an octahedron with the six oxygen atoms at the vertices. The octahedrons share the vertices and connect to each other. For the sake of simplicity, in this figure the octahedrons are drawn as regular octahedrons, such as the rhenium oxide structure. In practice, the octahedrons themselves are somewhat distorted but they order periodically.

As illustrated in FIG. 9, tungsten atoms are terminated by oxygen atoms within the crystal. However, at a crystal interface, terminal oxygen atoms (b) and non-terminated tungsten atoms (a), which are entirely or partially surrounded by the terminal oxygen atoms (b), exist. Non-Patent Literature 4 reports how first principles calculation reveals that a structure where a part of the tungsten atoms at the crystal interface remain not terminated (corresponding to the non-terminated tungsten atoms (a)), as in FIG. 9, is more stable in terms of energy than a structure where all of the tungsten atoms at the crystal interface are terminated in oxygen atoms. The reason for this is that when all of the tungsten atoms at the crystal interface are terminated in oxygen atoms, the electric repulsive force between terminal oxygen atoms increases, which results in a loss of stability. In other words, at the crystal interface, the presence of oxygen vacancies or similar structures (a) along the surface results in higher stability.

Tungsten atoms terminated in oxygen atoms, i.e. tungsten atoms not having oxygen vacancies or similar structures (a), correspond to tungsten atoms with a valence of six. On the other hand, tungsten atoms not terminated in oxygen atoms, i.e. tungsten atoms having oxygen vacancies or similar structures (a), correspond to tungsten atoms with a valence of five (including a valence of at least five and less than six).

Tungsten atoms with a valence of five are considered to have a structure with a lone pair of electrons due to the loss of one oxygen atom in octahedral coordination. In other words, it is thought that a tungsten atom with a valence of five supplies a hole with its own lone pair of electrons, so that the tungsten atom with a valence of five that supplied the electrons has a hole. Due to the bias voltage applied to the hole injection layer, this provision of an electron from a lone pair of electrons existing in a tungsten atom with a valence of five is thought to occur continuously, leading to hole conduction in which holes move in the direction of lower electric potential and electrons move in the direction of higher electric potential. The hole injection layer 4 having a high value for $W^{5\pm}/W^{6+}$ in sample A, i.e. a high ratio of tungsten atoms with the valence of five, thus has abundant hole conduction paths, allowing for driving at a low voltage due to hole conduction at a low voltage. As a result, the organic EL element has excellent hole conduction efficiency.

Furthermore, in samples C and D, while the value of $W^{5+}/W^{6+}$ was not as high as sample A, good hole conduction was confirmed even at a value of approximately 3.2%.

(Microstructure of Tungsten in Hole Injection Layer 4)

The tungsten oxide layer constituting the hole injection layer 4 has a nanocrystal structure. This nanocrystal structure is formed by adjusting the film forming conditions. Details concerning this point are provided in the following.

In order to confirm the existence of the nanocrystal structure in the tungsten oxide layer formed under film forming conditions A, B, C, D, and E listed in Table 1, a transmission electron microscope (TEM) measurement experiment was performed.

The tungsten oxide layer in the sample for TEM measurement was formed by the reactive sputtering method using a DC magnetron sputtering device under each set of conditions listed in Table 1. To form each sample, the hole injection layer 4 was formed to a thickness of 30 nm by the above reactive sputtering method on an ITO conductive substrate formed on glass. The samples for TEM measurement manufactured under the film forming conditions A, B, C, D, and E are hereinafter respectively referred to as sample A, sample B, sample C, sample D, and sample E. Note that TEM measurement was performed after confirming, by the above XPS measurement, that tungsten atoms with a valence of five were included in each of the samples A, B, C, and D.

Typically, TEM measurement is performed on a surface by forming a thin sample. A sample according to the present embodiment was manufactured as a cross-section of the tungsten oxide layer by using a focused ion beam (FIB) device to process the sample and adjust the thickness to approximately 100 nm. The conditions for FIB processing and TEM measurement are as follows.

Figure 10:
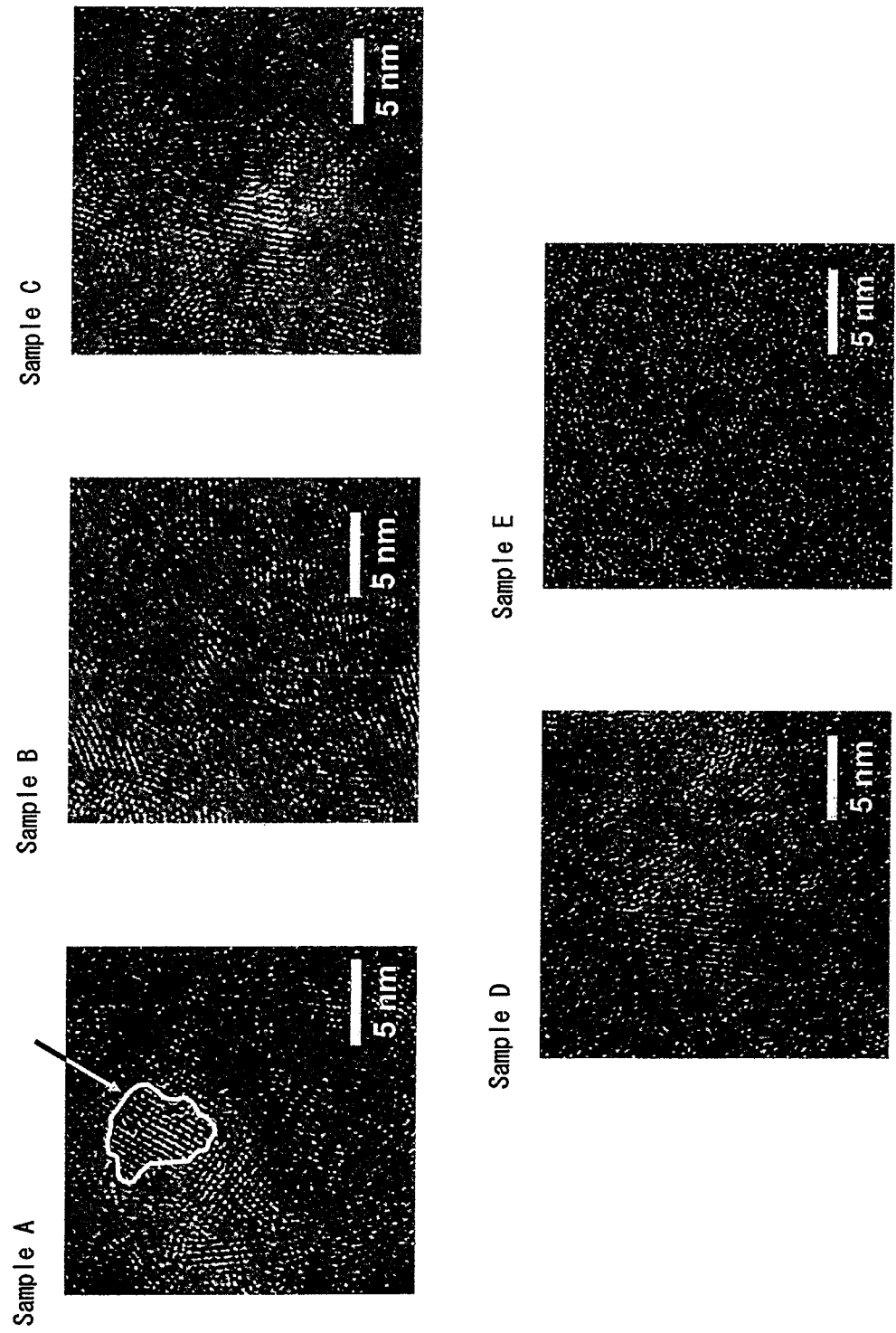
FIG. 10 shows cross-sectional TEM photographs of a tungsten oxide layer.

(Conditions for FIB Processing)
Device used: Quanta 200 (manufactured by FEI Company)
Accelerating voltage: 30 kV (final voltage: 5 kV)
Thickness of sample: 50 nm or less
(Conditions for TEM Measurement)
Device used: Topcon EM-002B (manufactured by Topcon Technohouse Corporation)
Measurement method: high-resolution electron microscopy
Accelerating voltage: 200 kV FIG. 10 is a diagram illustrating a TEM measurement photograph of a cross-section of the hole injection layer 4 in each of samples A, B, C, D, and E. The scale is indicated by the scale bar in each TEM photograph, and the display size of each TEM photograph is 560×560 pixels. The TEM photographs in FIG. 10 are shown with 256 gradations from the darkest to the brightest region.

In the TEM photographs in FIG. 10, regular linear structures can be observed in samples A, B, C, and D as bright regions aligned in the same direction in portions of samples A, B, C, and D. As is clear from the scale of the TEM photographs, these linear structures are provided at intervals of approximately 1.85 angstroms to 5.55 angstroms.

On the other hand, the bright regions are scattered irregularly in sample E, with no regular linear structures being observable. In the TEM photographs, regions with the above linear structures represent one nanocrystal of tungsten oxide. The TEM photographs thus confirm the presence of the nanocrystal structure of tungsten oxide in samples A, B, C, and D. On the other hand, no nanocrystal structure could be confirmed in sample E.

In the TEM photograph of sample A in FIG. 10, one of the nanocrystals, chosen arbitrarily, is outlined with a white line. Note that this outline is not precise, but rather is meant to be an example. This is because the TEM photograph shows not only the uppermost surface in the cross-section, but also the conditions lower in the layer, thus making it difficult to precisely identify the outline. The size of the nanocrystal outlined with a white line in sample A is approximately between 3 nm and 10 nm.

Figure 11:
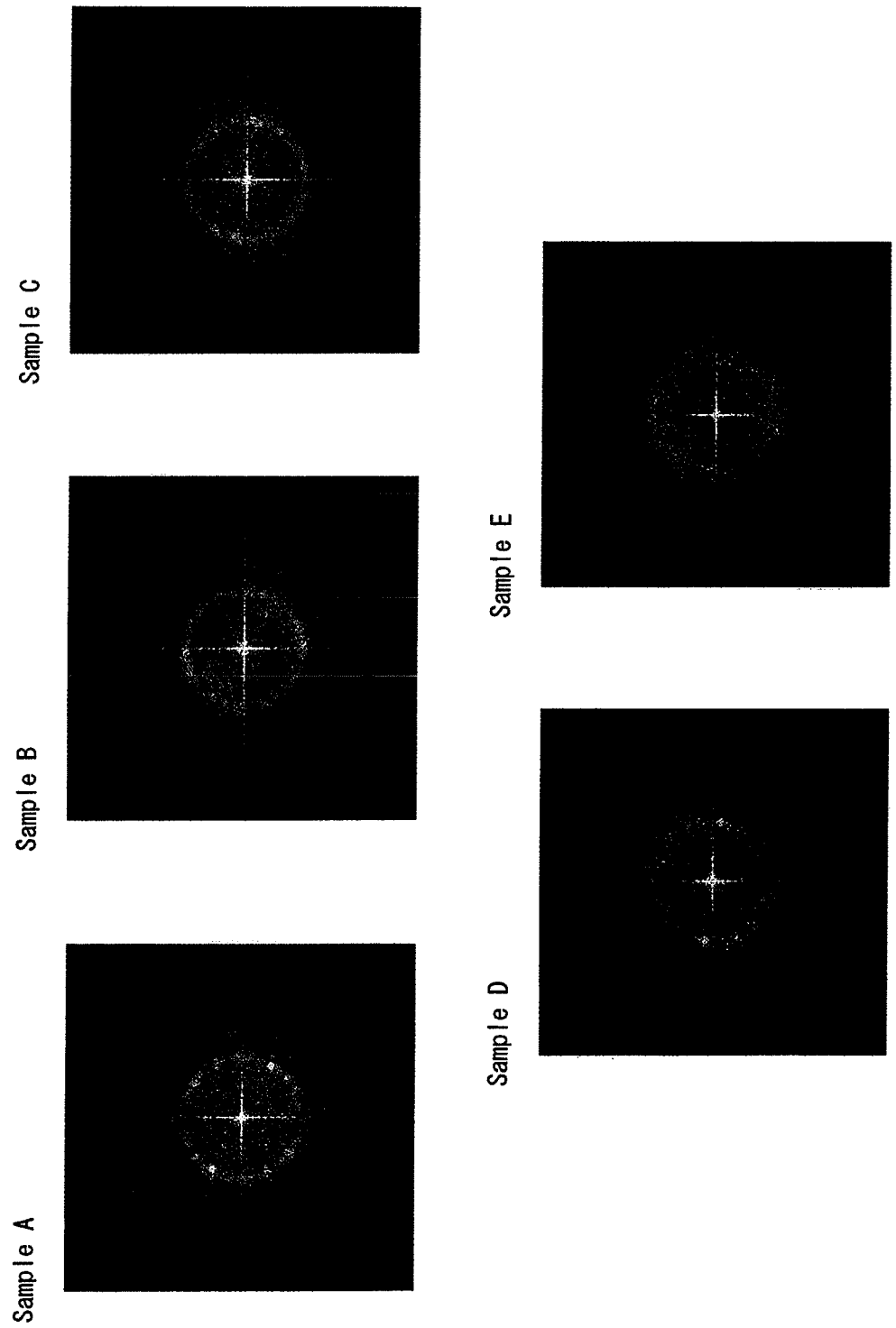
FIG. 11 shows 2D Fourier transform images for the TEM photographs shown in FIG. 10.

FIG. 11 shows 2D Fourier transform images indicating the results of a 2D Fourier transform on the TEM measurement photographs in FIG. 10. The 2D Fourier transform images shown in FIG. 11 have a distribution indicating a reciprocal lattice space of the TEM measurement photographs in FIG. 10. The 2D Fourier transform images in FIG. 11 were created by performing a Fourier transform on the TEM photographs of FIG. 10 using LAview Version #1.77, which is image processing software. In the Fourier transform images in FIG. 11, a bright region formed by two or three concentric circles centering on a center point of the Fourier transform images appears for samples A, B, C, and D. While a bright region formed by concentric circles in the Fourier transform image can be confirmed for samples A, B, C, and D, an unclear circle appears in sample E. The lack of clarity of the bright region formed by concentric circles indicates a qualitative loss of order in the structure of the hole injection layer 4 in FIG. 10. In other words, samples A, B, C, and D, for which a bright region formed by concentric circles can be confirmed, are highly ordered, whereas sample E exhibits a loss of order.

Next, graphs showing the change in luminance vs. the distance from the center point of the image to the outer edge were created from the 2D Fourier transform images in FIG. 11. FIGS. 12A and 12B show an outline of the method of creating the graphs, using sample A as an example.

As illustrated in FIG. 12A, the Fourier transform image was rotated 1° at a time around the center point, and the luminance versus the distance from the center point of the Fourier transform image to the outer edge of the photograph along the X-axis was measured. The Fourier transform image was rotated from 0° to 359°, and the distance from the center point of the Fourier transform image (horizontal axis) and the normalized luminance of the Fourier transform image (vertical axis) were integrated over each 1° rotation of the Fourier transform image and divided by 360 to yield the graph shown in FIG. 12B. Microsoft Office Picture Manager was used to rotate the images, and the image processing software ImageNos was used to measure the distance from the center point and the luminance of the Fourier transform image. Hereinafter, the plot rendered using the method described with reference to FIGS. 12A and 12B is referred to as a "plot of change in luminance".

FIGS. 13 and 14 illustrate the plots of change in luminance for samples A, B, C, D, and E. The plots of changes in luminance for samples A, B, C, D, and E clearly evidence a peak, labeled P1, other than a high luminance region at the center point of each sample. Hereinafter, the peak of the normalized luminance appearing nearest the center point in the plot of change in luminance is referred to as a "peak P1". Furthermore, as compared to the peak P1 in sample E, the peak P1 in samples A, B, C, and D has a sharply convex structure.

Next, the sharpness of the peak P1 in samples A, B, C, D, and E was assessed. FIGS. 15A and 15B show an outline of the method of assessment, using samples A and E as examples.

FIGS. 15A and 15B are plots of change in luminance for samples A and E respectively. In FIGS. 15A and 15B, (a1) and (b1) are enlarged diagrams of the peak P1 and the surrounding region in each sample. The "peak width L of the peak P1", indicated by "L" in (a1) and (b1) of FIGS. 15A and 15B, is used as an index of how "pointed" the peak P1 is.

In order to more accurately determine this "peak width L of the peak P1", the first derivative of the plot in (a1) and (b1) in FIGS. 15A and 15B is shown in (a2) and (b2) in FIGS. 15A and 15B. In (a2) and (b2) in FIGS. 15A and 15B, the peak width L is the difference between the value along the horizontal axis corresponding to the peak top of the peak P1 and the value along the horizontal axis, in the direction of the center point from the peak, corresponding to the position at which the derivative first becomes zero. Table 6 shows the values of the peak width L in samples A, B, C, D, and E, with the distance along the horizontal axis between the center point in the Fourier transform image and the peak top of the peak P1 normalized as 100.

TABLE 6

| Name of Sample | Peak Width L |
|---|---|
| Sample A | 16.7 |
| Sample B | 18.1 |
| Sample C | 21.3 |
| Sample D | 21.9 |
| Sample E | 37.6 |

As illustrated in Table 6, the peak width L is the smallest in sample A and increases in order in samples B, C, and D, reaching its maximum value in sample E. Furthermore, in samples C and D, while the value of the peak width L was not as high as sample A, good hole conduction was confirmed even at a value of approximately 21.9.

The values of the peak width L listed in Table 6 indicate the clarity of the bright region formed by the concentric circle closest to the center point in the Fourier transform images of FIG. 11. As the value of the peak width L decreases, the extent of the bright region formed by concentric circles is smaller, indicating a greater level of regularity in the TEM photograph of the hole injection layer 4 in FIG. 10. Conversely, as the value of the peak width L is larger, the extent of the bright region formed by the concentric circle closest to the center point in the Fourier transform images of FIG. 11 is larger, indicating a loss of regularity in the microstructure in the TEM photograph of the hole injection layer 4 in FIG. 10.

As described with reference to FIG. 9, the basic structure of a single crystal tungsten oxide consists of periodically ordered connections of octahedrons. A nanocrystal structure is formed by a number of such single crystals, i.e. nanocrystals. Because the inside of these nanocrystals has a high level of regularity, it can be concluded that tungsten atoms with a valence of five are found not within nanocrystals, but rather along the surface of nanocrystals.

Based on the results of Tables 5 and 6, as the level of regularity in the film structure of the tungsten oxide layer decreases, the ratio of tungsten atoms with a valence of five clearly decreases. The reasons for this relationship are considered to be as follows.

In the tungsten oxide layer manufactured under film forming conditions E, the above-described nanocrystals may exist, but most of the film is considered to be an amorphous structure. In the amorphous structure, most octahedrons are connected to each other throughout the film, though nonperiodically and disorderly. Only a few discontinuities exist along the sequence of octahedron connections, so there are few grain boundaries which can contain oxygen vacancies, resulting in a low ratio of tungsten atoms with a valence of five. Consequently, the film lacks locations that become hole conduction paths, making driving at a low voltage difficult. On the other hand, in the tungsten oxide layer manufactured under film forming conditions A through D, the nanocrystals lie next to each other throughout the entire film, constituting the sequence of nanocrystal surfaces/interfaces. Because the periodically ordered octahedron connections in the nanocrystals end at their surfaces/interfaces, there exist tungsten atoms with a valence of five on the surfaces/interfaces, and they act as hole conduction paths, allowing for driving at low voltage.

(Analysis of Hole Conduction of Injected Holes)

As described above, the basic structure of a single crystal tungsten oxide consists of periodically ordered connections of octahedrons. When the film is formed from octahedron connections without order and periodicity, an amorphous structure results, whereas forming the film from octahedron connections with order and periodicity results in a nanocrystal structure.

When tungsten atoms with a valence of five are present in the tungsten oxide layer, the tungsten atoms are considered to form a structure with a lone pair of electrons when one of the oxygen atoms in octahedral coordination with a tungsten atom is lost. In other words, it is thought that a tungsten atom with a valence of five supplies a hole with its own lone pair of electrons, so that the tungsten atom with a valence of five that supplied the lone pair of electrons has a hole. Due to the bias voltage applied to the hole injection layer, this provision of an electron from a lone pair of electrons existing in a tungsten atom with a valence of five is thought to occur continuously, leading to hole conduction in which holes move in the direction of lower electric potential and electrons move in the direction of higher electric potential. Accordingly, as more tungsten atoms with a valence of five are included, more tungsten atoms contribute to hole conduction, thus increasing the hole conduction efficiency. The inclusion of numerous tungsten atoms with a valence of five, however, is not a sufficient condition for improving hole conduction properties. The reasons for this are described with reference to FIGS. 16A and 16B.

Figure 16A:
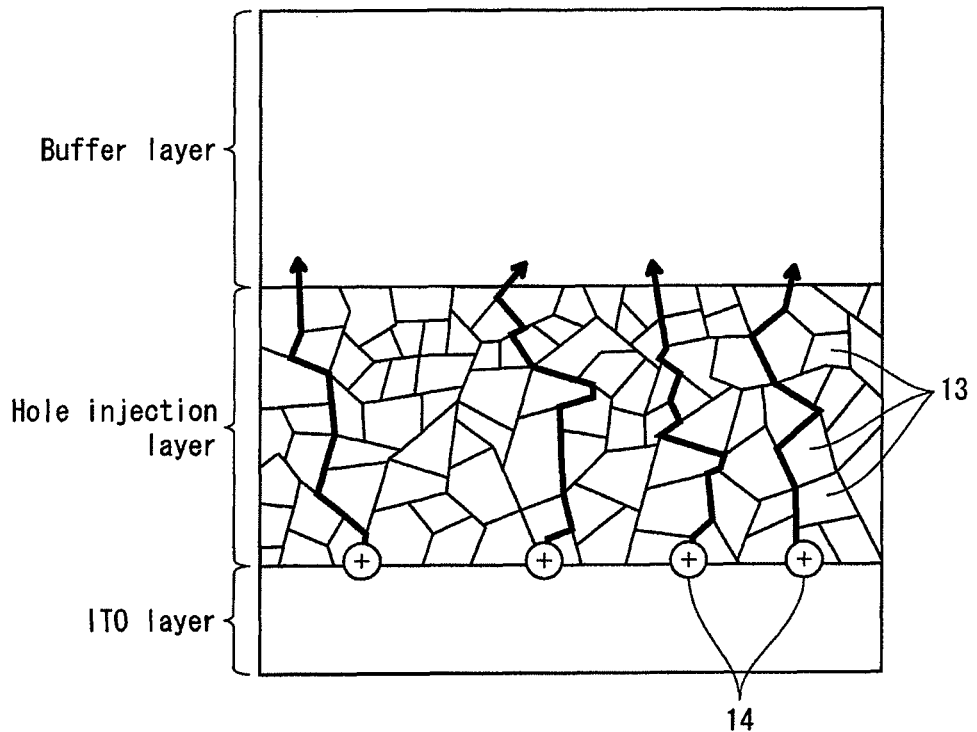
FIG. 16A is a diagram schematically illustrating hole conduction when a tungsten oxide layer has a nanocrystal structure.
Figure 16B:
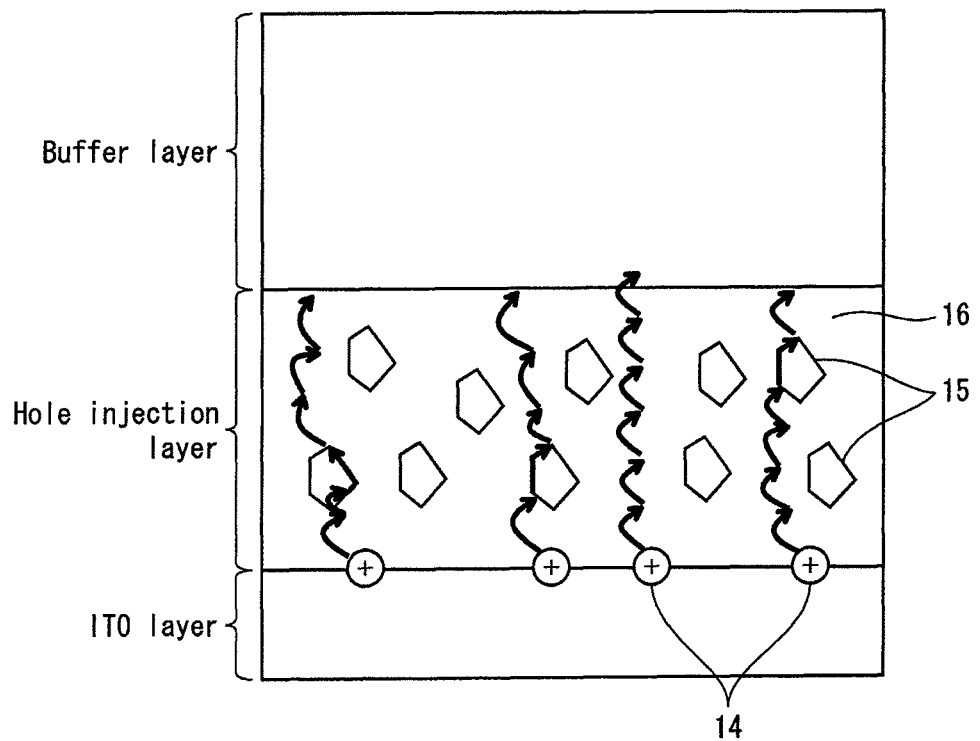
FIG. 16B is a diagram schematically illustrating hole conduction when a tungsten oxide layer has an amorphous structure.

FIG. 16B is a conceptual diagram of conduction of holes 14 by hopping conduction, illustrating conduction of holes 14 through an amorphous structure. In the amorphous structure illustrated in FIG. 16B, the portions labeled 11 are crystals with a well-ordered rutile structure (segregated crystals 15). Numerous tungsten atoms with a valence of five are found along the surface of the segregated crystals 15. On the other hand, region 16 excluding the segregated crystals 15 is an amorphous portion in which rutile structures are not well ordered. Not as many tungsten atoms with a valence of five exist as along the surface of the segregated crystals 15. In the amorphous structure, although tungsten atoms with a valence of five exist along the surface of the segregated crystals 15, the orbital of a tungsten atom with the valence of five does not overlap with the orbital of another nearby tungsten atom with a valence of five. Therefore, the holes 14 are thought to be conducted by hopping between tungsten atoms with a valence of five. In other words, in an amorphous structure, tungsten atoms with a valence of five are separated by a long distance. In order to exchange holes between tungsten atoms with the valence of five, which act as hole conduction locations, it becomes necessary to apply an extremely high-voltage across the tungsten atoms with a valence of five, thereby increasing the driving voltage of the organic EL element.

By contrast, FIG. 16A is a conceptual diagram showing the conduction of holes 14 along the surface of nanocrystals in order to illustrate the conduction of holes 14 in the case of a nanocrystal structure. As illustrated in FIG. 16A, a nanocrystal structure contains well-ordered rutile structures, so that the entire film is composed of microscopic crystals. The resulting mode of hole conduction differs from an amorphous film. As described above, tungsten atoms with a valence of five exist along the surface of nanocrystals 13, and this surface region becomes a hole conduction region. It is considered that in a nanocrystal structure, holes 14 can be conducted at a low voltage due to the continuity of surface regions that act as hole conducting regions.

As described above, for a metal oxide film to have good hole conduction properties, it is considered exemplary (1) for portions acting as hole conduction regions to exist, and (2) to increase the number of crystal interfaces in order for electron orbitals contributing to hole conduction to overlap. In other words, a metal oxide film 1) that includes metal atoms with a lower valence than the maximum possible valence of the metal atoms and 2) that has a nanocrystal structure can be considered as having a good structure for hole conduction.

Next, it is described how the effect of improving hole conduction properties is the dominating factor behind achieving a low driving voltage by using tungsten oxide with a nanocrystal structure that includes a low valence. Reduction of driving voltage can also be realized by reducing the hole injection barrier at the interface between the ITO layer 3 and the hole injection layer 4, and by reducing the hole injection barrier at the interface between the hole injection layer 4 and the buffer layer 6A. Here, the hole conduction energy was analyzed by UPS measurement of tungsten oxide layers manufactured in the same way as the hole injection layer 4 in BPD-D and BPD-E, shown in Table 3, which have different hole injection characteristics. As shown in FIG. 4, at a current density of 10 mA/cm$^2$, a difference of approximately 2 V in the driving voltage was confirmed between BPD-D and BPD-E, yet no difference in the hole conduction energy was observed by UPS. In other words, the difference in hole injection voltage between BPD-D and BPD-E was not caused by the hole injection barrier at the interface between the ITO layer 3 and the hole injection layer 4, nor by the hole injection barrier at the interface between the hole injection layer 4 and the buffer layer 6A. Rather, the difference was confirmed to derive from the film structure of the hole injection layer, as described above.

(Film Thickness Reduction of Hole Injection Layer)

When checking the hole-only devices HOD-A through HOD-E prepared in the above experiment, the inventors found that, upon completion of the hole-only devices HOD-A through HOD-E, the thickness of the hole injection layer included therein has decreased compared to immediately after the forming of the hole injection layer (the reduction in the thickness of the hole injection layer is referred to hereinafter as "film thickness reduction"). Confronting such a situation, the inventors made an assumption that this film thickness reduction of the hole injection layer takes place during the processing of forming the banks. Based on such an assumption, the inventors conducted a confirmation experiment as described in the following so as to investigate the cause of the film thickness reduction of the hole injection layer.

In specific, the inventors prepared hole-only devices HOD-a through HOD-c for the experiment. Each of the hole-only devices was prepared by forming a film composed of tungsten oxide, which is to become the hole injection layer, on a glass substrate by sputtering. In the following, the hole-only devices HOD-a, HOD-b, and HOD-c are respectively referred to as samples a, b, and c. The film forming conditions under which each of the samples a, b, and c were formed are as indicated in Table 7. The only difference between the film forming conditions under which sample a was formed and the film forming conditions A shown in Table 1 is a slight difference in total pressure; otherwise, these conditions are approximately the same.

TABLE 7

| Name of Sample | Sample a | Sample b | Sample c |
|---|---|---|---|
| Total Pressure (Pa) | 4.8 | 2.7 | 2.7 |
| Ar:O$_2$ | 100:100 | 43:100 | 43:100 |
| Input Power Density (W/cm$^2$) | 1.50 | 3.00 | 6.00 |
| Film Density (g/cm$^3$) | 5.43 | 6.09 | 6.33 |
| Film Thickness Reduction Amount (nm) | 57.7 | 25 | 20.9 |

Figure 17:
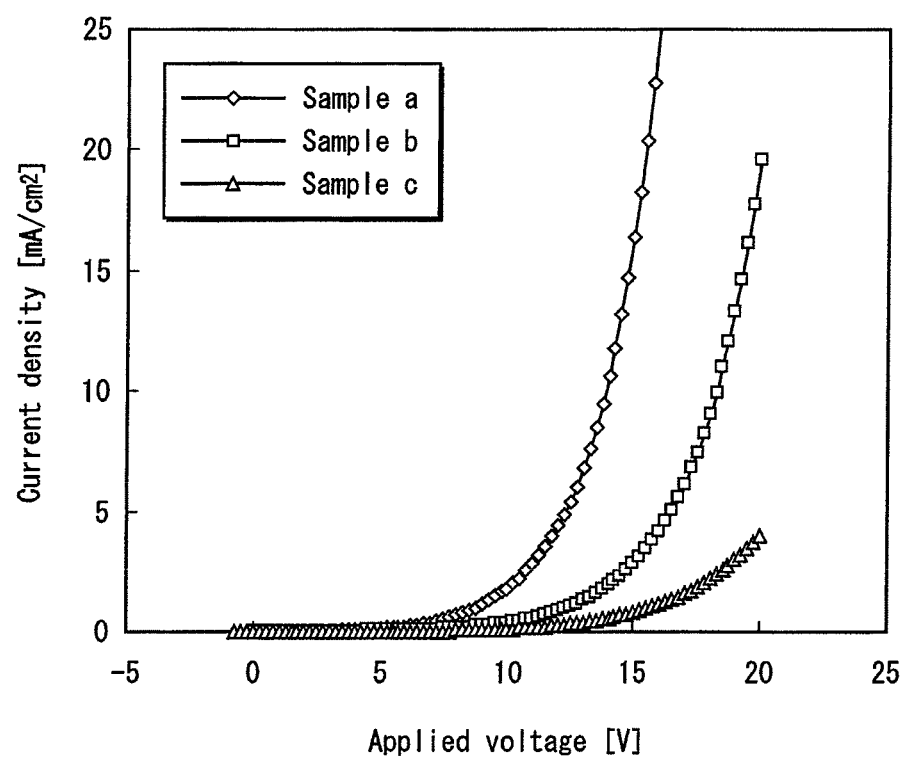
FIG. 17 is a device characteristics diagram of relation curves each illustrating a relation between applied voltage and current density of a hole-only device.

The completed samples a through c were then connected to the direct current power supply DC and voltage was applied thereto. Furthermore, by changing the applied voltage, an electric current value per unit surface area (current density) was calculated for different voltages. FIG. 17 is a device characteristics diagram showing relation curves each illustrating a relation between applied voltage and current density of a prepared sample. In FIG. 17, the vertical axis indicates current density (mA/cm$^2$), whereas the horizontal axis indicates applied voltage (V). As shown in FIG. 17, the driving voltage is lowest for sample a, and increases in the order of sample b and sample c. This indicates that the hole conduction efficiency of the hole injection layer is highest in sample a, and decreases in the order of sample b and sample c. Further, according to embodiment 1, the quantity, in the hole injection layer, of tungsten atoms with a valence of five increases in the order of sample a, sample b, and sample c.

Subsequently, the inventors formed a resin material layer composed of a predetermined resin material ("TFR" series resin material produced by Tokyo Ohka Kogyo Co., Ltd.) so as to be layered on the hole injection layer of each sample by applying the spin coating method (room temperature, 2500 rpm/25 sec) and by performing baking (100° C., 90 sec). Following this, development processing (where a solution including 2.38% TMAH was used and where the developing time was 60 sec) and cleaning processing (where pure water was used and where the cleaning time was 60 sec) were performed. Successively, the resin material layer having been layered on the hole injection layer was removed. The forming of the resin material layer, the development processing, and the cleaning processing were performed so as to simulate the actual process of forming the banks.

Figure 18:
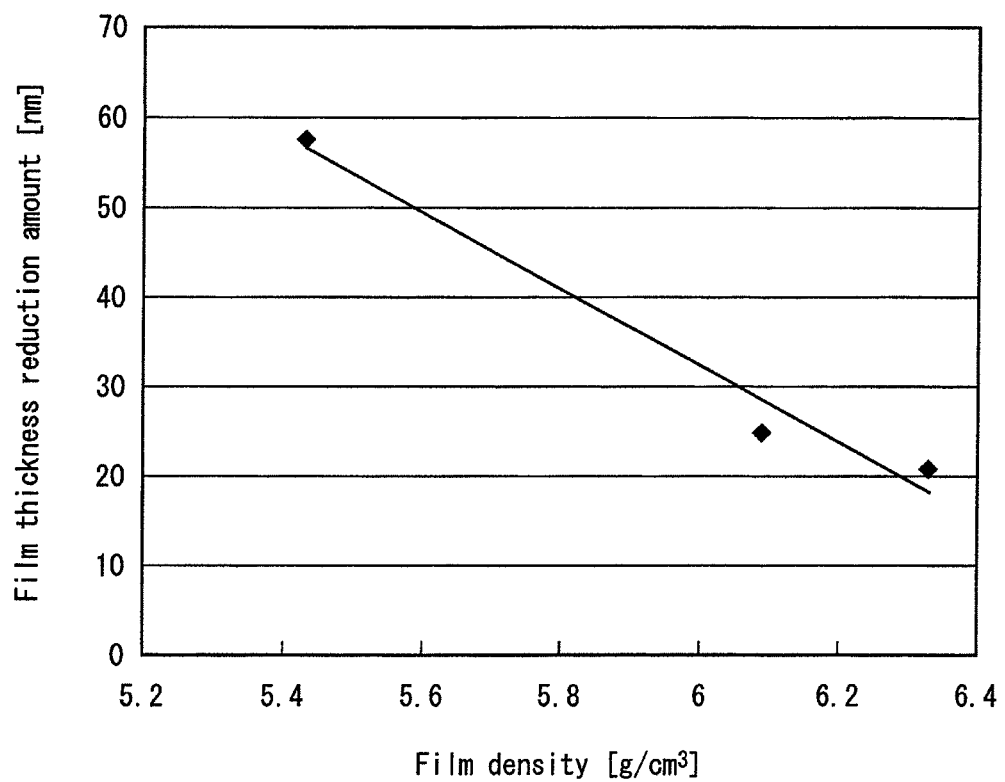
FIG. 18 is a graph illustrating a relation between film thickness reduction amount and film density of a tungsten oxide layer constituting a hole injection layer.

Table 7 indicates the film forming conditions applied and the results of the experiment. Further, FIG. 18 illustrates a graph indicating a relation between the film densities and the film thickness reduction amounts in Table 7.

As is indicated by the experiment results presented in Table 7, the film thickness of the tungsten oxide layer in sample a, which was 80 nm at a point immediately following the forming thereof, decreased to 23 nm by the end of the experiment.

As such, it was observed that the film thickness of the tungsten oxide layer in sample a decreased by as much as approximately 57 nm due to occurrence of the film thickness reduction.

Further, the inventors also found that there was a considerable level of correlation between an amount of a tungsten oxide layer decreasing as a result of the film thickness reduction (hereinafter referred to as a "film thickness reduction amount") and a film density of the tungsten oxide layer. More specifically, the inventors found that, when a tungsten oxide layer had a relatively low film density, the film thickness reduction amount of the tungsten oxide layer indicated a relatively great value. Further, when taking into consideration the results indicated in FIG. 17, a higher hole conduction efficiency of the tungsten oxide layer, or that is, a greater quantity of tungsten atoms with a valence of five included in the tungsten oxide layer results in the tungsten oxide layer having lower film density and a greater film thickness reduction amount. The reasons for this are described with reference to FIGS. 19A and 19B.

Figure 19A:
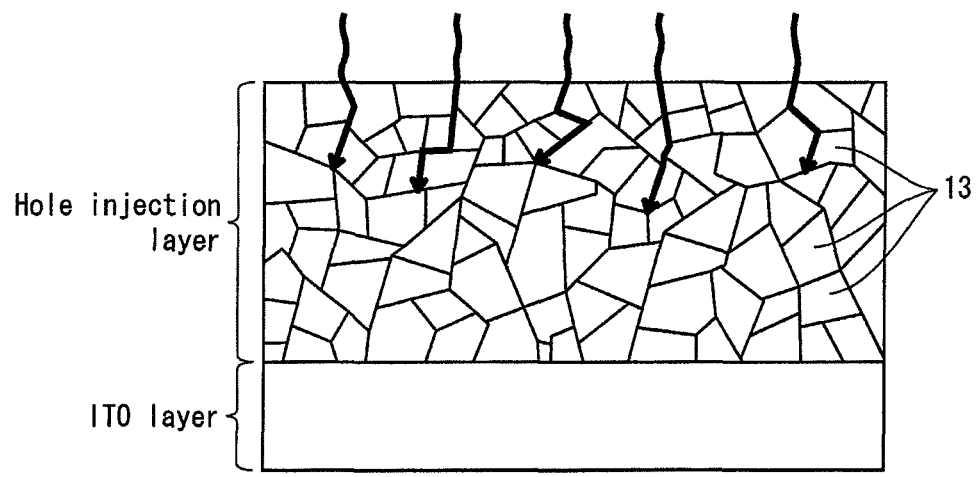
FIGS. 19A and 19B are schematic diagrams each illustrating a relation between a film structure and a film density of a tungsten oxide layer constituting a hole injection layer.
Figure 19B:
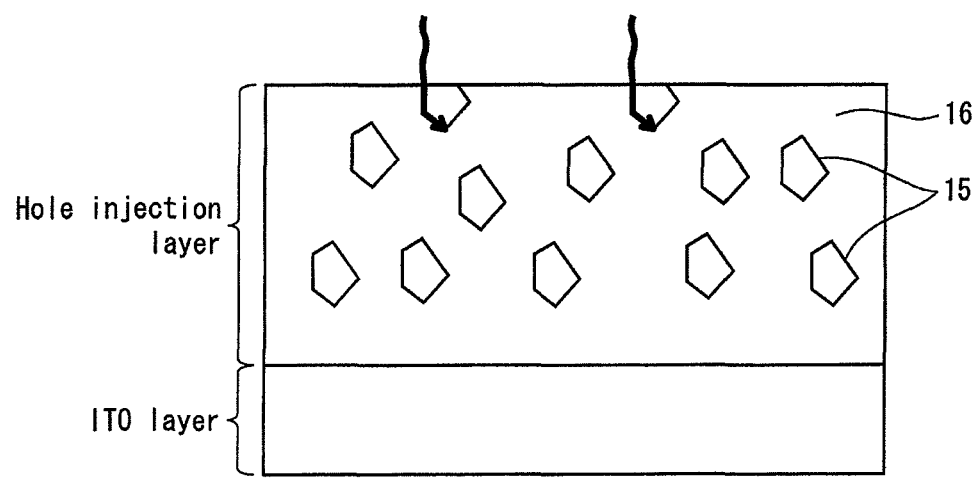

FIGS. 19A and 19B are schematic diagrams each illustrating a relation between a film structure and a film density of a tungsten oxide layer constituting a hole injection layer. Note that the schematic diagram in each of FIGS. 19A and 19B illustrates a state following the forming of the hole injection layer and before the forming of the banks. More specifically, FIG. 19A is a schematic diagram of the hole injection layer corresponding to a case where the tungsten oxide layer is formed to have the nanocrystal structure, or that is, a case where the hole injection layer has high hole conduction efficiency. In contrast, FIG. 19B is a schematic diagram of the hole injection layer corresponding to a case where the tungsten oxide layer is formed to have the amorphous structure (not all portions of the tungsten oxide layer have the amorphous structure, but tungsten oxide crystals exist in a segregated state in only some portions of the tungsten oxide layer), or that is, a case where the hole injection layer has low hole conduction efficiency.

When the hole injection layer is formed to have the nanocrystal structure (FIG. 19A), crystal surfaces of the nanocrystals 13 spread over the entire hole injection layer, and needless to say, crystal surfaces of the nanocrystals 13 spread along a surface of the hole injection layer on which banks are to be formed, which accordingly becomes an interface between the hole injection layer and the banks. When the hole injection layer, in the above-described state, is exposed to the dissolution liquid (a developing solution, a cleaning liquid, etc.) used in the process of forming the banks, the dissolution liquid permeates the hole injection layer via the crystal surfaces of the nanocrystals 13 present at the surface of the hole injection layer on which the banks are to be formed, which accordingly becomes the interface between the hole injection layer and the banks, as indicated by the arrows in FIG. 19A. This is because the spaces between the crystal surfaces of neighboring nanocrystals 13 serve as gaps through which the dissolution liquid is able to permeate the hole injection layer. Furthermore, since the crystal surfaces of the nanocrystals 13 are literally extremely "microscopic", the dissolution liquid is able to permeate the hole injection layer through an increased number of paths. As such, the film thickness reduction amount of the hole injection layer increases when the hole injection layer is formed to have the nanocrystal structure. In addition, gaps exist between the crystal surfaces of the nanocrystals 13 in a film having the nanocrystal structure, which results in the film having relatively low film density.

On the other hand, when the hole injection layer has the amorphous structure (FIG. 19B), the segregated crystals 15 are present at only some portions of the hole injection layer. Therefore, as indicated by the arrows in FIG. 19B, only a small number of crystal surfaces exist, which serve as permeation paths through which the dissolution liquid is able to permeate the hole injection layer. In addition, since the crystal surfaces are in a discontinuous state in an amorphous portion 16, it is less likely that the dissolution liquid permeates the hole injection layer to reach a relatively deep part of the hole injection layer (to the bottom direction in the figure) compared to the case where the hole injection layer has the nanocrystal structure. As such, it can be assumed that the film thickness reduction amount of the hole injection layer having the amorphous structure is smaller than the film thickness reduction amount of the hole injection layer having the nanocrystal structure. In addition, since a relatively small number of crystal surfaces are present in the film having the amorphous structure, a relatively small number of gaps exist in the film. As such, the film having the amorphous structure has relatively high film density.

From the experiment results presented above, it has been found that the film thickness reduction amount resulting from the film thickness reduction caused by the dissolution liquid used in the forming of the banks increases as the hole conduction efficiency of the tungsten oxide layers, having been assessed in embodiment 1, increases.

In the meantime, it would be generally considered that the occurrence of the film thickness reduction of a tungsten oxide layer as described above leads to difficulty in the management of the film thickness, and further, leads to a risk of the hole conduction efficiency of the hole injection layer, upon completion of an organic EL element including the hole injection layer, being affected in some way. As such, it can be assumed that, if a person skilled in the art should recognize the problem of the film thickness reduction of the hole injection layer as described above, the person skilled in the art would hesitate to use tungsten oxide for forming the hole injection layer.

However, the inventors, though much devotion and consideration, have found that the film thickness reduction amount of a tungsten oxide layer can be adjusted, for example, by changing the conditions according to which developing is performed (reducing the concentration of a developing solution to be used in the developing from 2.38% to around 0.2%) or by making appropriate changes to the conditions under which baking is performed. By making such adjustments, the film thickness of the tungsten oxide layer can be controlled while taking into consideration the film thickness reduction. As such, the inventors conducted further consideration concerning how a sample of an organic EL element having a higher level of practicability can be manufactured while relying upon the above-described technology pertaining to the adjustment of the film thickness reduction amount of a hole injection layer, and as a result, have confirmed the technical matters as presented in the following.

As the first step in manufacturing a sample of an organic EL element having a higher level of practicability, the inventors formed a hole injection layer including tungsten oxide on an anode. Subsequently, the inventors disposed a bank material layer so as to be layered on the hole injection layer, and then, performed patterning with respect to the bank material layer so as to provide the bank material layer with a predetermined shape including an opening for forming a functional layer (at this point, exposure, development, and cleaning are each performed). Subsequently, the inventors formed the functional layer at a position corresponding to the above-described opening. Finally, the inventors formed a cathode on the functional layer.

Here, by focusing on a recessed portion of the hole injection layer, which is surrounded by an inner bottom surface and an inner side surface, the inventors arrived at the conception that, by applying ink material for forming the functional layer to an entire inner surface of the recessed portion, the wettability of the functional layer can be enhanced, which results in the functional layer being formed so as to have excellent characteristics.

As such, the inventors arrived at a structure of an organic EL element where, within an area of the hole injection layer defined by banks, a surface of the hole injection layer facing the functional layer has a recessed structure, and further, the recessed structure has a recessed portion whose inner surface is in contact with the functional layer, as description is provided in embodiment 2 presented in the following.

In the following, description is provided on embodiment 2 while focusing on aspects differing from embodiment 1.

Embodiment 2

Overall Structure of Organic EL Element 100

Figure 20:
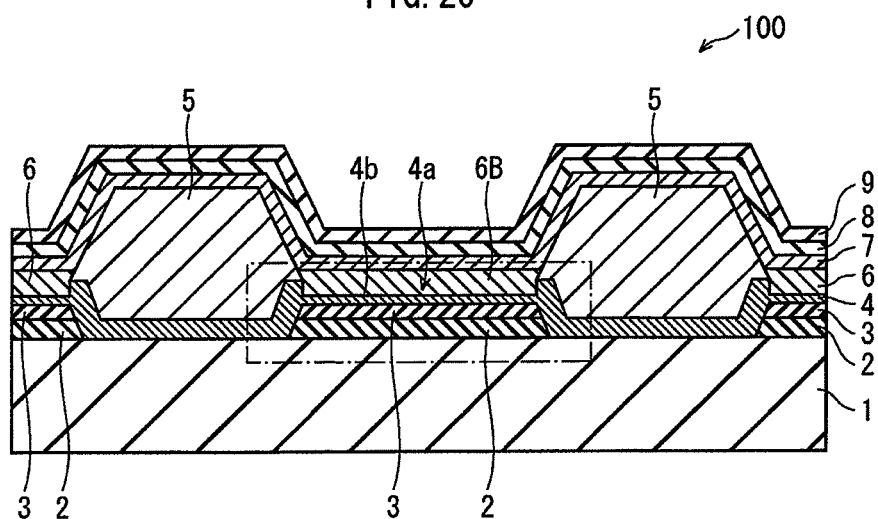
FIG. 20 is a schematic view illustrating a layered state of layers of an organic EL element 100 pertaining to embodiment 2.
Figure 21:
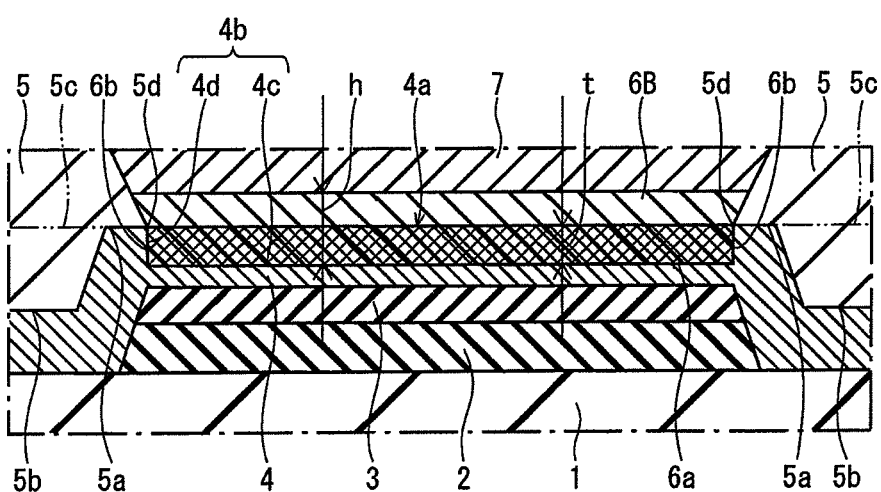
FIG. 21 is an enlarged view of a part surrounded by dashed-dotted lines in FIG. 20.

FIG. 20 is a schematic view illustrating a layered state of layers of an organic EL element 100 pertaining to embodiment 2. FIG. 21 is an enlarged view of a part surrounded by dashed-dotted lines in FIG. 20.

As illustrated in FIG. 20, the organic EL element 100 pertaining to embodiment 2 is a top emission type organic EL element in which pixels corresponding to the colors R, G, and B are arranged so as to form lines or to form a matrix. Further, each pixel has a layered structure where various layers are layered above the substrate 1.

As illustrated in FIG. 20, the organic EL element 100 pertaining to the present embodiment differs from the organic EL element 1000 pertaining to embodiment 1 in that the buffer layer 6A, which is included in the organic EL element 1000, is not included therein. In the following, the material for forming each of the layers of the organic EL element 100 pertaining to the present embodiment is similar to the material for forming the corresponding layer in embodiment 1 unless otherwise stated.

On the substrate 1, the anode 2 is formed so as to form lines or to form a matrix. On the anode 2, the ITO layer 3 and the hole injection layer 4 are layered in the stated order. Note that, while the ITO layer 3 is layered only on the anode 2, the hole injection layer 4 is formed not only above the anode 2 but also across an entire upper surface of the substrate 1.

On the hole injection layer 4, banks 5 that define pixels are formed, and in a region defined by the banks 5, the light-emitting layer 6B is disposed. Furthermore, on the light-emitting layer 6B, the electron injection layer 7, the cathode 8, and the sealing layer 9 are formed so as to extend over the regions defined by the banks 5 to be continuous between adjacent pixels.

Each of the regions defined by the banks 5 has a multi-layer structure in which the ITO layer 3, the hole injection layer 4, the light-emitting layer 6B, and the electron injection layer 7 are layered in the stated order, thereby forming the functional layer. Note that, the functional layer may include other layers such as the hole transport layer and the electron transport layer.

<Constituent Components of Organic EL Element 100>

The anode 2 has a single layer structure in the organic EL element 100 and is composed of Ag (silver). Note that the anode 2 may be formed with APC (alloy of silver, palladium, and copper), ARA (alloy of silver, rubidium, and gold), MoCr (alloy of molybdenum and chromium), NiCr (alloy of nickel and chromium), etc. In the case of a top emission type organic EL element, for example, the anode 2 be formed with a light-reflective material.

The ITO layer 3 is interposed between the anode 2 and the hole injection layer 4, and has the function of enhancing the bonding between the anode 2 and the hole injection layer 4.

The hole injection layer 4 is similar to that in embodiment 1, and is a layer composed of tungsten oxide (WOx) that is formed under film forming conditions yielding a hole injection layer having excellent hole conduction efficiency. The hole injection layer 4, being formed by using such a material, has liquid-philicity compared to the surfaces of the banks 5.

(Hole Injection Layer 4)

As illustrated in FIG. 21, the hole injection layer 4 extends along the bottom surfaces of the banks 5 in the direction of adjacent pixels. Also, within a region defined by the banks 5, the hole injection layer 4 has a recessed structure such that the hole injection layer 4 is lower in level than the bottom surfaces of the banks 5, and includes a recessed portion 4a (indicated with meshed hatching in FIG. 21) formed by being dissolved by a predetermined dissolution liquid. In addition, the film thickness of the hole injection layer 4 within the region defined by the banks 5 is smaller than the film thickness of the hole injection layer 4 in other regions thereof, and further, the film thickness of the hole injection layer 4 in the other regions is substantially uniform throughout the entirety of the other regions. Since the hole injection layer 4 is formed with a metal compound having liquid-philicity, an inner surface 4b of the recessed portion 4a has excellent wettability to ink. Accordingly, this allows for ink deposited with respect to the region of the hole injection layer 4 defined by the banks 5 to easily adhere to the inner surface 4b of the recessed portion 4a, and further, the possibility is higher of deposited ink remaining within the region defined by the banks 5.

Note that, the hole injection layer 4 need not have a recessed structure such that the recess portion 4a is lower in level than the entire bottom surface of the banks 5. That is, the recessed structure suffices if the recessed portion 4a is lower in level than a peripheral portion 5a of the bottom surface of the banks 5. In the present embodiment, the hole injection layer 4 has a recessed structure such that the recessed portion 4a is lower in level than the peripheral portion 5a of the bottom surface of the banks 5 but not lower than a central portion 5b of the bottom surface of the banks 5. However, the hole injection layer 4 may alternatively have a recessed structure such that, for example, by setting the central portion 5b at the same level as the peripheral portion 5a and by planarizing the bottom surface of the banks 5 as indicated by the chained double-dashed line 5c in FIG. 21, the recessed portion 4a is lower in level than the entire bottom surface of the banks 5.

The hole injection layer 4 has a recessed structure falling lower in level starting from a portion corresponding to a bottom periphery 5d of the banks 5. To be specific, a region of an upper surface of the hole injection layer 4, which is defined by the banks 5, drops lower in level in a direction substantially vertical to the upper surface of the substrate 1 from the portion corresponding to the bottom periphery 5d. When the hole injection layer 4 has a recessed structure falling lower in level starting from the portion corresponding to the bottom periphery 5d, the film thickness of the light-emitting layer 6B can be uniformed over a wide range, and as a result, the risk of irregular luminance occurring in the light-emitting layer 6B is reduced.

Figure 22:
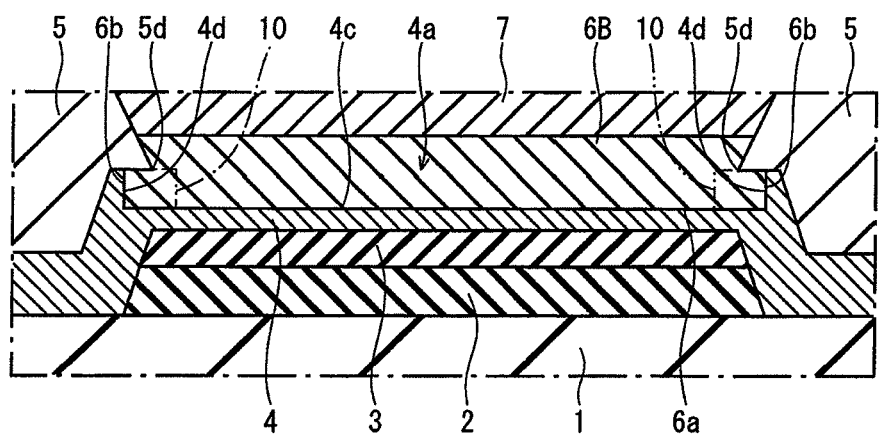
FIG. 22 is an enlarged view of the part surrounded by dashed-dotted lines in FIG. 20 in an organic EL element pertaining to a modification of embodiment 2.

Note that here, the hole injection layer 4 is not limited to having a recessed structure falling lower in level starting from the portion corresponding to the bottom periphery 5d. For instance, alternatively, the hole injection layer 4 may have a recessed structure falling lower in level starting from a portion closer to an adjacent pixel than the portion corresponding to the bottom periphery 5d of the banks 5, as illustrated in FIG. 22. Alternatively, the hole injection layer 4 may have a recessed structure falling lower in level starting from a portion closer to a central portion of the pixel than the portion corresponding to the bottom periphery 5d of the banks 5. In such a case, the recessed portion 4a has a profile as indicated by the chained double-dashed line 10 in FIG. 22.

In addition, the recessed structure of the hole injection layer 4 has a cup-like shape. To be more specific, an inner surface 4b of the recessed portion 4a is composed of an inner bottom surface 4c and an inner side surface 4d. The inner bottom surface 4c is planar and substantially parallel with the upper surface of the substrate 1, and is in contact with a bottom surface 6a of the light-emitting layer 6B. The inner side surface 4d extends from a periphery of the inner bottom surface 4c in a direction substantially perpendicular to the upper surface of the substrate 1, and is in contact with a side surface 6b of the light-emitting layer 6B. When the recessed structure has a cup-like shape as described above, the inner side surface 4d prevents ink deposited to within the recessed portion 4a from moving in a direction parallel to the upper surface of the substrate 1. Accordingly, it is possible to more stably hold deposited ink within the region defined by the banks 5. Moreover, when the recessed structure has the cup-like shape as described above, the inner surface 4b of the recessed portion 4a becomes larger in area, and a contact surface between deposited ink and the hole injection layer 4 becomes larger in area. Accordingly, it is possible to more stably hold deposited ink within the region defined by the banks 5. Therefore, patterning of the light-emitting layer 6B can be performed with high precision.

Figure 23:
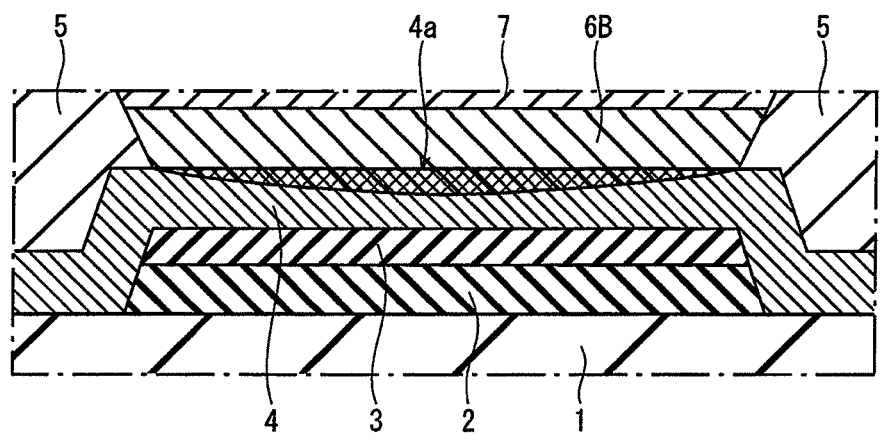
FIG. 23 is an enlarged view of the part surrounded by dashed-dotted lines in FIG. 20 in an organic EL element pertaining to a modification of embodiment 2.

Note that the hole-injection layer 4 is not limited to having a recessed structure having a cup-like shape as described above. That is, as illustrated in FIG. 23, a cross-sectional shape of the recessed portion 4a (indicated with mesh hatching in FIG. 23) may have a plate-like shape such as a substantially fan-shape and a substantially V shape.

Returning to FIG. 21, although the present disclosure does not intend to specifically specify an average depth t of the recessed portion 4a, the average depth t may be 5-100 nm, for example. If the average depth t of the recessed portion 4a is set to be equal to or greater than 5 nm, it is possible to hold a sufficient amount of deposited ink within the recessed portion 4a. Accordingly, it is possible to stably maintain deposited ink within the region defined by the banks 5. Furthermore, since the light-emitting layer 6B is formed so as to reach a periphery of the banks 5 without being repelled when the average depth t of the recessed portion 4a is set to be equal to or greater than 5 nm, short circuit between the anode 2 and the cathode 8 can be prevented.

Note that, the average depth t of the recessed portion 4a can be obtained by measuring a surface profile of the hole injection layer 4 with use of a stylus profiler meter or an AFM (Atomic Force Microscope) and calculating a difference between an average height of peak portions of the surface profile and an average height of bottom portions of the surface profile.

In the meantime, the present disclosure does not specifically specify the film thickness of the light-emitting layer 6B. However, when an average film thickness h of the light-emitting layer 6B after drying is set to be equal to or greater than 100 nm and the average depth t of the recessed portion 4a is set to be equal to or smaller than 100 nm, for example, it is possible to uniform the film thickness of the light-emitting layer 6B within the region defined by the banks 5.

Figure 24A:
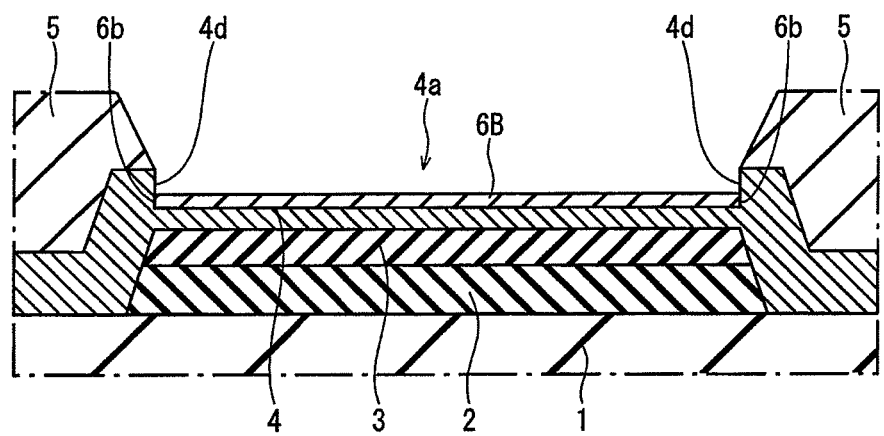
FIGS. 24A and 24B are schematic views for explaining an optimum thickness of a light-emitting layer.
Figure 24B:
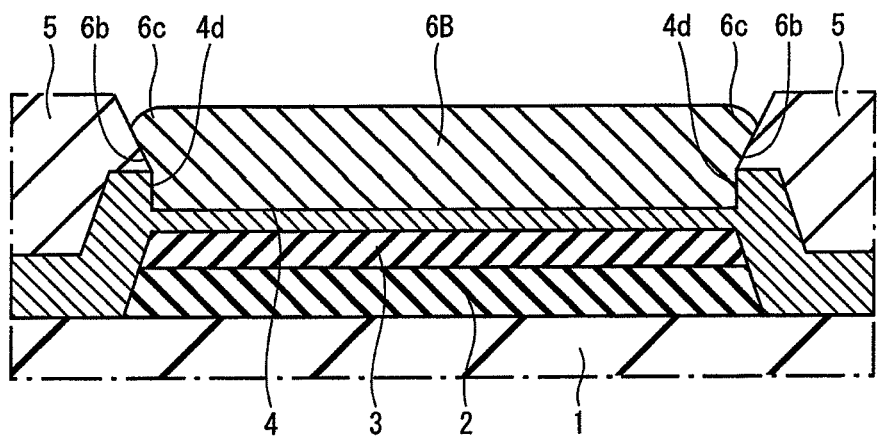

Furthermore, for example, a difference between the average film thickness h of the light-emitting layer 6B and the average depth t of the recessed portion 4a may be set to be equal to or smaller than 20 nm. When the average film thickness h of the light-emitting layer 6B is excessively smaller than the average depth t of the recessed portion 4a (for example, when $t-h>20$ nm), a portion of the inner side surface 4d of the recessed portion 4a does not come in contact with the light-emitting layer 6B (a portion onto which the light-emitting layer 6B has not been applied), as illustrated in FIG. 24A. Then a short circuit might occur between the anode 2 and the cathode 8 at that portion. On the other hand, when the average film thickness h of the light-emitting layer 6 is excessively greater than the average depth t of the recessed portion 4a (for example, $h-t>20$ nm), liquid-repellency of the banks 5 causes a film thickness of a bank vicinity portion 6c of the light-emitting layer 6B to become smaller than other portions of the light-emitting layer 6B, as illustrated in FIG. 24B. As a result, the light-emitting layer 6B is formed to have a substantially convex cross-sectional shape, which may result in unevenness in light emission caused by difference in film thickness.

Note that, the inner side surface 4d of the recessed portion 4a needs to be in contact with only at least a part of the side surface 6b of the light-emitting layer 6B. For example, as illustrated in FIG. 21 and FIG. 24B, when the average film thickness h of the light-emitting layer 6B is equal to or greater than the average depth t of the recessed portion 4a, the inner side surface 4d of the recessed portion 4a is in contact with only a lower part of the side surface 6b of the light-emitting layer 6B. On the other hand, as illustrated in FIG. 24A, when the average film thickness h of the light-emitting layer 6B is smaller than the average depth t of the recessed portion 4a, the side surface 6b of the light-emitting layer 6B is entirely in contact with the inner side surface 4d of the recessed portion 4a.

Figure 25:
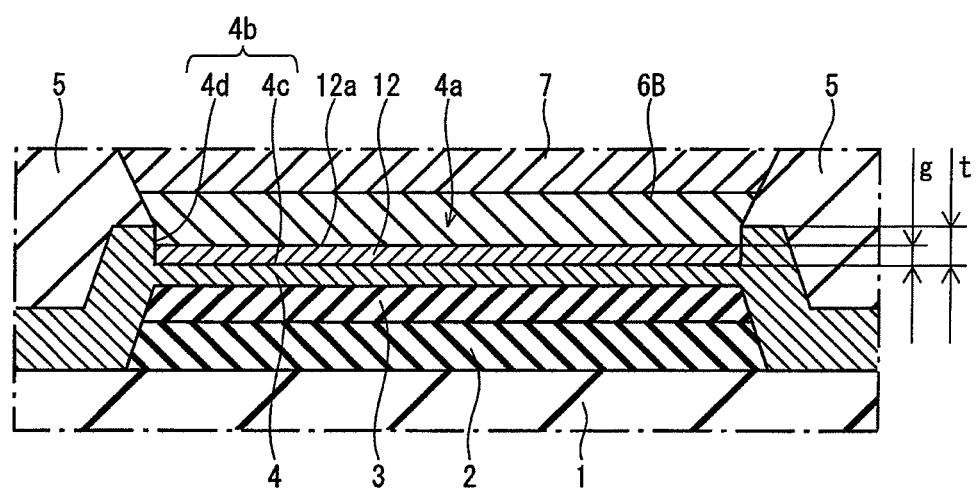
FIG. 25 is an enlarged view of the part surrounded by dashed-dotted lines in FIG. 20 in an organic EL element pertaining to a modification of embodiment 2.

As illustrated in FIG. 25, in the recessed portion 4a of the hole injection layer 4, a liquid-philic layer 12 such as an IL layer (intermediate layer), which is a hole transport layer constituting the functional layer, may be formed under the light-emitting layer 6B. In this case, ink is deposited not on the inner bottom surface 4c of the recessed portion 4a but on an upper surface 12a of the liquid-philic layer 12. Even in such a case, since the upper surface 12a of the liquid-philic layer 12 is liquid-philic, it is possible to stably hold deposited ink within the region defined by the banks 5. However, when the liquid-philic layer 12 fills the recessed portion 4a completely, the inner side surface 4d of the recessed portion 4a no longer comes into contact with deposited ink. As such, for example, an average film thickness g of the liquid-philic layer 12 may be set so as to be smaller than the average depth t of the recessed portion 4a.

The liquid-philic layer 12 is a layer having a thickness of about 10 nm to 20 nm and has a function of transporting, into the light-emitting layer 6B, holes injected from the hole injection layer 4. The liquid-philic layer 12 is formed with organic material having hole-transporting characteristics. Organic material having hole-transporting characteristics as described above refers to organic material having characteristics of conveying holes having been generated by making use of a charge transfer effect occurring between molecules. Organic material having such characteristics is also referred to as a p-type semiconductor.

The liquid-philic layer 12 may be formed with either high molecular material or low molecular material, and is formed by application of a wet printing process. In addition, for example, the liquid-philic layer 12 may include a crosslinking agent, which prevents the liquid-philic layer 12 from dissolving and flowing out into the light-emitting layer 6B formed thereon upon forming of the light-emitting layer 6B. Examples of material having hole-transporting characteristics that may be utilized include a copolymer containing a fluorene unit and a triarylamine unit, and a triarylamine derivative having low molecular weight. One example of the crosslinking agent that may be utilized is dipentaerythritol hexaacrylate. In this case, for example, the liquid-philic layer 12 may be formed with poly(3,4-ethylenedioxythiophene) doped with poly(styrenesulfonate) (PEDOT-PSS) or a derivative thereof (copolymer or the like).

The banks 5 are formed with organic material such as resin or inorganic material such as glass and has insulating properties. Examples of organic material that can be used for forming the banks 5 include: acrylic resin; polyimide resin; and novolac type phenolic resin. Examples of inorganic material that can be used for forming the banks 5 include: $SiO_2$ (silicon dioxide) and $Si_3N_4$ (silicon nitride). For example, the banks 5 may have organic solvent resistance and may have a certain level of light transparency to visible light. Further, since there are cases where the banks 5 undergo etching, baking and other similar processing, for example, the banks 5 may be formed by using a material having a high degree of resistance against such processing.

In addition, at least the surfaces of the banks 5 are provided with liquid-repellency. As such, when forming the banks 5 with liquid-philic material, it is exemplary to provide the surfaces of the banks 5 with liquid-repellency by performing a liquid-repellent treatment or the like.

Note that the banks 5 may be formed so as to form a pixel bank structure or may be formed so as to form a line bank structure. When the banks 5 are formed so as to form a pixel bank structure, the banks 5 are formed so as to surround the light-emitting layer 6B corresponding to one subpixel from all directions. On the other hand, when the banks 5 are formed so as to form a line bank structure, the banks 5 are formed so as to partition pixels by columns or by rows. Further, in a line bank structure, the banks 5 exist at both sides of the light-emitting layer 6B in either the row direction or in the column direction. When the banks 5 form a line bank structure, the light-emitting layer 6B is formed so as to be continuous in either the column direction or the row direction.

The electron injection layer 7 has a function of transporting electrons injected from the cathode 8 to the light-emitting layer 6B. For example, the electron injection layer 7 may be formed by using, for example, barium, phthalocyanine, lithium fluoride or any mixture of such materials, etc.

The cathode 8 is formed so as to have a single-layer structure by using, for example, ITO, IZO (indium zinc oxide) or the like. In the case of a top emission type organic EL element, it is desirable that the cathode 8 be formed from a light-transmissive material.

The sealing layer 9 inhibits the light-emitting layer 6B and the like from being exposed to moisture, air, etc., and is formed by using material such as SiN (silicon nitride) and SiON (silicon oxynitride). In the case of a top emission type organic EL element, it is desirable that the sealing layer 9 be formed from a light-transmissive material.

<Manufacturing Method of Organic EL Element 100>

FIGS. 26A-26D each illustrate a step in a manufacturing method of the organic EL element 100 pertaining to embodiment 2. FIGS. 27E-27H each illustrate a step, following the steps illustrated in FIGS. 26A-26D, in the manufacturing method of the organic EL element 100.

Figure 26A:
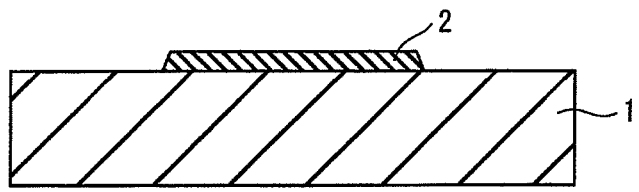
FIGS. 26A through 26D each illustrate a step in a manufacturing method of the organic EL element pertaining to embodiment 2.

In the manufacturing steps of the organic EL element 100, first, as illustrated in FIG. 26A, the anode 2 is formed so as to form lines or to form a matrix by forming a thin film of Ag on the substrate 1, for example, by sputtering and further by patterning the Ag thin film, for example, by photolithography. Alternatively, the Ag thin film may be formed by application of a vacuum deposition method or the like.

Figure 26B:
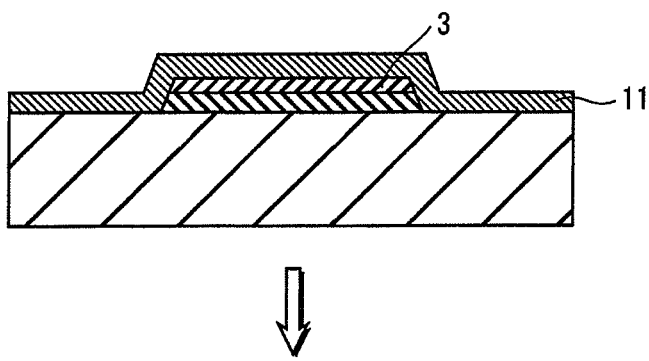

Next, as illustrated in FIG. 26B, an ITO thin film is formed by, for example, sputtering, and then the ITO layer 3 is formed by patterning the ITO thin film by photolithography, for example.

Subsequently, a thin film 11 containing a metal compound that is soluble with respect to a predetermined dissolution liquid is formed. For instance, the thin film 11 is formed by utilizing a compound containing WOx or MoWOx. In specific, by application of a vacuum deposition method or a sputtering method, the thin film 11 of WOx or MoWOx is formed so as to have uniform film thickness across an entire upper surface of the substrate 1.

Figure 26C:
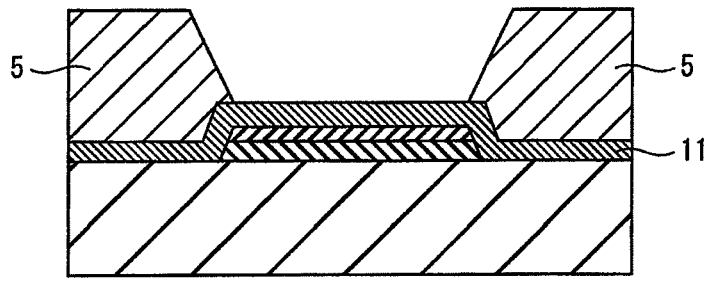

Next, as illustrated in FIG. 26C, the banks 5 are formed so as to surround each pixel region (i.e., the region at which the anode 2 is positioned), by application of, for example, photolithography. In specific, the banks 5 are formed, for example, (i) by forming, as a bank film, a resist film (for example, a resin film) including resist material as bank material on the thin film 11 by, for example, application of the resist material, (ii) forming a resist pattern on the resist film, and (iii) by removing desired portions of the resist film by etching utilizing a developing solution and thereby forming a pattern of the banks 5. Note that, when the banks 5 are formed with inorganic material, the banks 5 are formed by application of a CVD method, for example. The residuals of resist material remaining adhered on a surface of the thin film 11 after etching are removed by hydrofluoric acid, for example. Furthermore, a liquid-repellent treatment is performed with respect to the surfaces of the banks 5 as necessary.

Figure 26D:
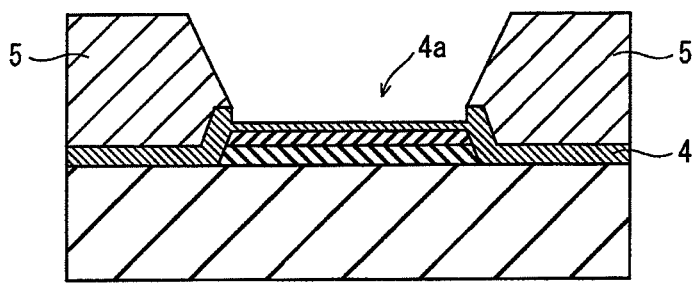

Subsequently, as illustrated in FIG. 26D, the hole injection layer 4 is formed by causing a portion of the thin film 11 to dissolve and thereby forming the recessed portion 4a. By forming the hole injection layer 4 in such a manner, the hole injection layer 4 is provided with a structure such that the region thereof defined by the banks 5 has smaller film thickness compared to other regions thereof. The forming of the recessed portion 4a is performed by, for example, causing a region of an upper surface of the thin film 11 defined by the banks 5 to dissolve with pure water during a pure water cleaning process where impurities, such as hydrofluoric acid, remaining on the surfaces of the banks 5 are removed by cleaning with pure water after the residuals of resist material have been removed. In such a case, pure water is the predetermined dissolution liquid, and it is possible to change a depth and a shape of the recessed portion 4a as necessary by changing the conditions according to which the pure water cleaning process is performed.

As for a specific method, for example, the substrate 1 is cleaned by ejecting pure water (for example, pure water at room temperature) thereon, while being kept in a rotating-state by a spin coater. Subsequently, while the substrate 1 is kept in the rotating-state, the ejection of pure water is stopped, and accordingly, the pure water is drained off from the substrate 1. In such a case, it is possible to change the depth and the shape of the recessed portion 4a by changing a time period during which pure water is ejected onto the substrate 1. In addition, since the speed at which the thin film 11 dissolves also changes according to the temperature of pure water, it is also possible to adjust the depth and the shape of the recessed portion 4a by changing the temperature of pure water ejected.

The method utilized for forming the recessed portion 4a is not limited to the above-described method. For example, the recessed portion 4a may be formed by causing a portion of the thin film 11 to dissolve to a cleaning liquid such as pure water while the residuals of resist adhering onto the surface of the thin film 11 are being removed by utilizing the cleaning liquid after the banks 5 have been formed. In such a case, the cleaning liquid is the predetermined dissolution liquid. In addition, the recessed portion 4a may be formed by causing a portion of the thin film 11 to dissolve to a developing solution while the banks 5 are formed by etching the resist film by using the developing solution and the residuals of resist adhering onto the surface of the thin film 11 are being removed by utilizing the developing solution. In such a case, the developing solution is the predetermined dissolution liquid.

When the hole injection layer 4 is formed by dissolving the thin film 11 with use of a dissolution liquid such as the cleaning liquid and the developing solution that are used in the bank forming process, the forming of the hole injection layer 4 can be performed with a high degree of efficiency since there is no need to utilize a different predetermined dissolution liquid for forming the recessed portion 4a, and further, since there is no need to perform an additional process for forming the recessed portion 4a.

Note that the recessed portion 4a is not limited to being formed by using the predetermined dissolution liquid. For instance, the recessed portion 4a may be formed by first forming a thin film made of WOx or MoWOx by sputtering and photolithography at all regions other than the region at which the anode 2 is arranged, and then forming another thin film made of WOx or MoWOx so as to cover all regions. As such, the hale injection layer 4 having a recessed shape at the region at which the anode 2 is arranged is formed.

Next, as illustrated in FIG. 27E, the light-emitting layer 6B is formed by depositing drops of ink according to, for example, an inkjet method in the region defined by the banks 5, applying the ink along the inner bottom surface 4c and the inner side surface 4d of the hole injection layer 4, and then drying the ink. Note that the depositing of ink may be performed according to other methods such as a dispenser method, a nozzle coating method, a spin coating method, intaglio printing, and relief printing.

Subsequently, as illustrated in FIG. 27F, a thin film of barium, which is to become the electron injection layer 7, is formed, for example, by vacuum deposition. Then as illustrated in FIG. 27G, a thin film of ITO, which is to become the cathode 8, is formed by, for example, sputtering. Successively, as illustrated in FIG. 27H, the sealing layer 9 is formed.

Embodiment 3

An organic EL element 100A pertaining to embodiment 3 differs greatly from the organic EL element 100 pertaining to embodiment 2 in that the ITO layer is not formed under the hole injection layer and that a protection film is formed on the hole injection layer. In the following, description is provided while focusing on aspects differing from embodiment 2 and while simplifying or omitting description concerning aspects that are similar to embodiment 2.

<Structure of Organic EL Element 100A>

Figure 28:
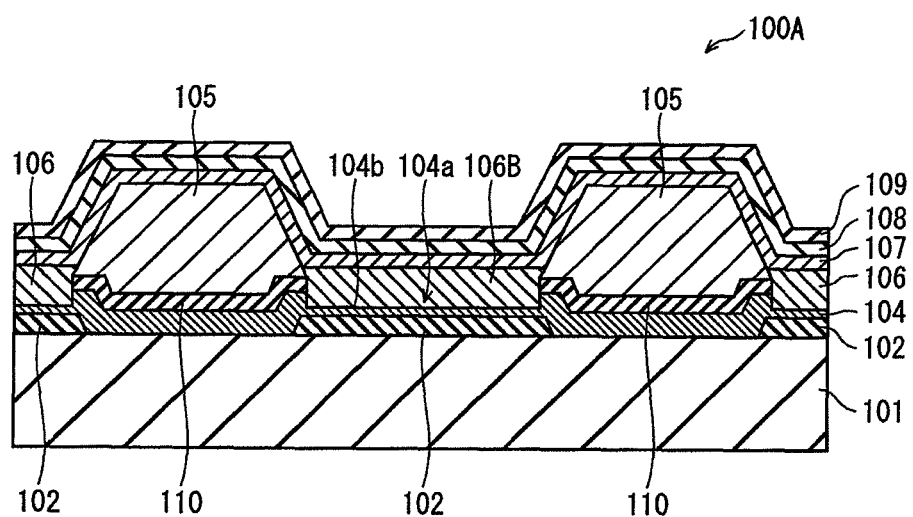
FIG. 28 is a schematic view illustrating a layered state of layers of an organic EL element 100A pertaining to embodiment 3.

FIG. 28 is a schematic view illustrating a layered state of layers of the organic EL element 100A. As illustrated in FIG. 28, the organic EL element 100A includes an anode 102 formed on a substrate 101, and a hole injection layer 104 and a protective layer 110 that are layered on the anode 102 in the stated order. The hole injection layer 104 functions as a charge injection transport layer. Here, note that the hole injection layer 104 is formed across the entirety of an upper surface of the substrate 101 while the protective layer 110 is not formed above the anode 102. In addition, an ITO layer is not interposed between the anode 102 and the hole injection layer 104.

On the hole injection layer 104, banks 105 defining pixels are formed. Further, within a region defined by the banks 105, a light-emitting layer 106B is layered on the hole injection layer 104, and on the light-emitting layer 106B, an electron injection layer 107, a cathode 108, and an sealing layer 109 are formed so as to extend over the regions defined by the banks 105 to be continuous between adjacent pixels.

<Method of Manufacturing Organic EL Element 100A>

FIGS. 29A-29D each illustrate a step in a manufacturing method of the organic EL element 100A. In the manufacturing steps of the organic EL element 100A, as illustrated in FIG. 29A, first, on the substrate 101 that is made of glass, the anode 102 is formed with an aluminum-based (Al) material. Next, a thin film 111 made of WOx or MoWOx, which is to become the hole injection layer 104, is formed on the anode 102. Then a thin film 112 made of WOx or MoWOx, which is to become the protective layer 110, is formed on the thin film 111. The thin film 112 protects the hole injection layer 104 during etching for forming the banks 105.

Subsequently, as illustrated in FIG. 29B, the banks 105 are formed on the thin film 112. In specific, a resist film containing resist material is formed on the thin film 112, and further, a resist pattern is formed on the resist film. Subsequently, desired portions of the resist film are removed by etching utilizing a developing solution. Accordingly, the pattern of the banks 105 is formed. Impurities such as hydrofluoric acid remaining on surfaces of the banks 105 after formation thereof are cleaned and removed by using a cleaning liquid such as pure water. However, it should be noted that a region of an upper surface of the thin film 112 defined by the banks 105 dissolves due to the cleaning liquid and thereby drops lower in level.

When the processing using the cleaning liquid is continued further, the region of the thin film 112 defined by the banks 105 dissolves completely until the protective layer 110 is formed as illustrated in FIG. 29C. In addition, since the thin film 111 is exposed to the outside due to the thin film 112 having dissolved, a region of an upper surface of the thin film 111 defined by the banks 105 dissolves and thereby drops lower in level. Hence, the recessed portion 104a is formed. The hole injection layer 104 is formed in such a manner.

Subsequently, the light-emitting layer 106B is formed on the hole injection layer 104 within a region defined by the banks 105, as illustrated in FIG. 29D. Description on the procedures following this point is omitted since the procedures following this point are similar to the corresponding procedures in embodiment 2.

Embodiment 4

An organic EL element 100B pertaining to embodiment 4 differs greatly from the organic EL element 100A pertaining to embodiment 3 in terms of the region at which the hole injection layer is formed. In the following, description is provided while focusing on aspects differing from embodiment 3 and while simplifying or omitting description concerning aspects that are similar to embodiment 3.

<Structure of Organic EL Element 100B>

Figure 30:
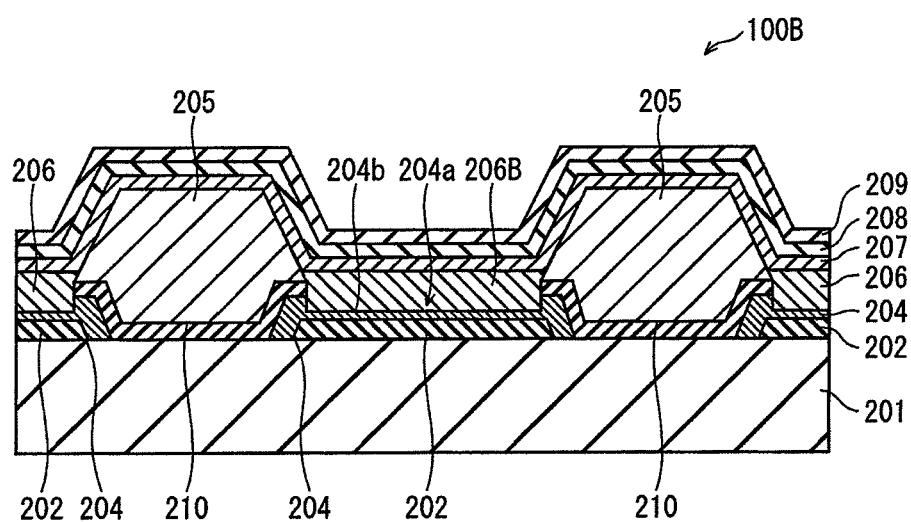
FIG. 30 is a schematic view illustrating a layered state of layers of an organic EL element 100B pertaining to embodiment 4.

FIG. 30 is a schematic view illustrating a layered state of layers of the organic EL element 100B. As illustrated in FIG. 30, the organic EL element 100B includes an anode 202 formed on a substrate 201, and a hole injection layer 204 and a protective layer 210 that are layered on the anode 202 in the stated order. The hole injection layer 204 functions as a charge injection transport layer. Note that the hole injection layer 204 is not formed across the entirety of an upper surface of the substrate 201 but formed only on the anode 202 and at regions around the anode 202. On the other hand, the protective layer 210 is not formed above the anode 202.

On the hole injection layer 204, banks 205 defining pixels are formed. Further, within a region defined by the banks 205, a light-emitting layer 206B is layered on the hole injection layer 204, and on the light-emitting layer 206B, an electron injection layer 207, a cathode 208, and an sealing layer 209 are formed so as to extend over the regions defined by the banks 205 to be continuous between adjacent pixels.

<Method of Manufacturing Organic EL Element 100B>

FIGS. 31A-31D each illustrate a step in a manufacturing method of the organic EL element 100B. In the manufacturing steps of the organic EL element 100B, as illustrated in FIG. 31A, first, on the substrate 201 that is made of glass, the anode 202 is formed with an aluminum-based (Al) material. Next, an oxide film 211, which is to become the hole injection layer 204, is formed by oxidizing an exposed surface (upper and side surfaces) of the anode 202. Then a thin film 212 made of WOx or MoWOx, which is to become the protective layer 210, is formed on the oxide film 211.

Subsequently, as illustrated in FIG. 31B, the banks 205 are formed on the thin film 212. Impurities such as hydrofluoric acid remaining on surfaces of the banks 205 after formation thereof are cleaned and removed by using a cleaning liquid such as pure water. However, it should be noted that a region of an upper surface of the thin film 212 defined by the banks 205 dissolves due to the cleaning liquid and thereby drops lower in level.

When the processing using the cleaning liquid is continued further, the region of the thin film 212 defined by the banks 205 dissolves completely and the thin film 212 is put in a final form thereof, which is the protective layer 210, as illustrated in FIG. 31C. In addition, since a region of an upper surface of the thin film 211 defined by the banks 205 is exposed to the outside due to the thin film 212 having dissolved, the region of the upper surface of the thin film 211 defined by the banks 205 dissolves and thereby drops lower in level. Hence, the recessed portion 204a is formed. The hole injection layer 204 is formed in such a manner.

Subsequently, the light-emitting layer 206B is formed on the hole injection layer 204 within a region defined by the banks 205, as illustrated in FIG. 31D. Description on the procedures following this point is omitted since the procedures following this point are similar to the corresponding procedures in embodiment 2.

Embodiment 5

Figure 32:
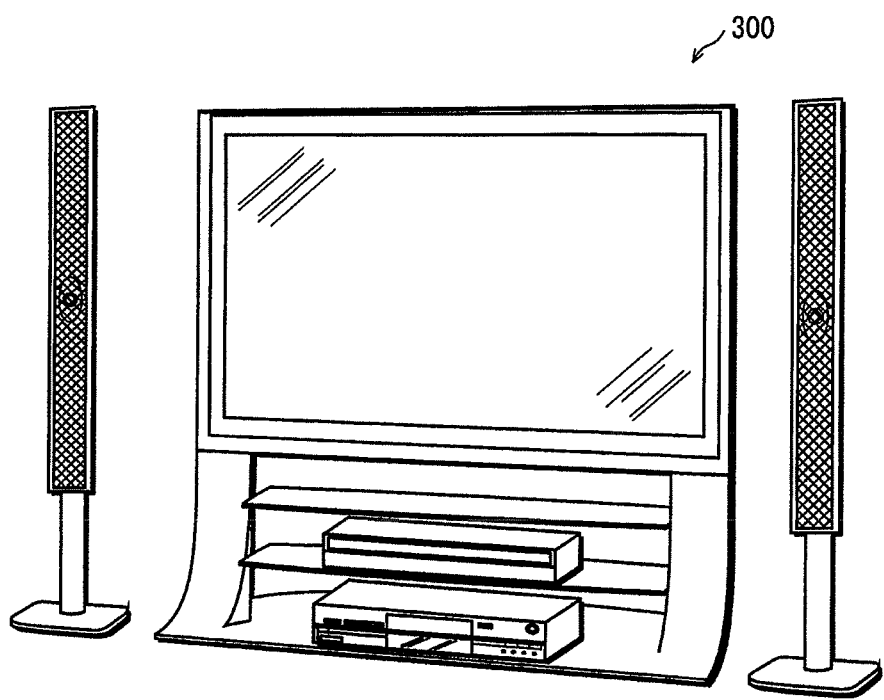

FIG. 32 is a perspective view illustrating an organic EL display apparatus pertaining to embodiment 5 and the like. As illustrated in FIG. 32, an organic EL display apparatus 300 pertaining to one aspect of the present invention includes an organic EL display panel formed by a plurality of pixels arranged in a matrix extending in both the row direction and the column direction. Each pixel emits light of a corresponding color among the colors of R, G, and B and is composed of the organic EL element pertaining to one aspect of the present invention.

[Modifications]

Up to this point, specific explanation has been provided on the present invention, while referring to embodiments 1 through 5, which are specific embodiments thereof. However, it should be noted that the above-described description provided in the embodiments merely provides exemplary embodiments of aspects of the present invention, and therefore, the present invention should not be construed as being limited to such embodiments. For example, such modifications as presented in the following can be made without departing from the spirit and scope of the present invention.

(1) In the above embodiments, a tungsten oxide layer formed by DC sputtering is described as an example of the hole injection layer, but neither the method of film formation nor the type of metal oxide is limited in this way. Other methods, such as the vapor deposition method or the CVD method, may be used. Furthermore, in the above embodiments, description has been provided on an example where tungsten oxide is used for forming the hole injection layer, but instead of tungsten oxide, a metal oxide such as molybdenum oxide (MoOx) or molybdenum-tungsten oxide (MoxWyOz), a metal nitride, or a metal oxynitride may be used to yield the same effects as achieved by the hole injection layer containing tungsten oxide.

(2) The organic EL element pertaining to one aspect of the present invention is not limited to being used as a single element. A plurality of the organic EL elements may be layered on a substrate as pixels in order to form an organic EL light-emitting apparatus. Such an organic EL light-emitting apparatus can be achieved by appropriately setting the thickness of each layer in each element and may, for example, be used as an illumination device or the like.

(3) In the above embodiments, the point at which the peak P1 clearly begins in FIGS. 15A and 15B is the point, in the direction of the center point from the peak top of the peak P1, at which the derivative first becomes zero in (a2) and (b2) in FIGS. 15A and 15B. The method of determining the point at which the peak P1 begins, however, is not limited in this way. For example, in the graph (a1) of FIG. 15A, the average value of the normalized luminance around the position at which the peak P1 begins may be taken as a baseline, and the intersection of this baseline with the peak P1 may be considered the position at which P1 begins to rise.

(4) Although description has been provided based on a top-emission type organic EL element in the above embodiments, the organic EL element pertaining to one aspect of the present invention is not limited to a top-emission type organic EL element, and may be a bottom-emission type organic EL element.

(5) In the embodiments, only an electron injection layer is provided so as to be interposed between a light-emitting layer and a cathode. However, an electron transport layer may also be interposed between a light-emitting layer and a cathode, in addition to an electron injection layer.

INDUSTRIAL APPLICABILITY

The organic EL element pertaining to the present disclosure may be favorably used in the home, in public facilities, and in the workplace in an organic EL apparatus used in various display apparatuses, televisions, displays for portable electronic devices, and the like.

REFERENCE SIGNS LIST 1, 101 substrate
2, 102, 202 anode
3 ITO layer
4, 104, 204 hole injection layer
4a recessed portion
4c inner bottom surface of recessed portion
4d inner side surface of recessed portion 5, 105, 205 banks
5a bottom surfaces of banks
5c level of bottom surfaces of banks
5d bottom periphery of banks
6A buffer layer
6B, 106B, 206B light-emitting layer
6a bottom surface of light-emitting layer
6b side surface of light-emitting layer
7 electron injection layer
8, 108, 208 cathode
8A cathode (Au layer)
9 sealing layer
13 nanocrystal
14 hole
15 segregated crystal
16 amorphous portion
300 display apparatus
1000, 100A, 100B organic EL element
1000A hole-only device
DC power source

The invention claimed is:

1. An organic EL element comprising:
an anode;
a cathode;
banks;
a functional layer between the anode and the cathode, the functional layer including one or more sublayers, the one or more sublayers including a light-emitting sublayer, the light-emitting sublayer defined by the banks and containing an organic material; and
a hole injection layer between the anode and the functional layer, wherein
the hole injection layer comprises tungsten oxide,
tungsten atoms constituting the tungsten oxide include both tungsten atoms with a valence of six and tungsten atoms with a valence less than six,
the hole injection layer includes a crystal of the tungsten oxide, a particle diameter of the crystal being on an order of nanometers,
the hole injection layer has a surface facing the functional layer and has a recessed structure such that a portion of the surface overlapping with the light-emitting sublayer is located closer to the anode than other portions of the surface overlapping with the banks,
the portion of the surface overlapping with the light-emitting sublayer and the other portions of the surface overlapping with the banks are located closer to the anode than a peripheral bottom surface of each of the banks, and
the recessed structure comprises (i) an inner bottom surface that is in contact with a bottom surface of the functional layer, and (ii) an inner side surface that is continuous with the inner bottom surface and in contact at least with part of a side surface of the functional layer, and
the inner side surface of the recessed structure has a lower edge and an upper edge, the lower edge being continuous with the inner bottom surface, and the upper edge being one of (i) aligned with part of a lower edge of the bank, the part being in contact with the light-emitting layer, and (ii) in contact with a bottom surface of the bank.

2. The organic EL element of claim 1, wherein
the tungsten atoms with a valence less than six are tungsten atoms with a valence of five.

3. The organic EL element of claim 2, wherein
a ratio $W^{5+}/W^{6+}$ of the number of the tungsten atoms with a valence of five to the number of the tungsten atoms with a valence of six is at least 3.2%.

4. The organic EL element of claim 3, wherein
the ratio $W^{5+}/W^{6+}$ is at least 3.2% and at most 7.4%.

5. The organic EL element of claim 1, wherein
a hard X-ray photoelectron spectroscopy spectrum of a surface of the hole injection layer exhibits a first peak and a second peak, the first peak corresponding to a $4f_{7/2}$ energy level of the tungsten atoms with a valence of six, and the second peak being in a region lower than the first peak in terms of binding energy.

6. The organic EL element of claim 5, wherein
the second peak is in a region between 0.3 electron volts and 1.8 electron volts lower, in terms of binding energy, than the first peak.

7. The organic EL element of claim 5, wherein
an area intensity of the second peak is between 3.2% and 7.4% of an area intensity of the first peak.

8. The organic EL element of claim 1, wherein
the tungsten atoms with a valence less than six cause a band structure of the hole injection layer to have an occupied energy level in a range between 1.8 electron volts and 3.6 electron volts lower than a lowest energy level of a valence band in terms of binding energy.

9. The organic EL element of claim 1, wherein
the hole injection layer includes a plurality of crystals of the tungsten oxide, each of the crystals having a particle diameter from 3 nm to 10 nm.

10. The organic EL element of claim 1, wherein
regular linear structures at intervals from 1.85 angstroms to 5.55 angstroms appear in a lattice image by transmission electron microscopy observation of the hole injection layer.

11. The organic EL element of claim 10, wherein
in a 2D Fourier transform image of the lattice image, a pattern of concentric circles centering on a center point of the 2D Fourier transform image appears.

12. The organic EL element of claim 11, wherein
in a plot of distance from the center point versus normalized luminance, the normalized luminance being a normalized value of the luminance of the 2D Fourier transform image at the corresponding distance, at least one peak of the normalized luminance appears.

13. The organic EL element of claim 12, wherein
with a peak width being a difference between the distance corresponding to a position of a peak of the normalized luminance appearing closest to the center point in the plot and the distance corresponding to a position at which the peak of the normalized luminance begins to rise, the peak width is less than 22 when a difference between the distance corresponding to the center point and the distance corresponding to the peak of the normalized luminance appearing closest to the center point is 100.

14. The organic EL element of claim 1, wherein
the functional layer includes amine-containing material.

15. The organic EL element of claim 1, wherein
the functional layer further includes one of a hole transfer sublayer that transfers holes and a buffer sublayer that adjusts optical characteristics of the organic EL element and/or blocks electrons.

16. The organic EL element of claim 1, wherein
the banks are liquid-repellent and the hole injection layer is liquid-philic.

17. An organic EL panel comprising the organic EL element of claim 1.

18. An organic EL light-emitting apparatus comprising the organic EL element of claim 1.

19. An organic EL display apparatus comprising the organic EL element of claim 1.

20. A manufacturing method for an organic EL element, comprising:
preparing an anode;
forming a tungsten oxide layer on the anode by using a sputtering gas including argon gas and oxygen gas and by using tungsten as a sputtering target, under film forming conditions such that a total pressure of the sputtering gas is at least 2.3 Pa and at most 7.0 Pa, a partial pressure of the oxygen gas in the sputtering gas is at least 50% and at most 70%, an input power density per unit area of the sputtering target is at least 1.5 W/cm$^2$ and at most 6.0 W/cm$^2$, and a value yielded by dividing the total pressure of the sputtering gas by the input power density is larger than 0.7 Pa·cm$^2$/W;
forming banks above the tungsten oxide layer by forming a resist film including resist material above the tungsten oxide layer and etching the resist film with a developing solution;
forming a hole injection layer, subsequent to forming the banks, by:
cleaning, with a cleaning fluid, a surface of the tungsten oxide layer and thereby removing residuals of the resist film adhering to the surface of the tungsten oxide layer; and
dissolving a part of the tungsten oxide layer with the cleaning fluid, the hole injection layer formed such that a portion of an upper surface of the hole injection layer facing the functional layer is located closer to the anode than other portions of the upper surface overlapping with the banks, the portion forming a recessed structure comprising an inner surface that is in contact with the functional layer, the inner surface including an inner bottom surface and an inner side surface that is continuous with the inner bottom surface;
forming a functional layer by depositing ink into a region of the hole injection layer defined by the banks, applying the ink with respect to the inner bottom surface and the inner side surface such that the ink is in contact with the inner bottom surface and the inner side surface, and drying the ink; and
forming a cathode above the functional layer,
wherein the portion of the surface facing the functional layer and the other portions of the surface overlapping with the banks are located closer to the anode than a peripheral bottom surface of each of the banks, and
in the formation of the hole injection layer, the inner side surface of the recessed structure is formed to have a lower edge and an upper edge, the lower edge continuous with the inner bottom surface, and the upper edge being one of (i) aligned with part of a lower edge of the bank, the part being in contact with the light-emitting layer, and (ii) in contact with a bottom surface of the bank.

21. A manufacturing method for an organic EL element, comprising:
preparing an anode;
forming a tungsten oxide layer on the anode by using a sputtering gas including argon gas and oxygen gas and by using tungsten as a sputtering target, under film forming conditions such that a total pressure of the sputtering gas is at least 2.3 Pa and at most 7.0 Pa, a partial pressure of the oxygen gas in the sputtering gas is at least 50% and at most 70%, an input power density per unit area of the sputtering target is at least 1.5 W/cm$^2$ and at most 6.0 W/cm$^2$, and a value yielded by dividing the total pressure of the sputtering gas by the input power density is larger than 0.7 Pa·cm$^2$/W;
forming a hole injection layer, while forming banks above the tungsten oxide layer by forming a resist film including resist material above the tungsten oxide layer and etching the resist film with a developing solution, by:
cleaning, with the developing solution, a surface of the tungsten oxide layer and thereby removing residuals of the resist film adhering to the surface of the tungsten oxide layer; and
dissolving a part of the tungsten oxide layer with the developing solution, the hole injection layer formed such that a portion of an upper surface of the hole injection layer facing the functional layer is located closer to the anode than other portions of the upper surface overlapping with the banks, the portion forming a recessed structure comprising an inner surface that is in contact with the functional layer, the inner surface including an inner bottom surface and an inner side surface that is continuous with the inner bottom surface;
forming a functional layer by depositing ink into a region of the hole injection layer defined by the banks, applying the ink with respect to the inner bottom surface and the inner side surface such that the ink is in contact with the inner bottom surface and the inner side surface, and drying the ink; and
forming a cathode above the functional layer,
wherein the portion of the surface facing the functional layer and the other portions of the surface overlapping with the banks are located closer to the anode than a peripheral bottom surface of each of the banks, and
in the formation of the hole injection layer, the inner side surface of the recessed structure is formed to have a lower edge and an upper edge, the lower edge being continuous with the inner bottom surface, and the upper edge being one of (i) aligned with part of a lower edge of the bank, the part being in contact with the light-emitting layer, and (ii) in contact with a bottom surface of the bank.

22. The manufacturing method of claim 20, wherein the tungsten oxide layer is formed such that tungsten atoms constituting the tungsten oxide layer include both tungsten atoms with a maximum valence thereof and tungsten atoms with a valence less than the maximum valence, and so as to include a tungsten oxide crystal having a particle diameter on an order of nanometers.

23. The manufacturing method of claim 20, wherein the value yielded by dividing the total pressure of the sputtering gas by the input power density is less than 3.2 Pa·cm$^2$/W.

24. The organic EL element of claim 1, wherein the recess structure extends under the peripheral bottom surface of at least one of the banks.

25. The manufacturing method of claim 20, wherein the recess structure extends under the peripheral bottom surface of at least one of the banks.

26. The manufacturing method of claim 21, wherein the recess structure extends under the peripheral bottom surface of at least one of the banks.

27. The organic EL element of claim 1, wherein
the inner bottom surface of the recessed structure is planar and parallel with an upper surface of the anode, and
a film thickness of the light-emitting layer is uniform over the inner bottom surface of the recessed structure.

28. The manufacturing method of claim 20, wherein
the inner bottom surface of the recessed structure is planar and parallel with an upper surface of the anode, and
a film thickness of the light-emitting layer is uniform over the inner bottom surface of the recessed structure.

29. The manufacturing method of claim 21, wherein
the inner bottom surface of the recessed structure is planar and parallel with an upper surface of the anode, and
a film thickness of the light-emitting layer is uniform over the inner bottom surface of the recessed structure.

\* \* \* \* \*